(12) United States Patent
Chou et al.

(10) Patent No.: US 12,191,144 B2
(45) Date of Patent: Jan. 7, 2025

(54) SEMICONDUCTOR DEVICE AND MANUFACTURING METHOD THEREOF

(71) Applicants: TAIWAN SEMICONDUCTOR MANUFACTURING CO., LTD., Hsinchu (TW); NATIONAL TAIWAN UNIVERSITY, Taipei (TW); NATIONAL TAIWAN NORMAL UNIVERSITY, Taipei (TW)

(72) Inventors: Chun-Yi Chou, Hsinchu (TW); Po-Hsien Cheng, Taipei (TW); Tse-An Chen, Taoyuan (TW); Miin-Jang Chen, Taipei (TW)

(73) Assignees: TAIWAN SEMICONDUCTOR MANUFACTURING CO., LTD., Hsinchu (TW); NATIONAL TAIWAN UNIVERSITY, Taipei (TW); NATIONAL TAIWAN NORMAL UNIVERSITY, Taipei (TW)

( * ) Notice: Subject to any disclaimer, the term of this patent is extended or adjusted under 35 U.S.C. 154(b) by 17 days.

(21) Appl. No.: 17/876,487

(22) Filed: Jul. 28, 2022

(65) Prior Publication Data
US 2022/0375782 A1    Nov. 24, 2022

Related U.S. Application Data

(62) Division of application No. 16/837,580, filed on Apr. 1, 2020, now Pat. No. 11,508,572.

(51) Int. Cl.
*H01L 21/02* (2006.01)
*C23C 16/04* (2006.01)
(Continued)

(52) U.S. Cl.
CPC ........ *H01L 21/0228* (2013.01); *C23C 16/042* (2013.01); *H01L 21/02164* (2013.01);
(Continued)

(58) Field of Classification Search
CPC ............. C23C 16/042; H01L 21/02164; H01L 21/02274; H01L 21/28194;
(Continued)

(56) References Cited

U.S. PATENT DOCUMENTS 6,329,297 B1   12/2001   Balish et al.
8,354,347 B2    1/2013   Ye et al.
(Continued)

FOREIGN PATENT DOCUMENTS

| TW | 200529360 A | 9/2005 |
|----|-------------|--------|
| TW | 202006886 A | 2/2020 |
| TW | 202008509 A | 2/2020 |

*Primary Examiner* — Monica D Harrison
*Assistant Examiner* — Andre C Stevenson
(74) *Attorney, Agent, or Firm* — Maschoff Brennan

(57) ABSTRACT

A method includes forming a mask layer above a substrate. The substrate is patterned by using the mask layer as a mask to form a trench in the substrate. An isolation structure is formed in the trench, including feeding first precursors to the substrate. A bias is applied to the substrate after feeding the first precursors. With the bias turned on, second precursors are fed to the substrate. Feeding the first precursors, applying the bias, and feeding the second precursors are repeated.

20 Claims, 71 Drawing Sheets

(51) Int. Cl.

| | |
|---|---|
| *H01L 21/28* | (2006.01) |
| *H01L 21/762* | (2006.01) |
| *H01L 21/768* | (2006.01) |
| *H01L 21/8238* | (2006.01) |
| *H01L 23/522* | (2006.01) |
| *H01L 27/092* | (2006.01) |
| *H01L 29/06* | (2006.01) |
| *H01L 29/40* | (2006.01) |
| *H01L 29/66* | (2006.01) |
| *H01L 29/78* | (2006.01) |

(52) U.S. Cl.
CPC .. *H01L 21/02274* (2013.01); *H01L 21/28194* (2013.01); *H01L 21/76224* (2013.01); *H01L 21/76829* (2013.01); *H01L 21/76877* (2013.01); *H01L 21/823821* (2013.01); *H01L 21/823857* (2013.01); *H01L 21/823871* (2013.01); *H01L 21/823878* (2013.01); *H01L 23/5226* (2013.01); *H01L 27/0924* (2013.01); *H01L 29/0649* (2013.01); *H01L 29/401* (2013.01); *H01L 29/66545* (2013.01); *H01L 29/66795* (2013.01); *H01L 29/7851* (2013.01)

(58) Field of Classification Search
CPC ......... H01L 21/76224; H01L 21/76829; H01L 21/76877; H01L 21/823821; H01L 21/823857; H01L 21/823871; H01L 21/823878; H01L 23/5226; H01L 27/0924; H01L 29/0649; H01L 29/401; H01L 29/66545; H01L 29/66795; H01L 29/7851

See application file for complete search history.

(56) References Cited

U.S. PATENT DOCUMENTS

| | | | |
|---|---|---|---|
| 9,105,490 | B2 | 8/2015 | Wang et al. |
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,564,286 | B2 * | 2/2017 | Kim ................. H01L 21/76224 |
| 9,576,814 | B2 | 2/2017 | Wu et al. |
| 9,831,183 | B2 | 11/2017 | Lin et al. |
| 9,859,386 | B2 | 1/2018 | Ho et al. |
| 2005/0191855 | A1 | 9/2005 | Chen et al. |
| 2007/0281082 | A1 | 12/2007 | Mokhlesi et al. |
| 2012/0018848 | A1 | 1/2012 | Huang et al. |
| 2013/0087837 | A1 | 4/2013 | Chang et al. |
| 2014/0256094 | A1 | 9/2014 | Lin et al. |
| 2015/0262823 | A1 | 9/2015 | Hung et al. |
| 2016/0376705 | A1 | 12/2016 | Phillips et al. |
| 2017/0008914 | A1 | 1/2017 | Park et al. |
| 2018/0096891 | A1 | 4/2018 | Bohr et al. |
| 2018/0198059 | A1 | 7/2018 | Ko et al. |
| 2018/0330980 | A1 | 11/2018 | Liang et al. |
| 2019/0386118 | A1 | 12/2019 | Chan et al. |
| 2020/0006140 | A1 | 1/2020 | Tapily et al. |
| 2020/0027717 | A1 | 1/2020 | Park et al. |
| 2020/0043721 | A1 | 2/2020 | Liou et al. |
| 2020/0043795 | A1 | 2/2020 | Chang et al. |
| 2020/0043799 | A1 | 2/2020 | Lee et al. |
| 2020/0119008 | A1 | 4/2020 | Chang et al. |
| 2020/0144397 | A1 * | 5/2020 | Dube ................. H01L 21/02057 |
| 2020/0243522 | A1 | 7/2020 | Cheng et al. |
| 2020/0373149 | A1 * | 11/2020 | Park .................. H01L 21/02301 |

* cited by examiner

200

SEMICONDUCTOR DEVICE AND MANUFACTURING METHOD THEREOF

PRIORITY CLAIM AND CROSS-REFERENCE

This present application is a divisional application of U.S. patent application Ser. No. 16/837,580, filed Apr. 1, 2020, which is herein incorporated by reference in its entirety.

BACKGROUND

The semiconductor integrated circuit (IC) industry has experienced rapid growth. In the course of IC evolution, functional density (i.e., the number of interconnected devices per chip area) has increased while geometry size (i.e., the smallest component (or line) that can be created using a fabrication process) has decreased. This scaling down process increases production efficiency and lowers associated costs.

Such scaling down has also increased the complexity of processing and manufacturing ICs and, for these advances to be realized, similar developments in IC processing and manufacturing are desired. For example, a three dimensional transistor, such as a fin-like field-effect transistor (FinFET), has been introduced to replace a planar transistor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
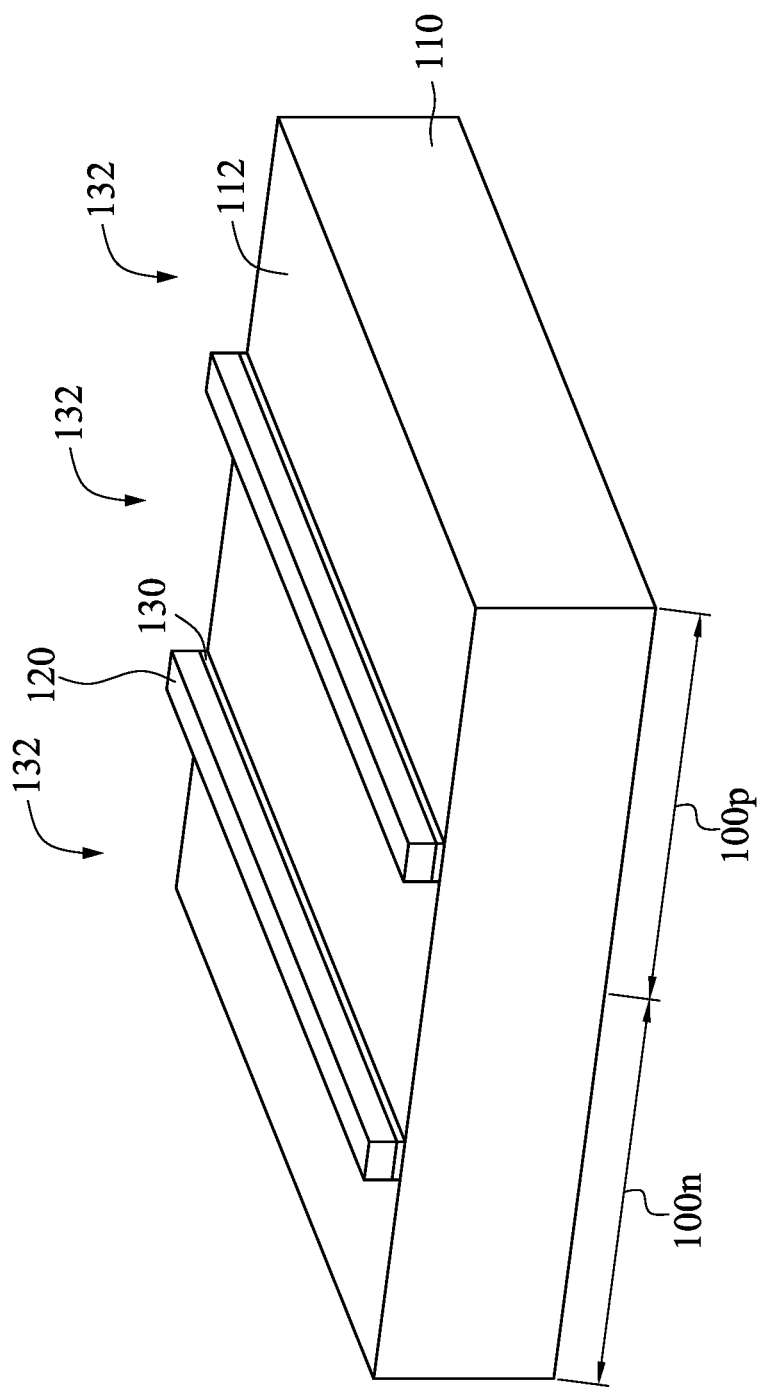
FIGS. 1A-1E are perspective views of a method for manufacturing a semiconductor structure at various stages in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, "around", "about", "approximately", or "substantially" shall generally mean within 20 percent, or within 10 percent, or within 5 percent of a given value or range. Numerical quantities given herein are approximate, meaning that the term "around", "about", "approximately", or "substantially" can be inferred if not expressly stated.

The fins may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

Embodiments of the present disclosure relate to semiconductor structures and methods for forming semiconductor structures by performing bias-induced selective atomic layer deposition (ALD) processes. These embodiments are discussed below in the context of forming finFET transistors having a single fin or multiple fins on a bulk silicon substrate.

FIGS. 1A-1E are perspective views of a method for manufacturing a semiconductor structure at various stages in accordance with some embodiments of the present disclosure. In some embodiments, the semiconductor structure shown in FIGS. 1A-1E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Reference is made to FIG. 1A. A substrate 110 is provided. The substrate 110 includes an n-type region 100n and a p-type region 100p. N-type devices (such as NFETs) will be formed on the n-type region 100n, and p-type devices (such as PFETs) will be formed on the p-type region 100p. In some embodiments, the substrate 110 may include silicon (Si). Alternatively, the substrate 110 may include germanium (Ge), silicon germanium, gallium arsenide (GaAs), or other appropriate semiconductor materials. In some alternative embodiments, the substrate 110 may include an epitaxial layer. Furthermore, the substrate 110 may include a semiconductor-on-insulator (SOI) structure having a buried dielectric layer therein. The buried dielectric layer may be, for example, a buried oxide (BOX) layer. The SOI structure may be formed by a method referred to as separation by implantation of oxygen (SIMOX) technology, wafer bonding, selective epitaxial growth (SEG), or other appropriate method.

A mask layer 120 (may be a hard mask layer) is formed over the top surface 112 of the substrate 110. In some embodiments, the mask layer 120 includes nitride. For example, the mask layer 120 is made of silicon nitride (SiN). However, other materials, such as SiON, silicon carbide, or combinations thereof, may also be used. The mask layer 120 may be formed by a process such as chemical vapor deposition (CVD), plasma enhanced chemical vapor deposition (PECVD), or low pressure chemical vapor deposition (LPCVD). Alternatively, the mask layer 120 may be made of a silicon oxide and then converted to SiN by nitridation.

In some embodiments, a pad layer 130 is formed over the top surface 112 of the substrate 110 and between the mask layer 120 and the substrate 110. The pad layer 130 protects the top surface 112 from direct contact with the mask layer 120. For example, the pad layer 130 can protect active regions formed in the substrate 110. The active regions are used for forming devices (such as transistors, resistors, etc.). Depending upon the devices to be formed, the active regions may include either an n-well or a p-well as determined by the design conditions. In some embodiments, the pad layer 130 is made of a thermal oxide. Once formed, the mask layer 120 and the pad layer 130 are patterned through suitable photolithographic and etching processes to form openings 132 over the top surface 112.

Figure 1B:
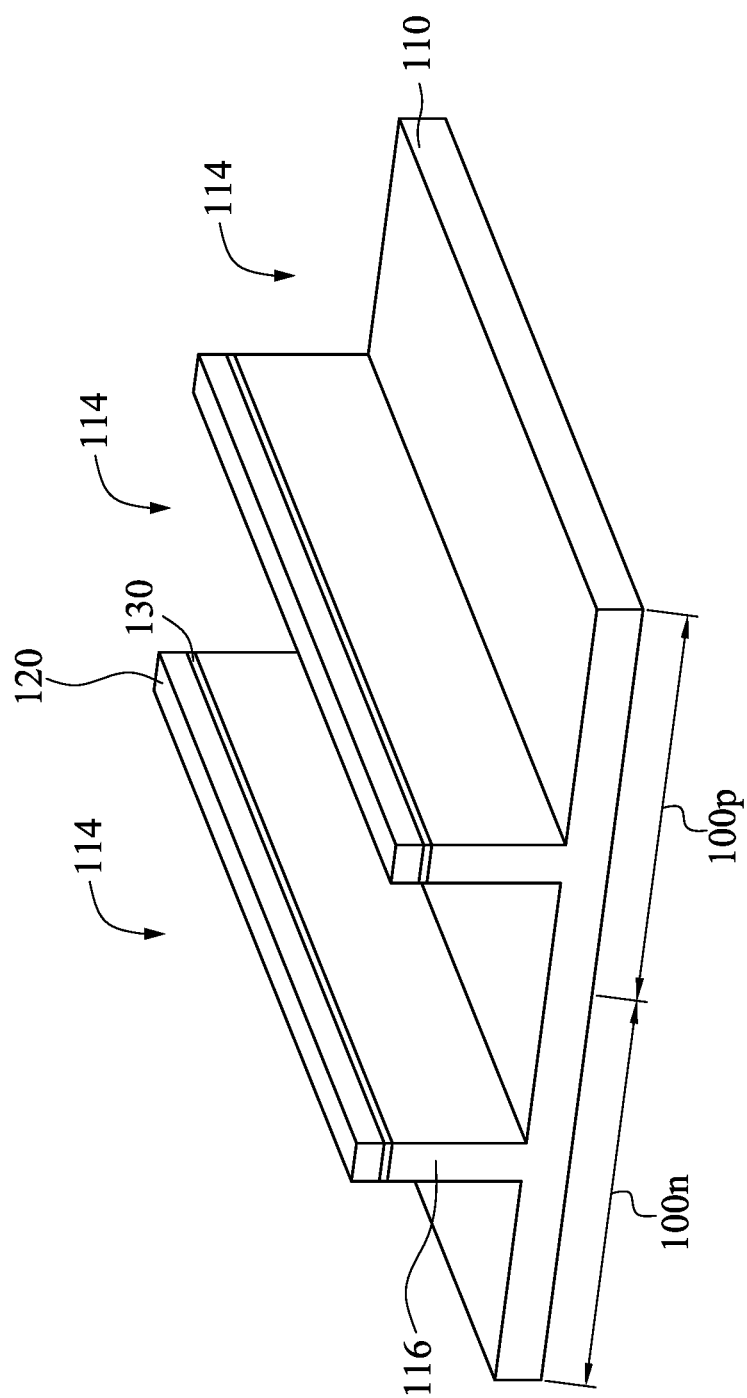

Reference is made to FIG. 1B. The exposed portions of the substrate 110 through the openings 132 (see FIG. 1A) are removed by an etching process, such as reactive ion etching (RIE), in order to form the trenches 114 in the substrate 110. In some embodiments, the substrate 110 is etched to form semiconductor fins 116, and the trenches 114 are configured to separate adjacent two semiconductor fins 116. In other words, one of the semiconductor fins 116 is between adjacent two of the trenches 114.

Figure 1C:
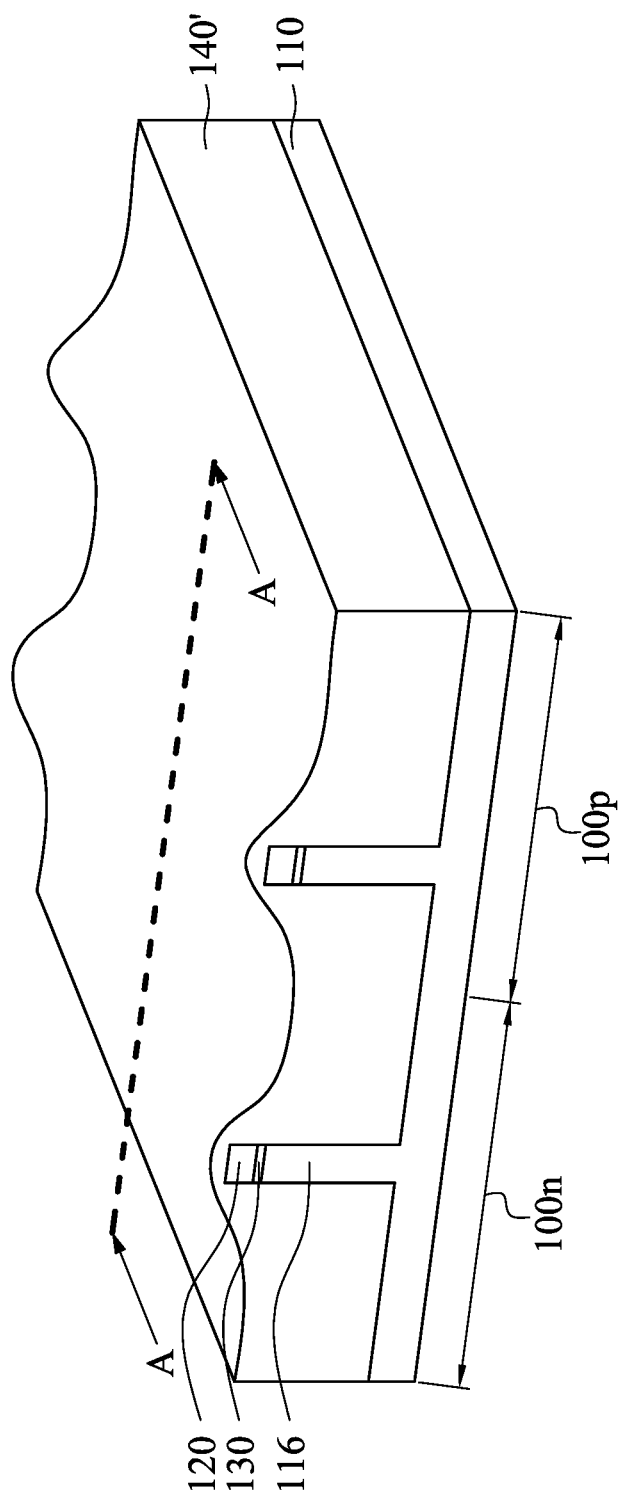

Reference is made to FIG. 1C. Isolation materials 140' are selectively formed in the trenches 114. The isolation materials 140' are formed by performing a bias-induced selectively ALD process, as described in greater detail below. Atomic layer deposition (ALD) is an approach to filling dielectrics that involves depositing a monolayer of precursor over the substrate 110, purging the chamber, and introducing a reactant that reacts with the precursor to leave a monolayer of product. The cycle can be repeated many times to build a layer with a sufficient thickness to be functional. The thickness of the deposition layer is determined by the deposition cycles of the ALD processes.

Figure 2:
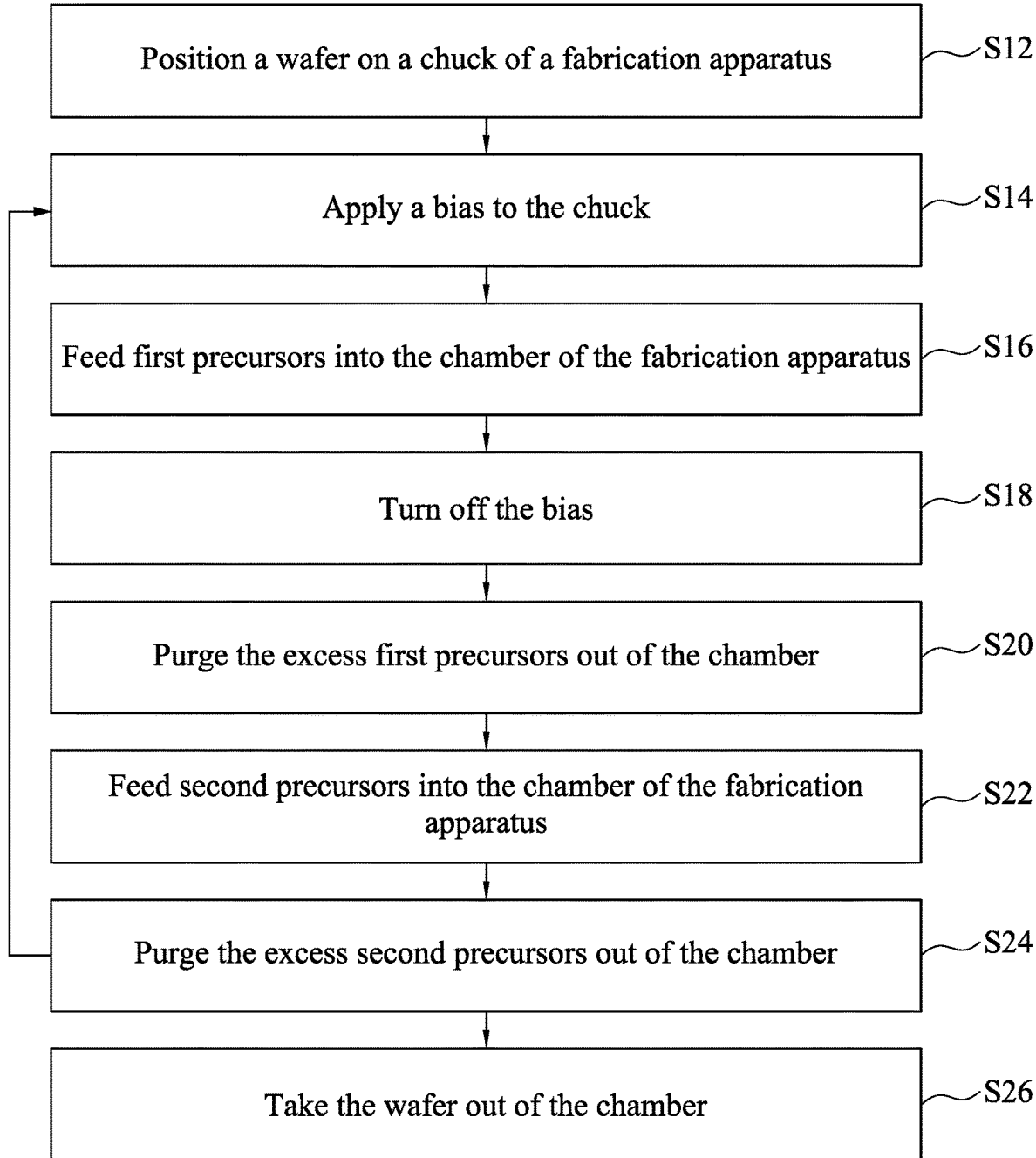
FIG. 2 is a flow chart of a method of a bias-induced selectively ALD process in accordance with some embodiments of the present disclosure.
Figure 3:
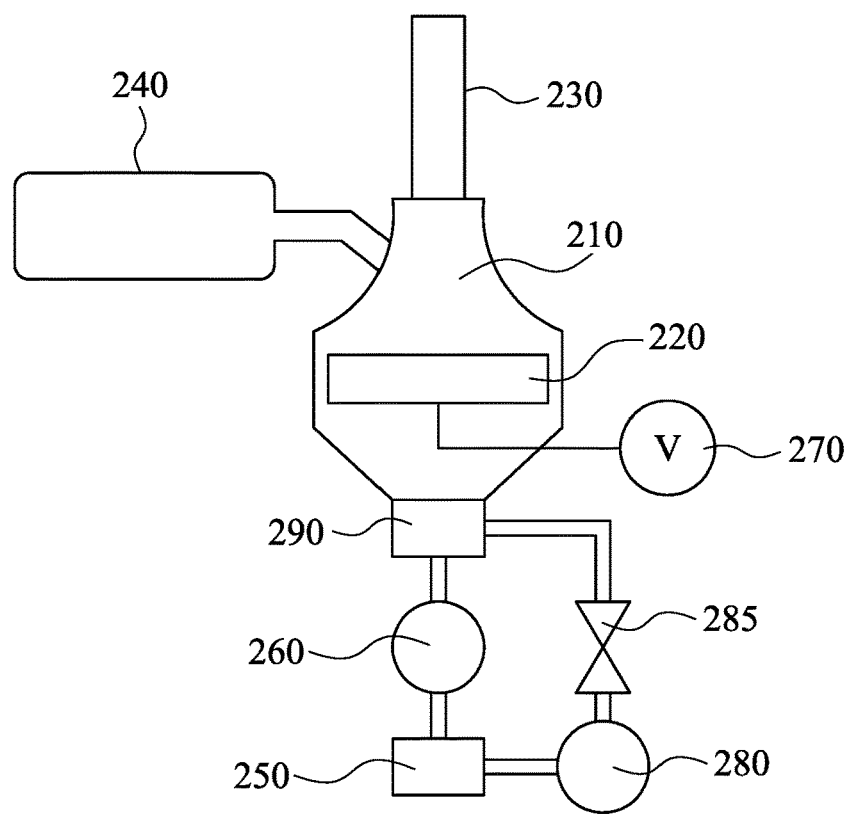
FIG. 3 is a schematic diagram of a fabrication apparatus according to some embodiments of the present disclosure.

FIG. 2 is a flow chart of a method M1 of a bias-induced selectively ALD process in accordance with some embodiments of the present disclosure. FIG. 3 is a schematic diagram of a fabrication apparatus 200, according to some embodiments of the present disclosure. FIGS. 4A-4E are cross-sectional views taking along line A-A of FIG. 1C at various stages in accordance with some embodiments of the present disclosure. In some embodiments, the isolation material 140' in FIG. 1C is formed in the fabrication apparatus 200 of FIG. 3. It is noted that the sizes of the precursors shown in FIGS. 4B-4D are illustrated only, and do not limit the scope of the embodiments.

Figure 4A:
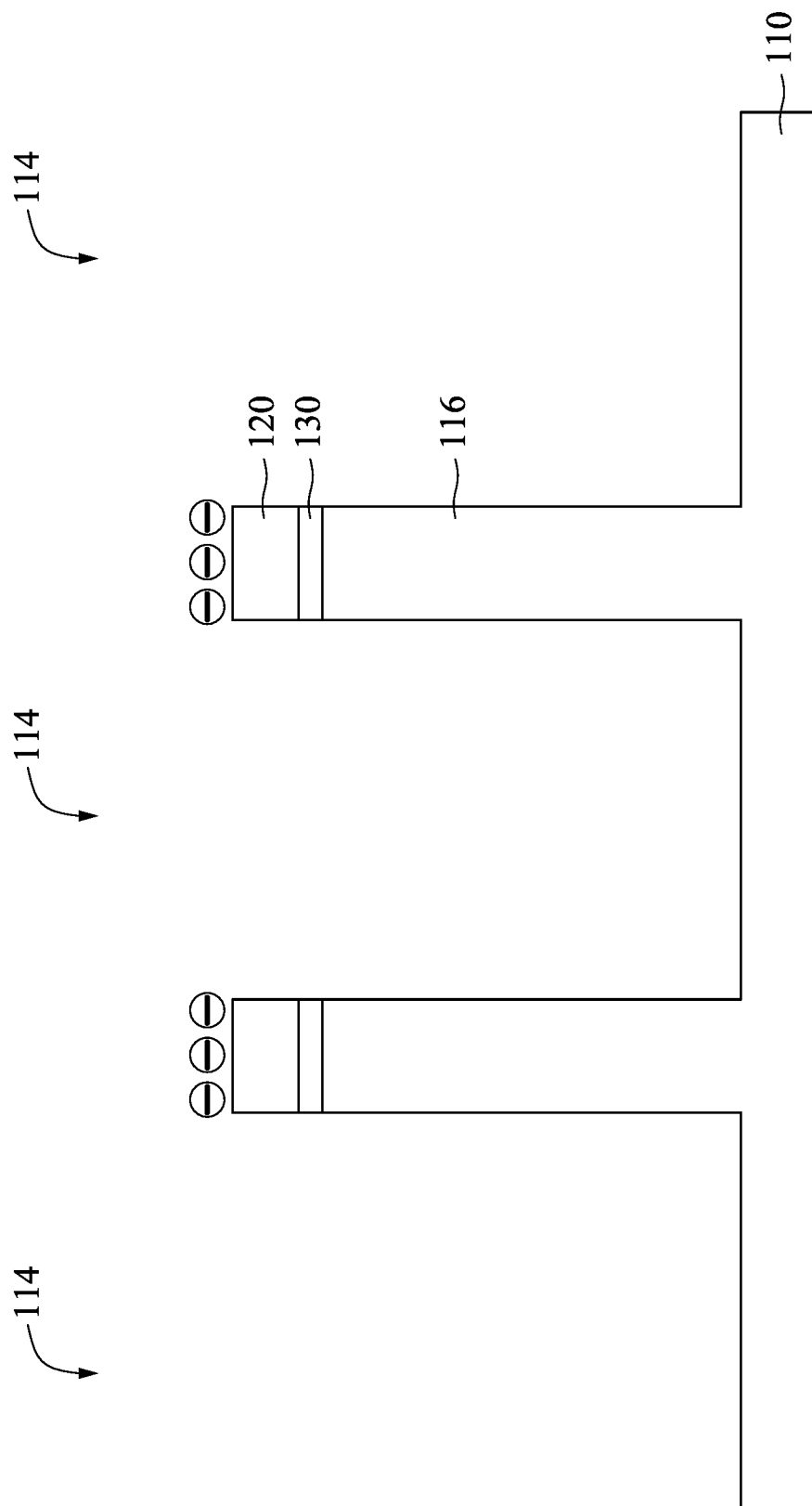
FIGS. 4A-4E are cross-sectional views taking along line A-A of FIG. 1C at various stages in accordance with some embodiments of the present disclosure.
Figure 4B:
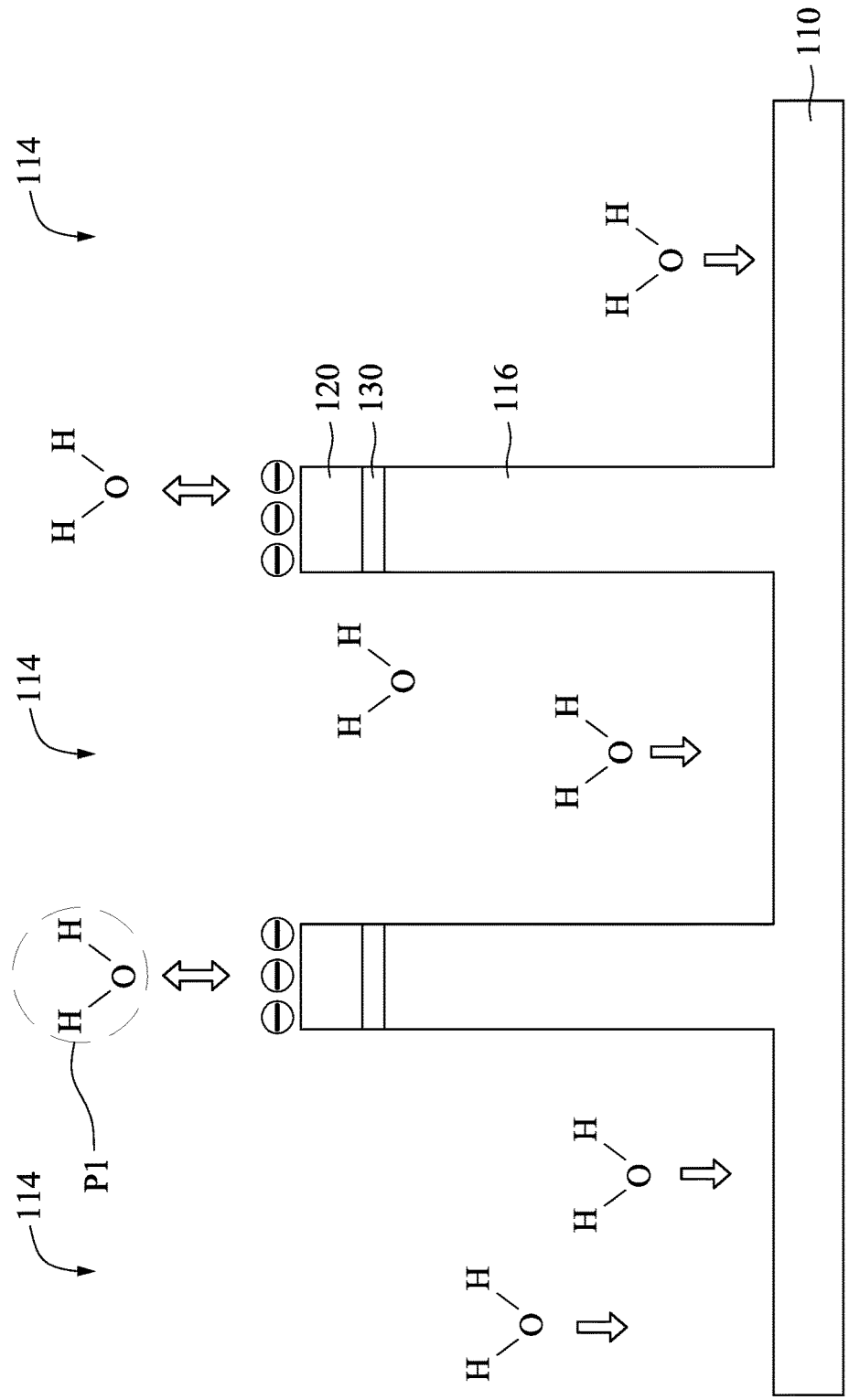
Figure 4C:
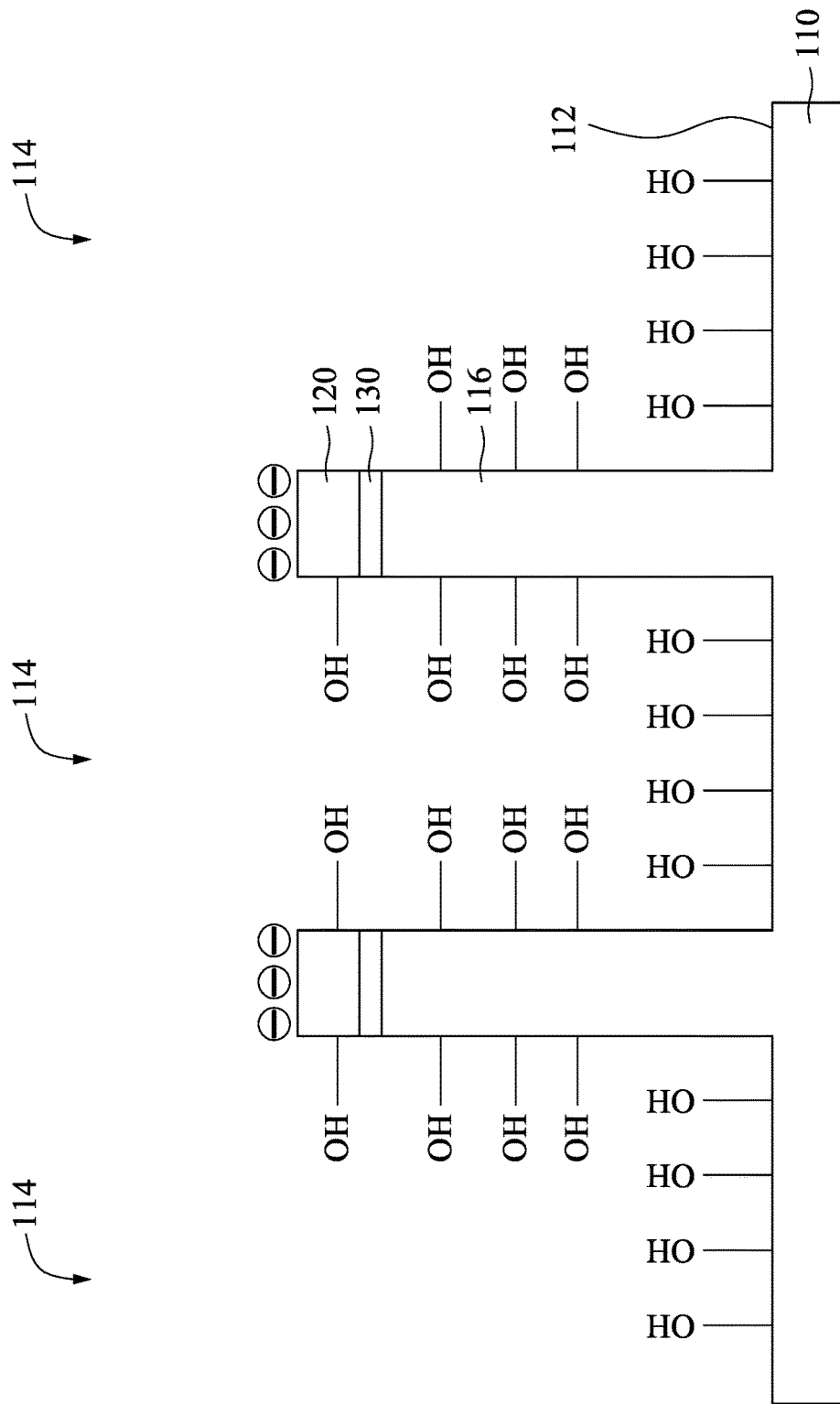
Figure 4D:
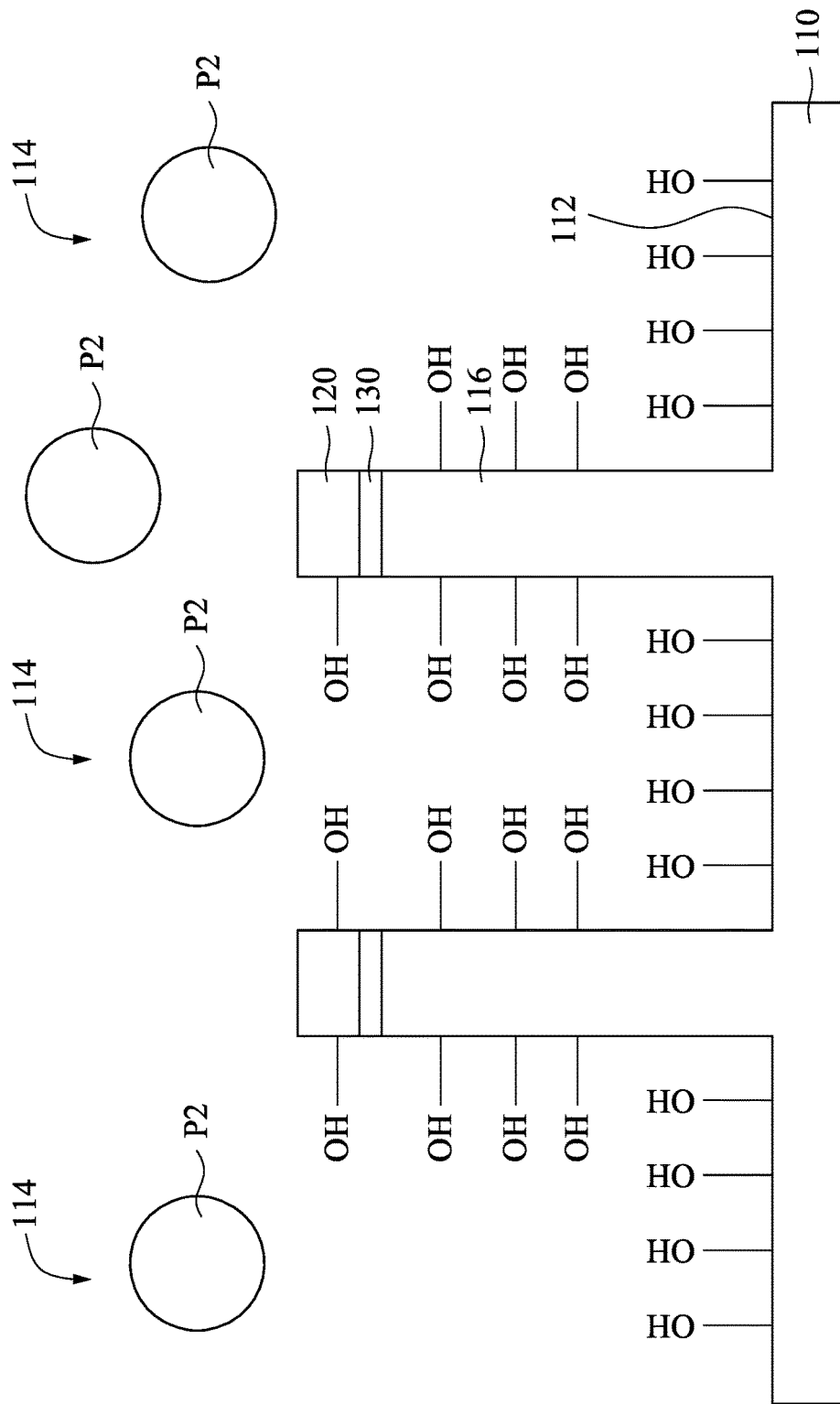

Reference is made to FIGS. 2, 3, and 4A. In operation S12 of the method M1, a wafer is positioned on a chuck of a fabrication apparatus. For example, the wafer (e.g., the structure in FIG. 1B) is positioned on a chuck 220 of the fabrication apparatus 200. In some embodiments, the fabrication apparatus 200 includes a chamber 210, the chuck 220, a plasma source 230, and a precursor delivery 240. The chuck 220 is in the chamber 210, and the plasma source 230 and the precursor delivery 240 are connected to the chamber 210.

The plasma source 230 may be a remote plasma system which is separated from the chamber 210. Treatment gases and carrier gases may be introduced into the plasma source 230 and the treatment gases are excited to create reaction gases containing plasma. The reaction gases are reactive species of plasmarized ions. In some embodiments, the treatment gases are exited using microwaves to create the reaction gas containing plasma. The microwaves are generated using a microwave oscillator and are introduced into the plasma source 230 using an optical waveguide. The reaction gases are then fed through a conduit into the chamber 210.

In some embodiments, the fabrication apparatus 200 further includes a turbo pump 250 and a pressure controller 260 (e.g., automatic pressure controller (APC)). The turbo pump 250 is connected to the chamber 210 through the pressure controller 260. In some embodiments, when the wafer is positioned in the chamber 210, a vacuum is applied to the chamber 210 by the turbo pump 250 to remove oxygen and moisture. The pressure controller 260 is configured to control the pressure inside the chamber 210. In some embodiments, when the wafer is positioned in the chamber 210, the temperature is raised to an acceptable level that is suitable for the ALD deposition before the operation S14.

In operation S14 of the method M1, a bias is applied to the chuck. The bias may be a DC bias and/or a radio-frequency (RF) bias. For example, an RF bias is applied to the chuck 220 in the case of FIG. 4A. With the RF bias, since the mask layer 120 (e.g., a dielectric layer) has an electrical conductivity lower than that of the substrate 110 (e.g., a semiconductor material), charges (i.e., electrons in this case) are less movable within the mask layer 120, such that more charges remain in the vicinity of the surface of the mask layer 120 as shown in FIG. 4A. Moreover, since the electrons are lighter than ions, the electrons are easier to accumulate in the vicinity of the surface of the mask layer 120.

In some embodiments, the fabrication apparatus 200 further includes a bias source 270 connected to the chuck 220 as shown in FIG. 3. The bias source 270 is configured to apply a bias to the chuck 220 and thus to the wafer positioned thereon. In some embodiments, the bias source 270 is configured to apply DC and/or RF bias to the chuck 220. In some embodiments, the bias source 270 is configured to apply positive or negative DC bias to the chuck 220 to accelerate or decelerate the deposition rate of the selective ALD process. In some embodiments, the bias may have a power greater than about 0 W and equal to or less than about 50 W, e.g., about 20 W. If the power is greater than about 50 W, the gases (e.g., the precursors/processing gases) in the chamber 210 may be ionized to form plasma, which may bombard the wafer to damage the structure formed thereon. In some embodiments, the bias is an RF bias, and the frequency range thereof is in a range of about 3 kHz to about 300 GHz.

Figure 5:
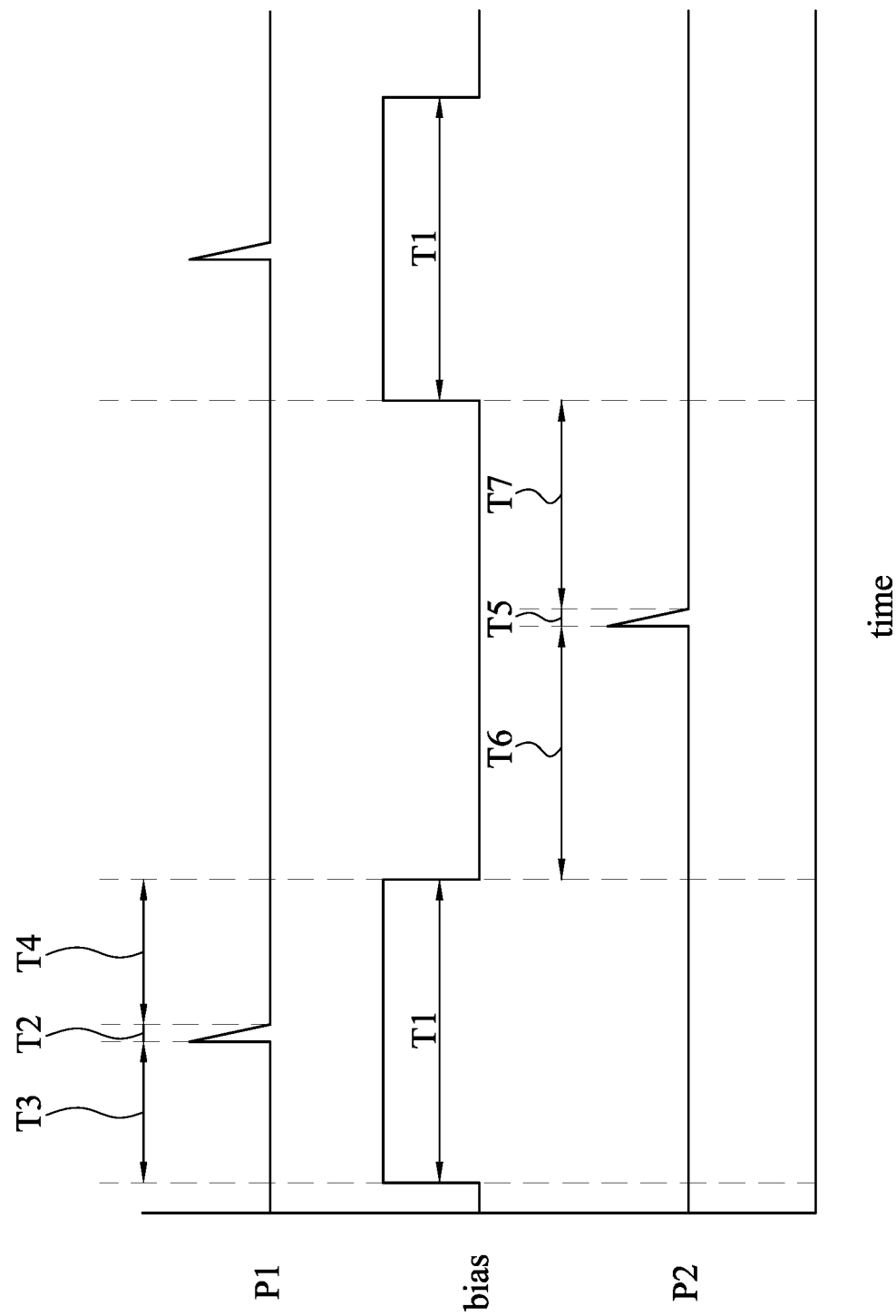
FIG. 5 is a timing diagram of bias pulses and precursors providing according to some embodiments.

FIG. 5 is a timing diagram of bias pulses and precursors providing according to some embodiments. Reference is made to FIGS. 3, 4A, and 5. In FIG. 5, the bias applied to the chuck 220 continues a first period T1. The bias is applied before precursors are fed into the chamber 210. Once the RF bias is applied to the chuck 220, electrons move to the surface of the mask layer 120. Hence, the surface of the mask layer 120 is negative charged in this case.

In operation S16 of the method M1, first precursors are fed into the chamber of the fabrication apparatus. Reference is made to FIGS. 3 and 4B. For example, first precursors P1 (e.g., $H_2O$ in this case) are fed into the chamber 210 from the precursor delivery 240. As shown in FIG. 4B, each of the $H_2O$ molecules is a polar molecule and has a slight negative charge near its oxygen atom and a slight positive charge near its hydrogen atoms. The negative charges (electrons) in the vicinity of the surface of the mask layer 120 repulse the $H_2O$ molecules due to their partial negative charges (oxygen). The $H_2O$ molecules may be mostly attracted by the substrate 110, and thus are mostly deposited on the substrate 110 rather than on the mask layer 120. Stated differently, more $H_2O$ molecules are deposited on the substrate 110 than on the mask layer 120. As shown in FIG. 4C, the $H_2O$ molecules are mostly absorbed on the surface 112 of the substrate 110. In some embodiments, there are still some $H_2O$ molecules absorbed on the surfaces of the dielectric materials (i.e., the mask layer 120 and the pad layer 130 in this case).

Reference is made to timing diagram of FIG. 5. After the bias applied to the chuck 220 is turned on and before the bias is turned off, the first precursors P1 are fed into the chamber 210 for a second period T2. In some embodiments, the second period T2 is shorter than the first period T1 by multiple times. For example, the first period T1 may be ten or more times the second period T2. Further, the bias is turned off after the feeding of the first precursor P1 is stopped. A third period T3 is between the beginning of the bias supply and the beginning of the first precursor feeding, and a fourth period T4 is between the finish of the first precursor feeding (i.e., stopping the first precursor feeding) and the finish of the bias supply (i.e., turning off of the bias supply). In some embodiments, the third period T3 is long enough to charge the mask layer 120, and the fourth period T4 is long enough to provide the reaction time of the first precursor deposition.

Reference is made to FIGS. 3 and 4B. In some embodiments, when the first precursors P1 are fed into the chamber 210, the pressure in the chamber 210 may be changed. The varied pressure may disturb the charge distribution on the chuck 220. The pressure controller 260 is configured to maintain the pressure at a predetermined value of range. With this configuration, the pressure in the chamber 210 is well controlled, and the charge distribution caused by the bias applied in operation S14 can maintain in a substantially steady state. Stated in another way, the pressure controller 260 prevents the charge distribution from being disturbed when the first precursors P1 are fed into the chamber 210.

In some embodiments, during the operations S14 and S16, the plasma source 230 is turned off, such that there is no or negligible plasma in the chamber 210 when the bias is applied to the chuck 220. In some other embodiments, the first precursors P1 is plasma, and the first precursors P1 are fed into the chamber 210 from the plasma source 230. During this process, the plasma is originated from the plasma source 230 and not in the chamber 210, such that a bias with a low power can be applied to the chuck 220 to perform the selective ALD process, because the bias applied to the chuck 220 is irrelevant to the generation of plasma.

In operation S18 of the method M1, the bias is turned off, and in following operation S20 of the method M1, the excess first precursors are purged out of the chamber. Specifically, some of the first precursors P1 are absorbed to the surface 112 of the substrate 110 during the periods T2 and T4 (see FIG. 5). After the fourth period T4, the bias is turned off, such that the electrons in the vicinity of the surface of the mask layer 120 are gradually disappeared. Then, purging gases such as inert gases (Ar or $N_2$), which are substantially free from oxygen and moisture (for example, less than about 1 volume percent, less than about 0.1 percent, about 0.01 percent, about 0.001 percent, or lower), enter the chamber 210 to purge the excess first precursors P1, which are not absorbed on the substrate 110, the mask layer 120, and the pad layer 130, out of the chamber 210.

In some embodiments, the fabrication apparatus 200 in FIG. 3 further includes a rotary pump 280 and a valve (e.g., stop valve) 285. The rotary pump 280 is connected to the chamber 210 via the valve 285, and the rotary pump 280 is configured to pump out the purging gases and the excess first precursors P1 in the chamber 210 when the pressure controller 260 is turned off. In some other embodiments, the turbo pump 250 may pump out the purging gases and the excess first precursors P1 in the chamber 210 when the pressure controller 260 is turned on. In some embodiments, the fabrication apparatus 200 in FIG. 3 further includes a filter (e.g., trap filter) 290 connected to the chamber 210, the valve 285, and the pressure controller 260. The filter 290 is configured to trap the gases (e.g., the purging gases and/or precursors) and prevent the gases reflected toward the chamber 210.

Figure 4E:
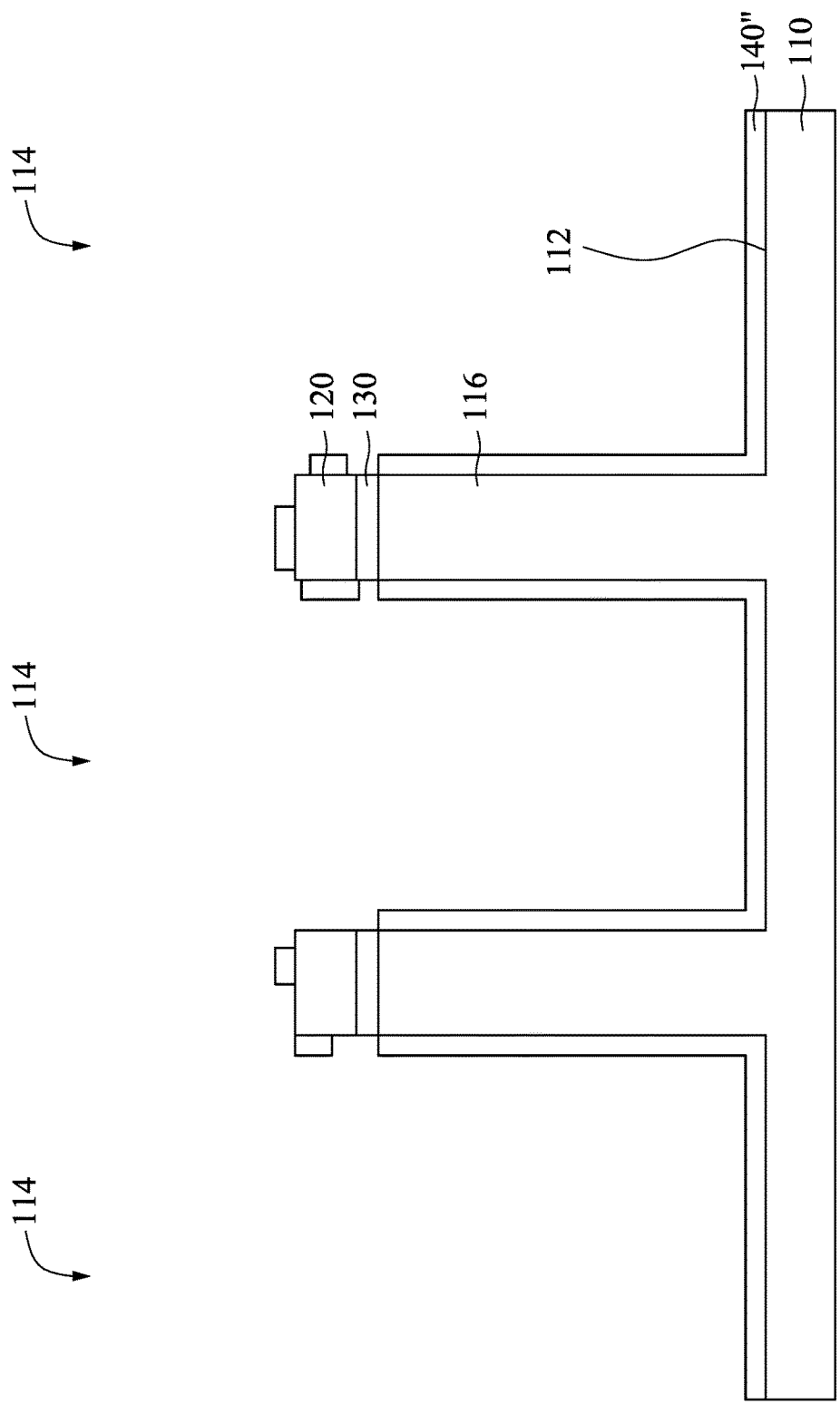

In operation S22 of the method M1, second precursors are fed into the chamber of the fabrication apparatus. Reference is made to FIGS. 3 and 4D. For example, second precursors P2 (e.g., silicon precursors in this case) are fed into the chamber 210 from the precursor delivery 240. As shown in FIG. 4D, the second precursors P2 are attracted by the first precursors absorbed on the substrate 110 (—OH in this case). The second precursors P2 are likely to be attracted by —OH, and thus more second precursors P2 are deposited on the surface 112 of the substrate 110 and less second precursors P2 are deposited on the surfaces of the mask layer 120 and the pad layer 130. As shown in FIG. 4E, a dielectric film 140" is formed on the surfaces of the substrate 110, the mask layer 120, and the pad layer 130.

In FIG. 4E, a portion of the dielectric film 140" in contact with the substrate 110 is denser than another portion of the dielectric film 140" in contact with the mask layer 120. For example, most area of the surfaces of the mask layer 120 may be exposed by the dielectric film 140" while most area of the surface 112 of the substrate 110 is covered by the dielectric film 140". Therefore, a bias-induced selective ALD process is performed to selectively deposit a dielectric film 140" on the substrate 110 at a faster deposition rate than on the mask layer 120 and the pad layer 130. In some embodiments, the dielectric film 140" is a monolayer.

In some embodiments, the dielectric film 140" may be a silicon-containing layer, such as $SiO_2$. In this case, the second precursors P2 may be (3-Aminopropyl)triethoxy silane, N-sec-Butyl(trimethylsilyl)amine, Tris(dimethylamino)silane (TDMAS), Tetraethyl orthosilicate (TEOS), $SiCl_4$, Tris(tert-butoxy)silanol(TBS), Tris(tert-pentoxy)silano (TPS), or other suitable materials. In some other embodiments, the dielectric film 140" may include other suitable materials (such as high-k materials).

In FIG. 5, the purging of the second precursors P2 maintains for a fifth period T5. In some embodiments, a sixth period T6 is between the periods T4 and T5. In some embodiments, the sixth period T6 is for neutralizing the surface of the mask layer 120. Moreover, a seventh period T7 is between the fifth period T5 and the next first period T1. In some embodiments, the seventh period T7 provides the reaction time of the second precursor deposition.

In operation S24 of the method M1, the excess second precursors are purged out of the chamber. Specifically, the second precursors P2 are mostly absorbed to the surface 112 of the substrate 110 during the periods T5 and T7 (see FIG. 5). After the fifth period T5, purging gases such as inert gases (Ar or $N_2$) enter the chamber 210 again to purge the excess second precursors P2 out of the chamber 210.

After the operation S24, the dielectric film 140" is mostly formed on the surface 112 of the substrate 110 as shown in FIG. 4E, and this dielectric film 140" may expose portions of the surfaces of the mask layer 120 (and the pad layer 130). That is, the selective ALD deposition process results in no or negligible dielectric film 140" deposited on the mask layer 120 and the pad layer 130. For example, the dielectric film 140" unintentionally deposited on the mask layer 120 and the pad layer 130 may have a thinner thickness than that deposited on the substrate 110. Then, the method M1 goes to the operation S14 to repeat the operations S14-S24 and form another dielectric film on the dielectric film 140". The cycle of the operations S14-S24 may be repeated many times to form the isolation materials 140' in the trenches 114, as shown in FIG. 1C.

In operation S26 of the method M1, the wafer is taken out of the chamber. Specifically, after the bias-induced selective ALD process (i.e., the isolation materials 140' are filled in the trenches 114 in this case), the deposition process is finished, and the wafer is taken out of the chamber (e.g., loaded out of the chamber, by using one or more robotic arms, to a wafer cassette placed on a load port of the chamber) to process the next manufacturing process.

Figure 1D:
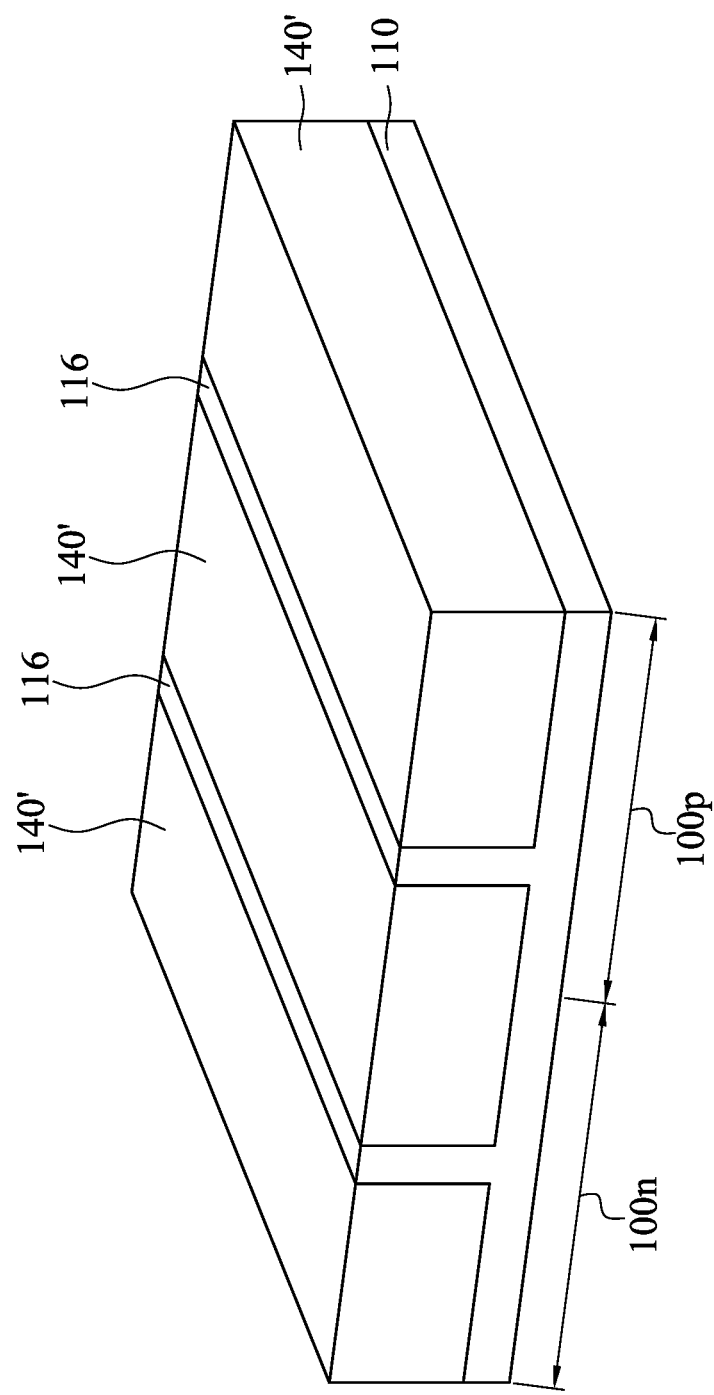

Reference is made to FIG. 1D. A planarization process is performed to remove the mask layer 120, the pad layer 130, and the isolation materials 140' outside the trench 114, such that the semiconductor fins 116 are exposed. In some embodiments, the planarization process is a chemical-mechanical polishing (CMP) process. In some embodiments, the CMP process is omitted, as long as the selective ALD process is well controlled to result in no isolation material 140' deposited on the mask layer 120. In such scenarios, an additional etching process may be optionally performed to remove the mask layer 120 and the pad layer 130 from the fins 116.

Figure 1E:
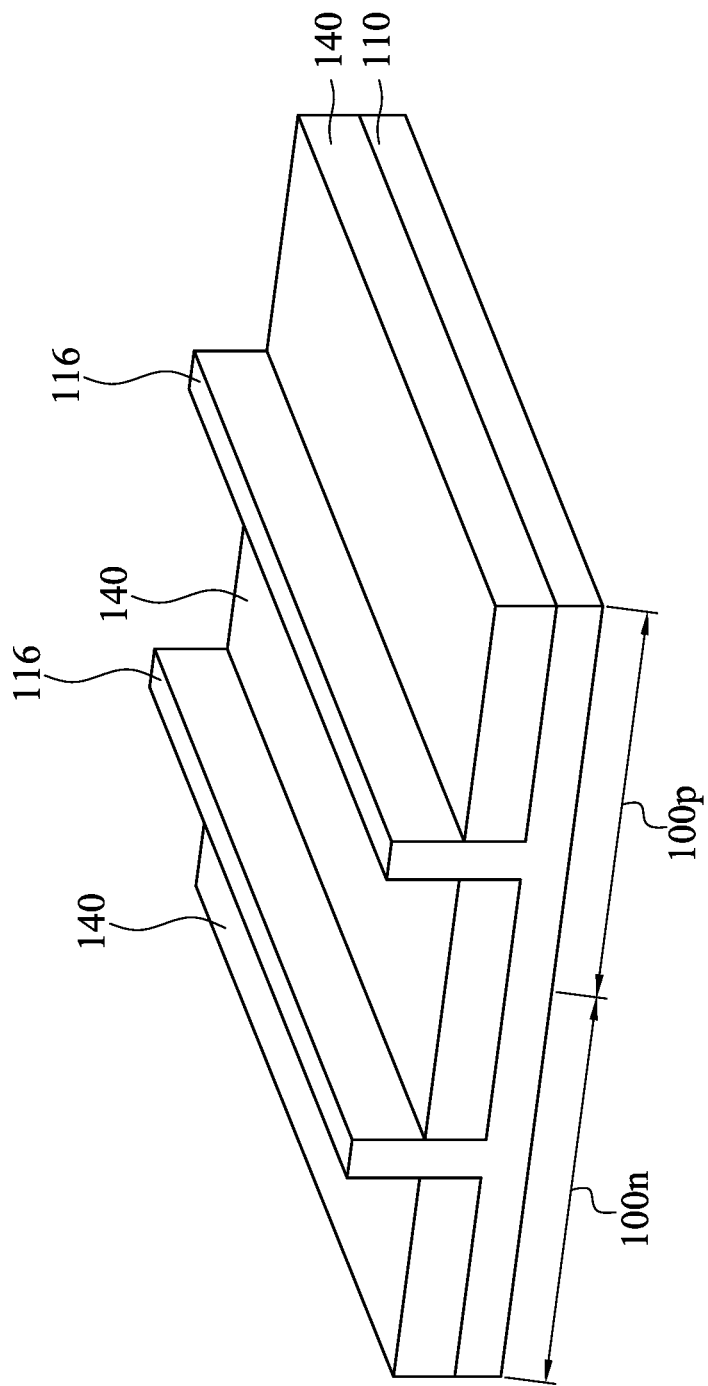

Reference is made to FIG. 1E. The isolation materials 140' of FIG. 1D are recessed to form isolation structures 140 adjacent to and in contact with the semiconductor fins 116, and portions of the semiconductor fins 116 protrude from the isolation structures 140. In following steps, front-end-of-line (FEOL) processes continue to form source/drain regions (e.g., n-doped or p-doped epitaxy structures, n-doped or p-doped implanted regions or the like), gate dielectric layers and gate electrodes on the semiconductor fins 116 to complete fabrication of FinFETs, and back-end-of-line (BEOL) processes follow the FEOL processes to form metal contacts, metal vias and metal lines over the FinFETs to complete fabrication of integrated circuits (ICs).

In FIG. 1C, the isolation material 140' is formed by performing the bias-induced selective ALD process. By providing a bias on the chuck 220, the charges have different distributions in different materials. The charges may attract or repulse the precursors to increase or decrease the corresponding deposition rate. In some other embodiments, the planarization process shown in FIG. 1D can be omitted when there is a high deposition selectivity between the dielectric layer (i.e., the mask layer 120) and the semiconductor layer (i.e., the substrate 110). Furthermore, a self-aligned monolayers (SAMs), which may formed using an additional deposition process and cause defect issues, can be omitted to simplify the manufacturing process.

The isolation materials 140' in FIG. 1C may be formed using other bias and/or precursors. FIGS. 6A-6E are cross-sectional views taking along line A-A of FIG. 1C at various stages in accordance with some embodiments of the present disclosure. Throughout the various views and illustrative embodiments, like reference numbers are used to designate like elements. The present embodiment may repeat reference numerals and/or letters used in FIGS. 4A-4E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 6A-6E. In some embodiments, the formation of the isolation material 140' in FIGS. 6A-6E is performed in the fabrication apparatus 200 of FIG. 3 and/or using the method M1 in FIG. 2. In some embodiments, the time table of FIG. 5 is also applied to the manufacturing processes in FIGS. 6A-6E. It is noted that the sizes of the precursors shown in FIGS. 6A-6D are illustrated only, and do not limit the scope of the embodiments.

Figure 6A:
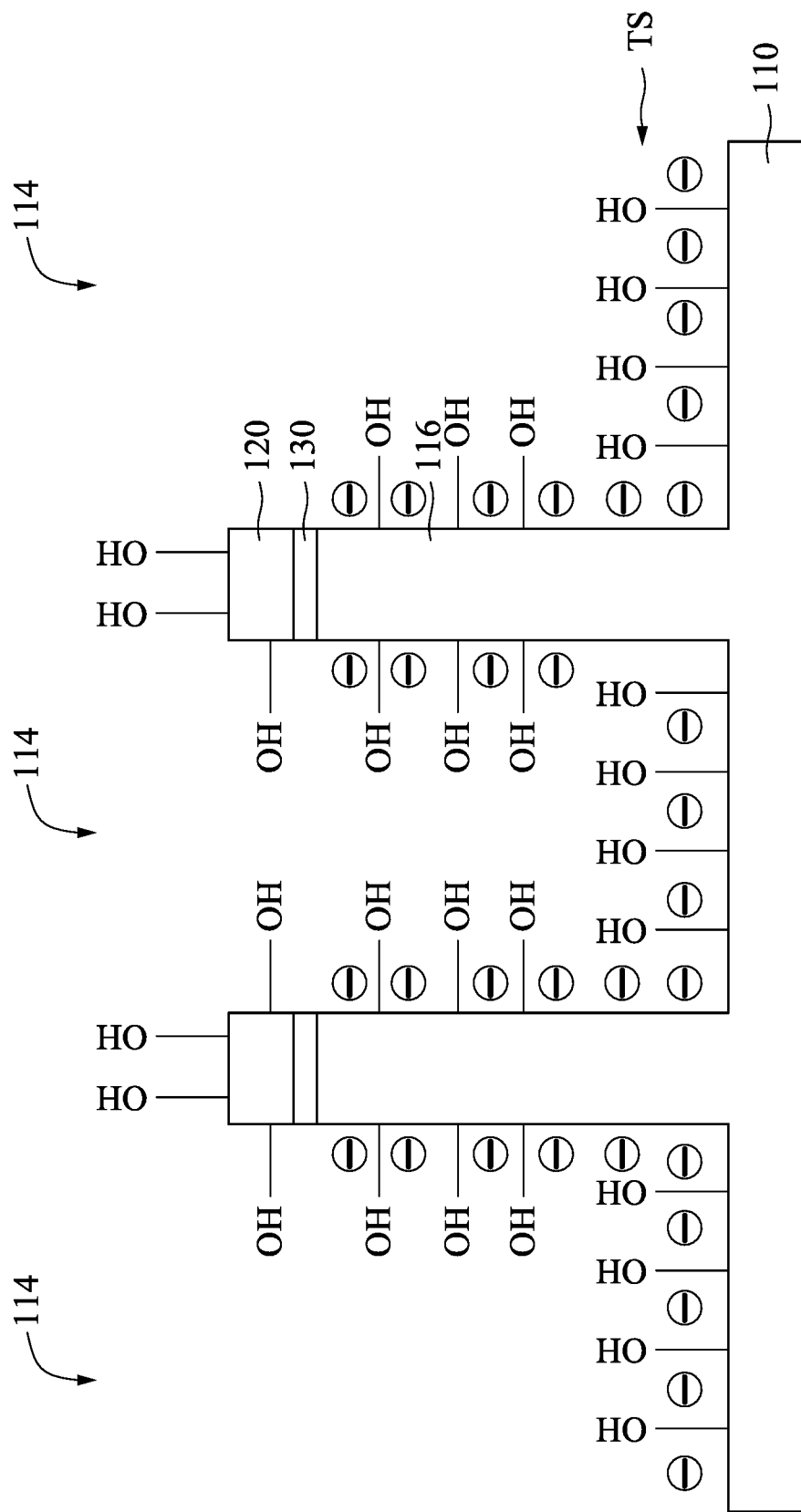
FIGS. 6A-6E are cross-sectional views taking along line A-A of FIG. 1C at various stages in accordance with some embodiments of the present disclosure.

Reference is made to FIGS. 2, 3, and 6A. In operation S12 of the method M1, a wafer is positioned on a chuck of a fabrication apparatus. In some embodiments, the surfaces of the structure (i.e., the substrate 110 and the mask layer 120) may be terminated with terminating species TS. In some examples, the terminating species TS is hydroxide (—OH), oxygen (—O), or the like. Termination by hydroxide (—OH) and/or oxygen (—O) can occur, for example, as a result of a cleaning or photoresist stripping process performed on the surfaces of the substrate 110 and the mask layer 120 and/or by exposing the surfaces of the substrate 110 and the mask layer 120 to a natural environment that contains oxygen. The terminating species TS can be other species, such as hydrogen (—H), nitrogen (—N), ammonia (—NH$_3$), or the like, such as depending on a cleaning and/or stripping process that is performed on the surfaces. In some embodiments, the surfaces of the substrate 110 and the mask layer 120 initially carries the terminating species TS. That is, the substrate 110 and the mask layer 120 includes terminating species TS itself. In some other embodiments, the surfaces of the substrate 110 and the mask layer 120 are initially neutral, and a surface treatment (e.g., the cleaning and/or stripping process mentioned above) can be performed on the surfaces to change or modify the surface termination. In still some other embodiments, H$_2$O are fed into the chamber 210 to form the terminating species TS on the surfaces of the substrate 110.

In operation S14 of the method M1, a bias is applied to the chuck. The bias is a negative DC bias in the case of FIG. 6A. With the negative DC bias, since the substrate 110 (e.g., a semiconductor material) has an electrical conductivity higher than that of the mask layer 120 (e.g., a dielectric layer), charges (i.e., electrons in this case) are accumulated within the substrate 110, such that more charges remain in the vicinity of the surface of the substrate 110 as shown in FIG. 6A. The bias source 270 in FIG. 3 is configured to apply the negative DC bias to the chuck 220, and the bias may have a power greater than about 0 W and equal to or less than about 50 W, e.g., about 20 W.

In some embodiments, the bias applied to the chuck 220 continues the first period T1 as shown in FIG. 5. The bias is applied before precursors are fed into the chamber 210. Once the negative DC bias is applied to the chuck 220, electrons move to the surface of the substrate 110. Hence, the surface of the substrate 110 is negative charged in this case.

Figure 6B:
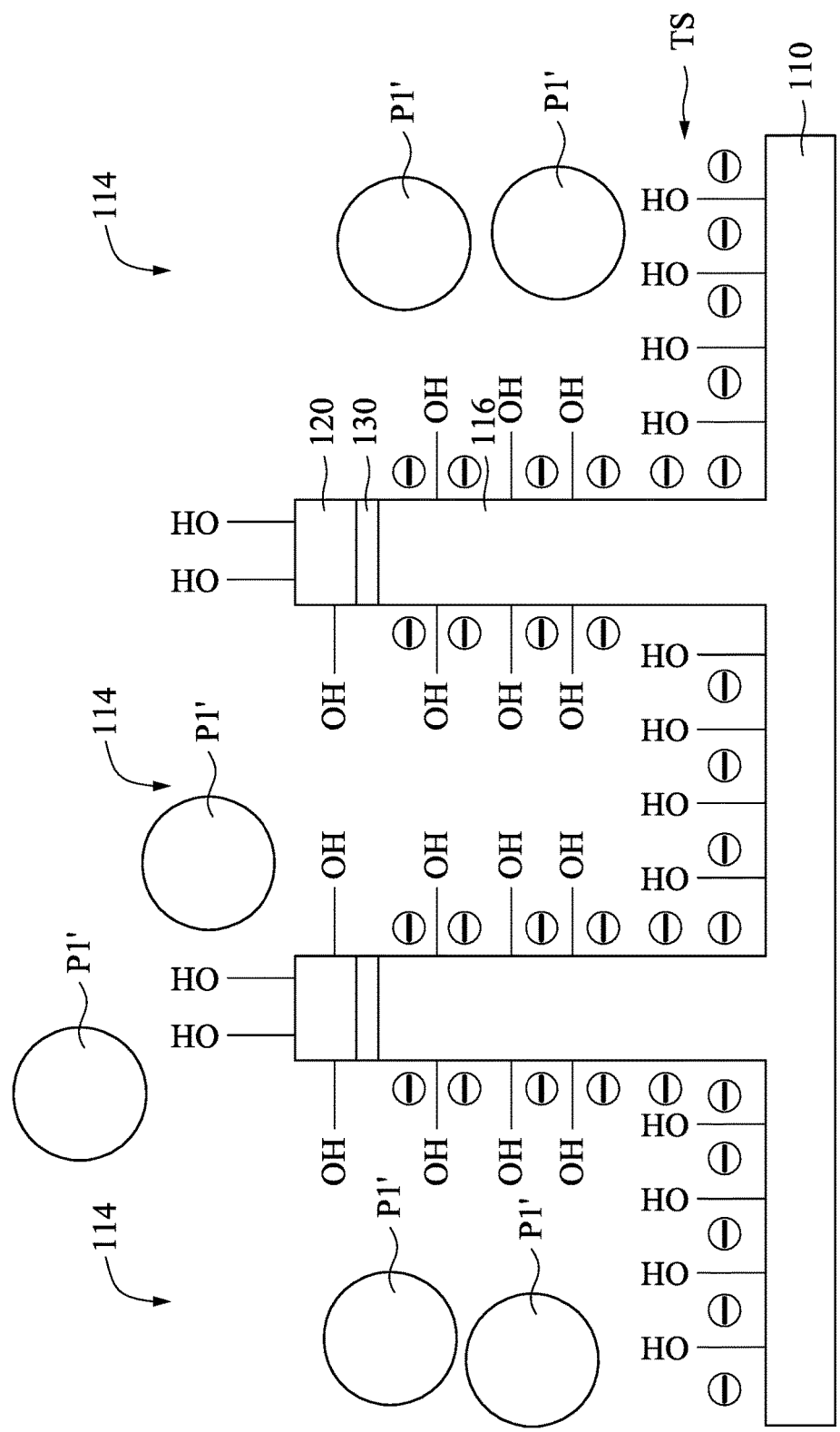
Figure 6C:
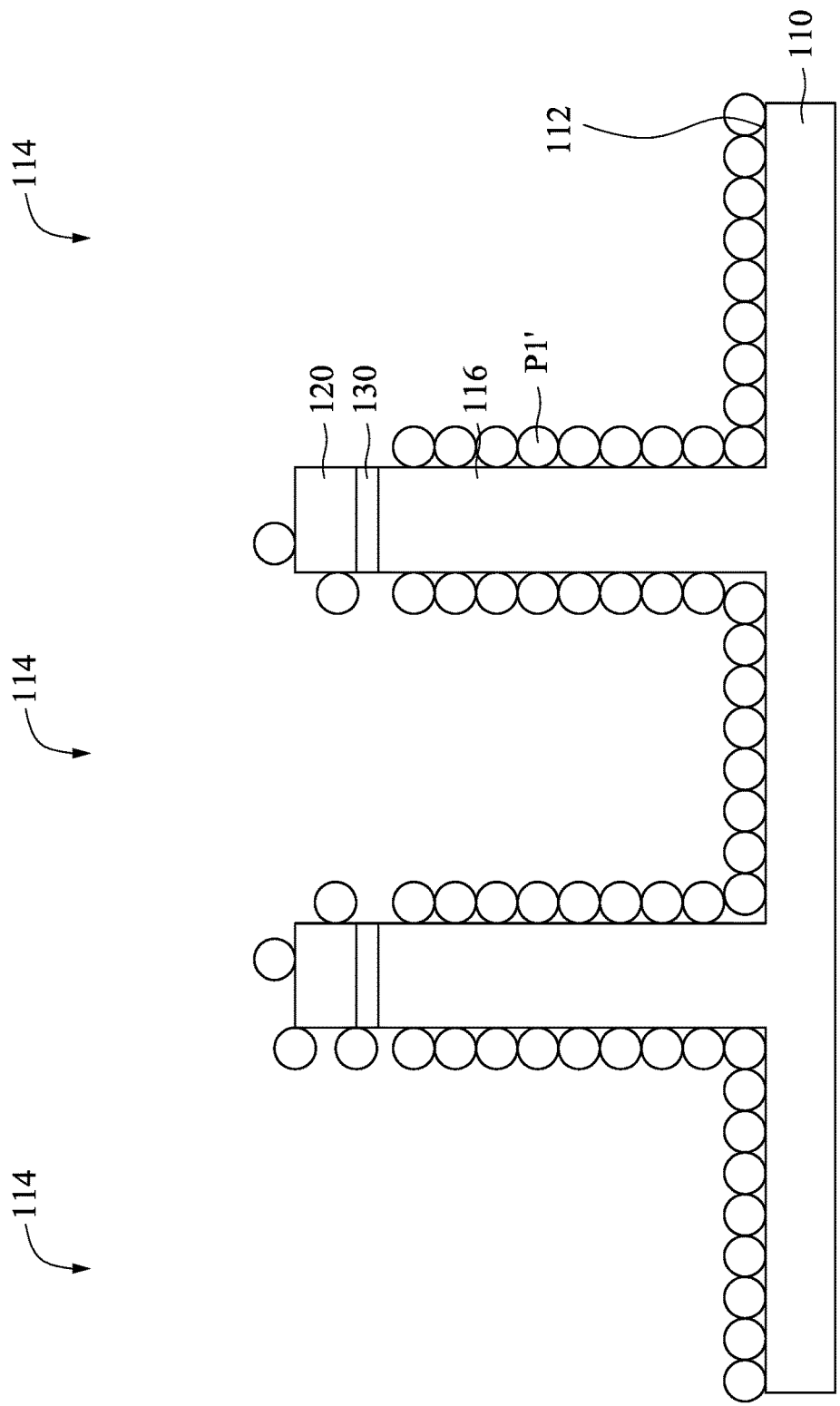

In operation S16 of the method M1, first precursors are fed into the chamber of the fabrication apparatus. Reference is made to FIGS. 3 and 6B. For example, first precursors P1' (e.g., silicon precursors in this case) are fed into the chamber 210 from the precursor delivery 240. In some embodiments, by controlling the temperature of the chamber 210 and/or feeding reaction gases into the chamber 210, a chemical reaction occurs such that a substituent is removed from the first precursor P1', and thus the first precursors P1' become partially positive. The first precursors P1' with partial positive charges are mostly attracted by the substrate 110, and thus are mostly deposited on the substrate 110 rather than on the mask layer 120. As shown in FIG. 6C, the first precursors P1' are mostly absorbed on the surface 112 of the substrate 110. In some embodiments, there are still some first precursors P1' absorbed on the surfaces of the dielectric materials (i.e., the mask layer 120 and the pad layer 130 in this case).

The first precursors P1' are fed into the chamber 210 for the second period T2 (see FIG. 5). In some embodiments, the third period T3 in FIG. 5 is long enough to charge the mask layer 120, and the fourth period T4 in FIG. 5 is long enough to provide the reaction time of the first precursor deposition. Further, during the operations S14 and S16, the plasma source 230 is turned off, such that there is no or negligible plasma in the chamber 210 when the bias is applied to the chuck 220. In some other embodiments, the first precursors P1' is plasma, and the first precursors P1' are fed into the chamber 210 from the plasma source 230. During this process, the plasma is originated from the plasma source 230 and not in the chamber 210, such that a bias with a low power can be applied to the chuck 220 to perform the selective ALD process.

Figure 6D:
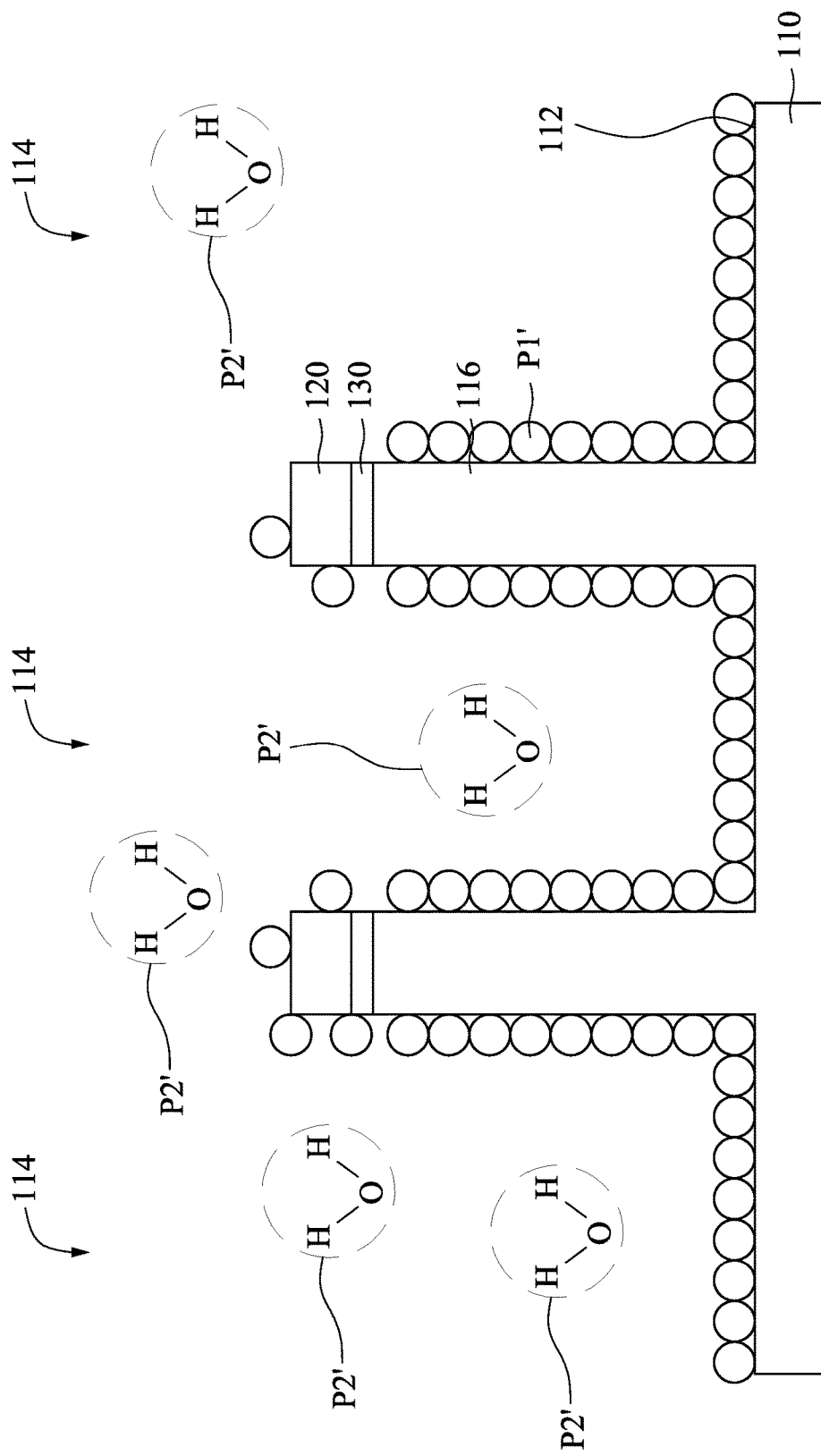
Figure 6E:
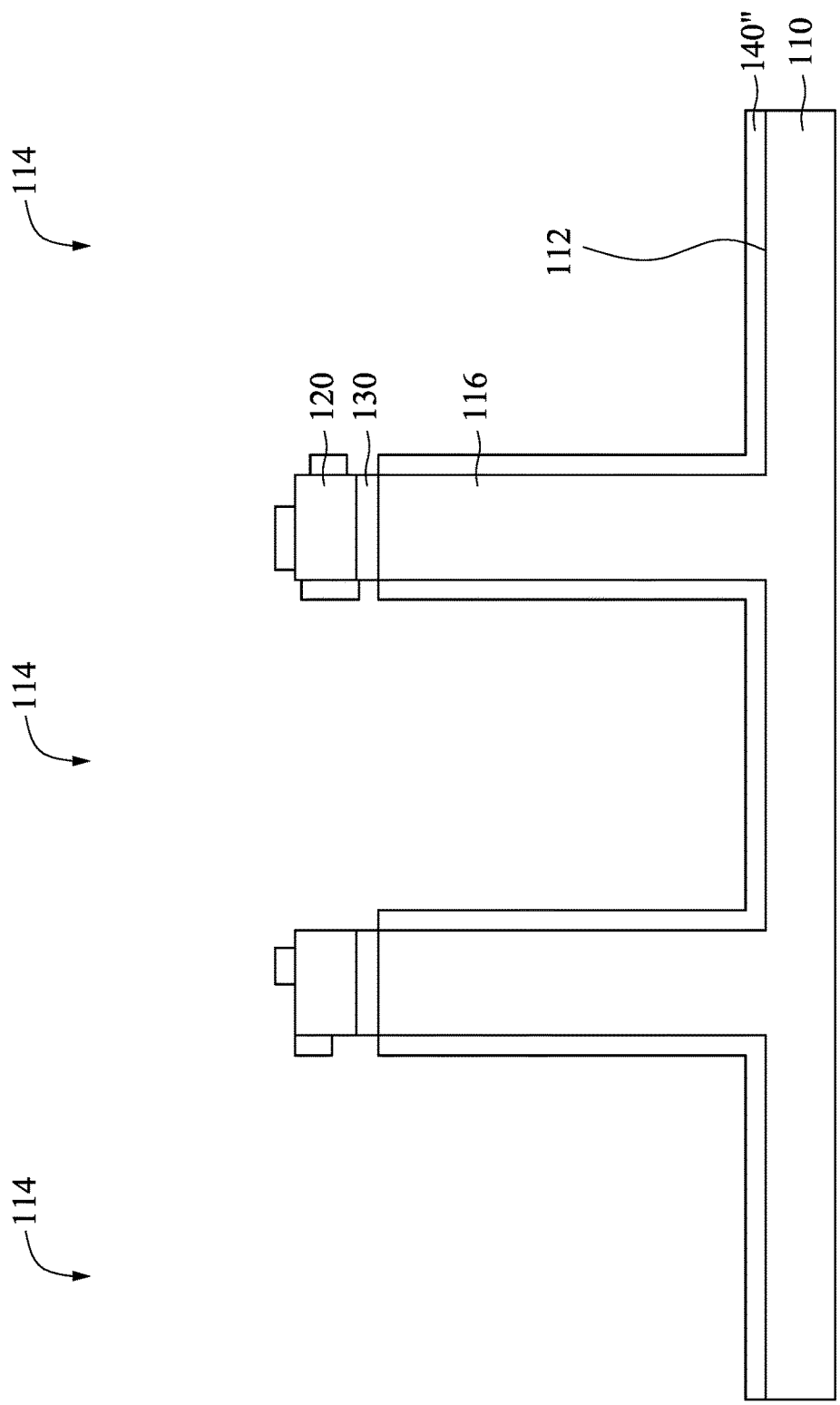

In operation S18 of the method M1, the bias is turned off, and in operation S20 of the method M1, the excess first precursors are purged out of the chamber. In operation S22 of the method M1, second precursors are fed into the chamber of the fabrication apparatus. Reference is made to FIGS. 3 and 6D. For example, second precursors P2' (e.g., oxidizers such as H$_2$O vapor, O$_3$, or O$_2$ plasma in this case) are fed into the chamber 210 from the precursor delivery 240 or the plasma source 230 (for the O$_2$ plasma oxidizers). As shown in FIG. 6D, the second precursors P2' are attracted by the first precursors absorbed on the substrate 110. The second precursors P2' are likely to be attracted by the first precursors, and thus more second precursors P2' are deposited on the surfaces of the substrate 110 and less second precursors P2' are deposited on the surfaces of the mask layer 120 and the pad layer 130. As shown in FIG. 6E, a dielectric film 140" is formed on the surfaces of the substrate 110, the mask layer 120, and the pad layer 130.

In FIG. 5, the purging of the second precursors P2' maintains for the fifth period T5. In some embodiments, the sixth period T6 of FIG. 5 is for neutralizing the surface 112 of the substrate 110. In some embodiments, the seventh period T7 of FIG. 5 provides the reaction time of the second precursor deposition.

In operation S24 of the method M1, the excess second precursors are purged out of the chamber. After the operation S24, a dielectric film 140" is mostly formed on the surface of the substrate 110 as shown in FIG. 6E, and this dielectric film 140" may expose portions of the surfaces of the mask layer 120 (and the pad layer 130). That is, the selective ALD deposition process results in no or negligible dielectric film 140" deposited on the mask layer 120 and the pad layer 130. Then, the method M1 goes to the operation S14 to repeat the operations S14-S24 and form another dielectric film on the dielectric film 140". The cycle of the operations S14-S24 may be repeated many times to form the isolation materials 140' in the trenches 114, as shown in FIG. 1C. In operation S26 of the method M1, the wafer is taken out of the chamber to process the next manufacturing process.

Figure 7:
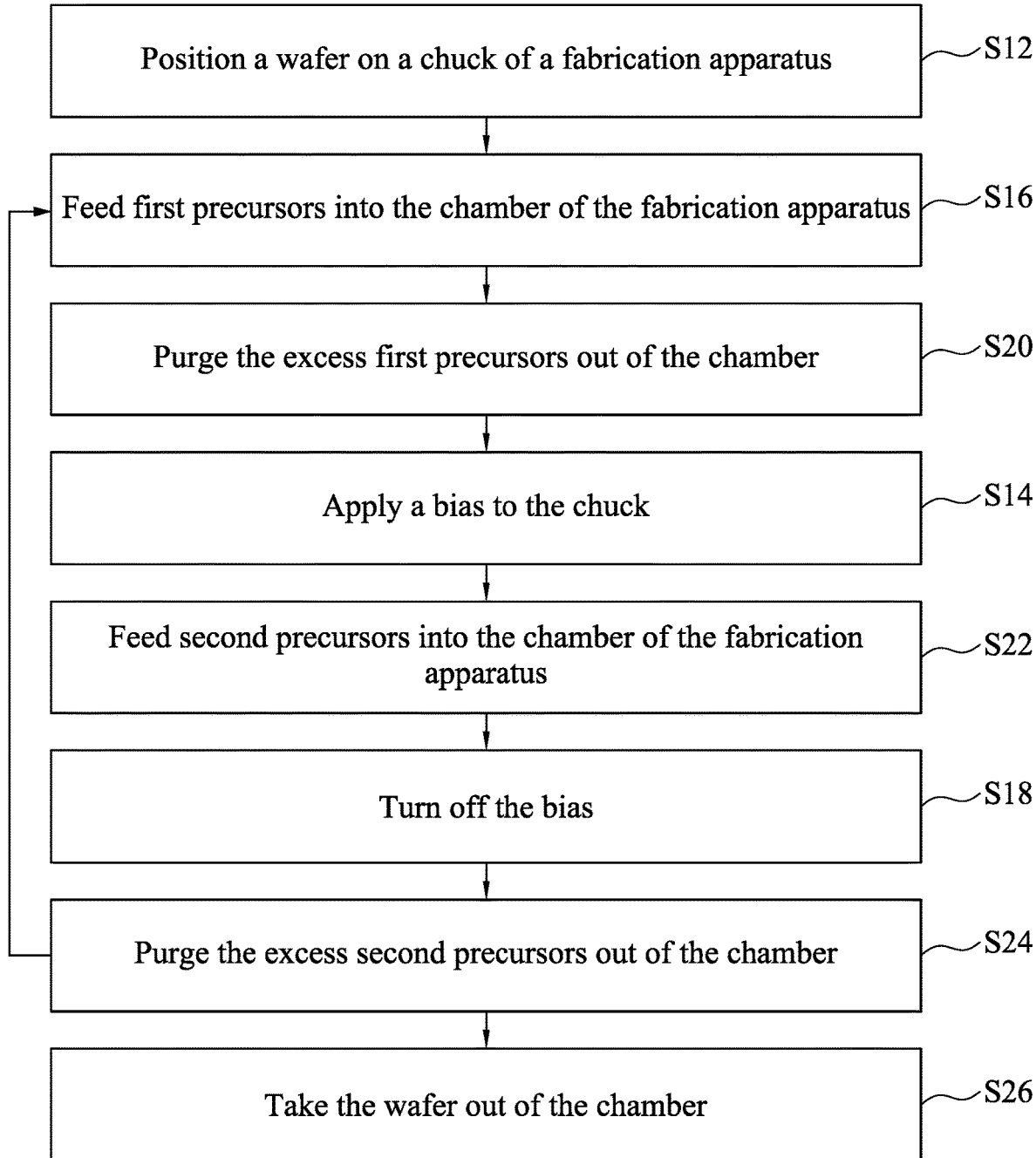
FIG. 7 is a flow chart of a method of a bias-induced selectively ALD process in accordance with some embodiments of the present disclosure.

FIG. 7 is a flow chart of a method M2 of a bias-induced selectively ALD process in accordance with some embodiments of the present disclosure. FIGS. 8A-8E are cross-sectional views taking along line A-A of FIG. 1C at various stages in accordance with some embodiments of the present disclosure. Throughout the various views and illustrative embodiments, like reference numbers are used to designate like elements. The present embodiment may repeat reference numerals and/or letters used in FIGS. 4A-4E. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 8A-8E. In some embodiments, the formation of the isolation material 140' in FIGS. 8A-8E is performed in the fabrication apparatus 200 of FIG. 3. It is noted that the sizes of the precursors shown in FIGS. 8A-8D are illustrated only, and do not limit the scope of the embodiments.

Figure 8A:
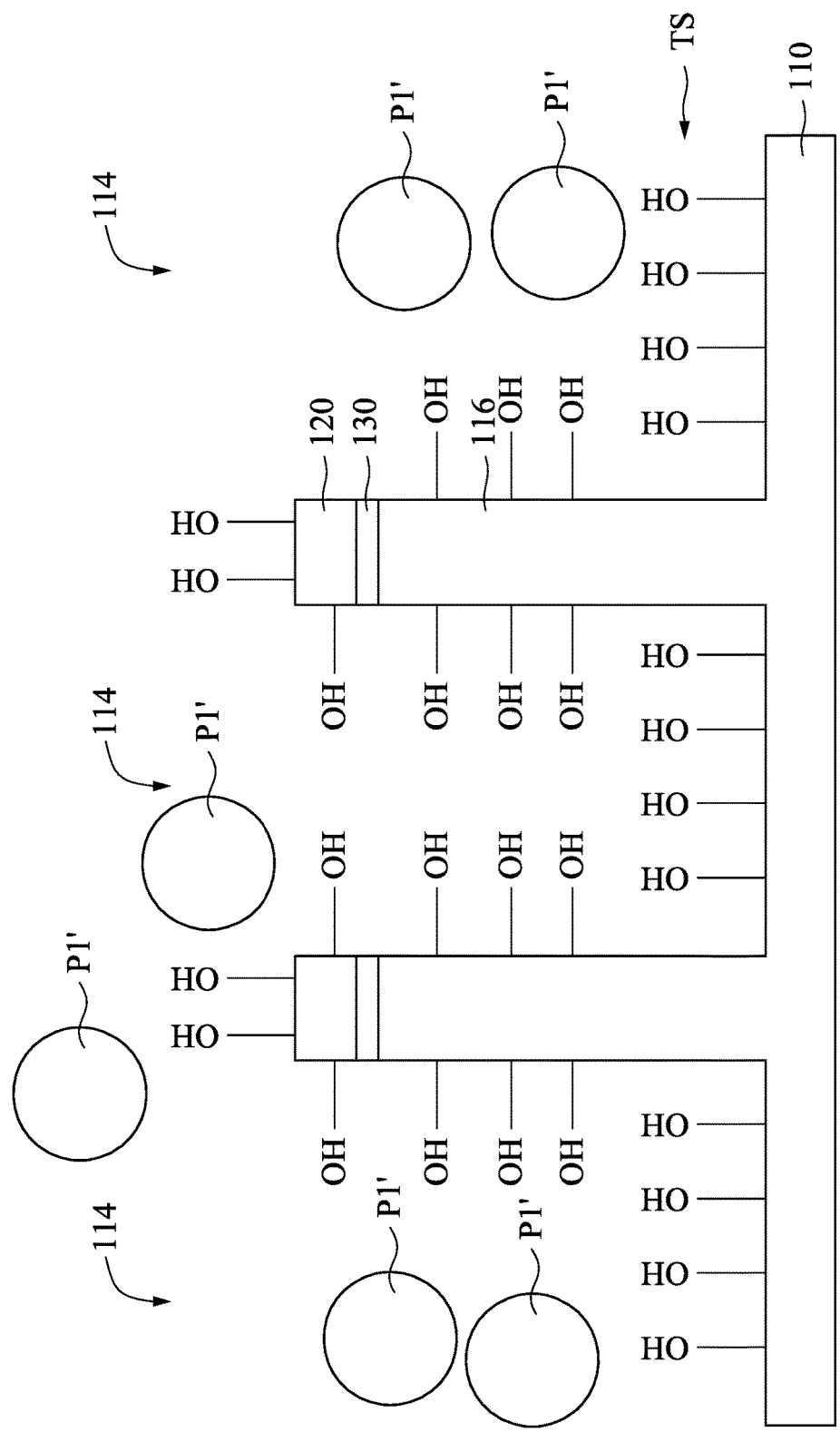
FIGS. 8A-8E are cross-sectional views taking along line A-A of FIG. 1C at various stages in accordance with some embodiments of the present disclosure.

Reference is made to FIGS. 3, 7, and 8A. In operation S12 of the method M2, a wafer is positioned on a chuck of a fabrication apparatus. In some embodiments, the surfaces of the structure (i.e., the substrate 110 and the mask layer 120)

may be terminated with terminating species TS. In operation S16 of the method M2, first precursors are fed into the chamber of the fabrication apparatus. Reference is made to FIGS. 3 and 8A. For example, first precursors P1' (e.g., silicon precursors in this case) are fed into the chamber 210 from the precursor delivery 240. The first precursors P1' are absorbed both on the surfaces of the substrate 110 and the mask layer 120 as shown in FIG. 8B.

Figure 9:
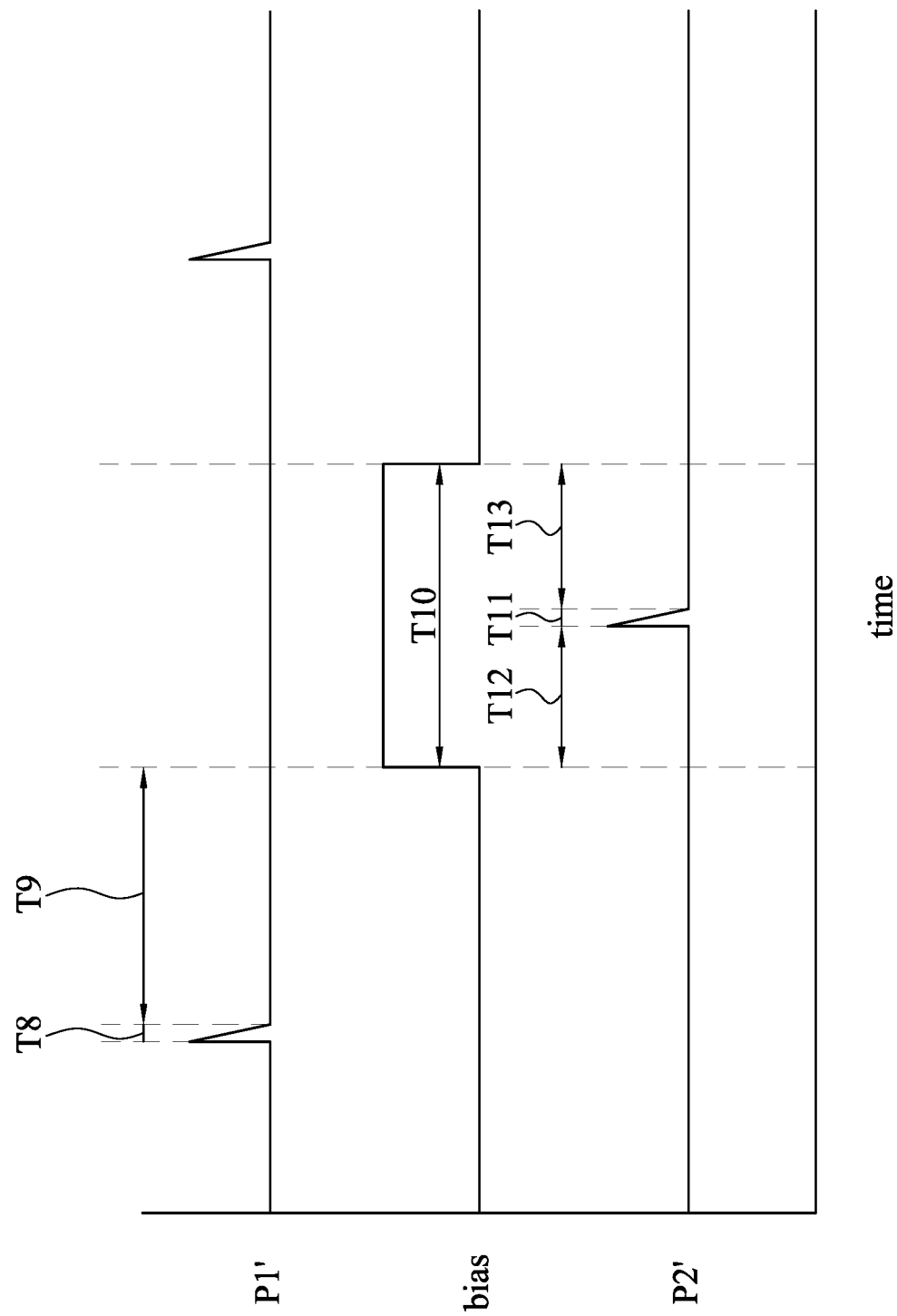
FIG. 9 is a timing diagram of bias pulses and precursors providing according to some embodiments.

FIG. 9 is a timing diagram of bias pulses and precursors providing according to some embodiments. Reference is made to FIGS. 3, 8A, and 9. In FIG. 9, the first precursors P1' are fed into the chamber 210 for an eighth period T8. In some embodiments, during the operation S16, the plasma source 230 is turned off, such that there is no or negligible plasma in the chamber 210 when the first precursors P1' are fed into the chamber 210. In some other embodiments, the first precursors P1 is plasma, and the first precursors P1 are fed into the chamber 210 from the plasma source 230. In some embodiments, the ninth period T9 in FIG. 9 is long enough to provide the reaction time of the first precursor deposition.

Figure 8B:
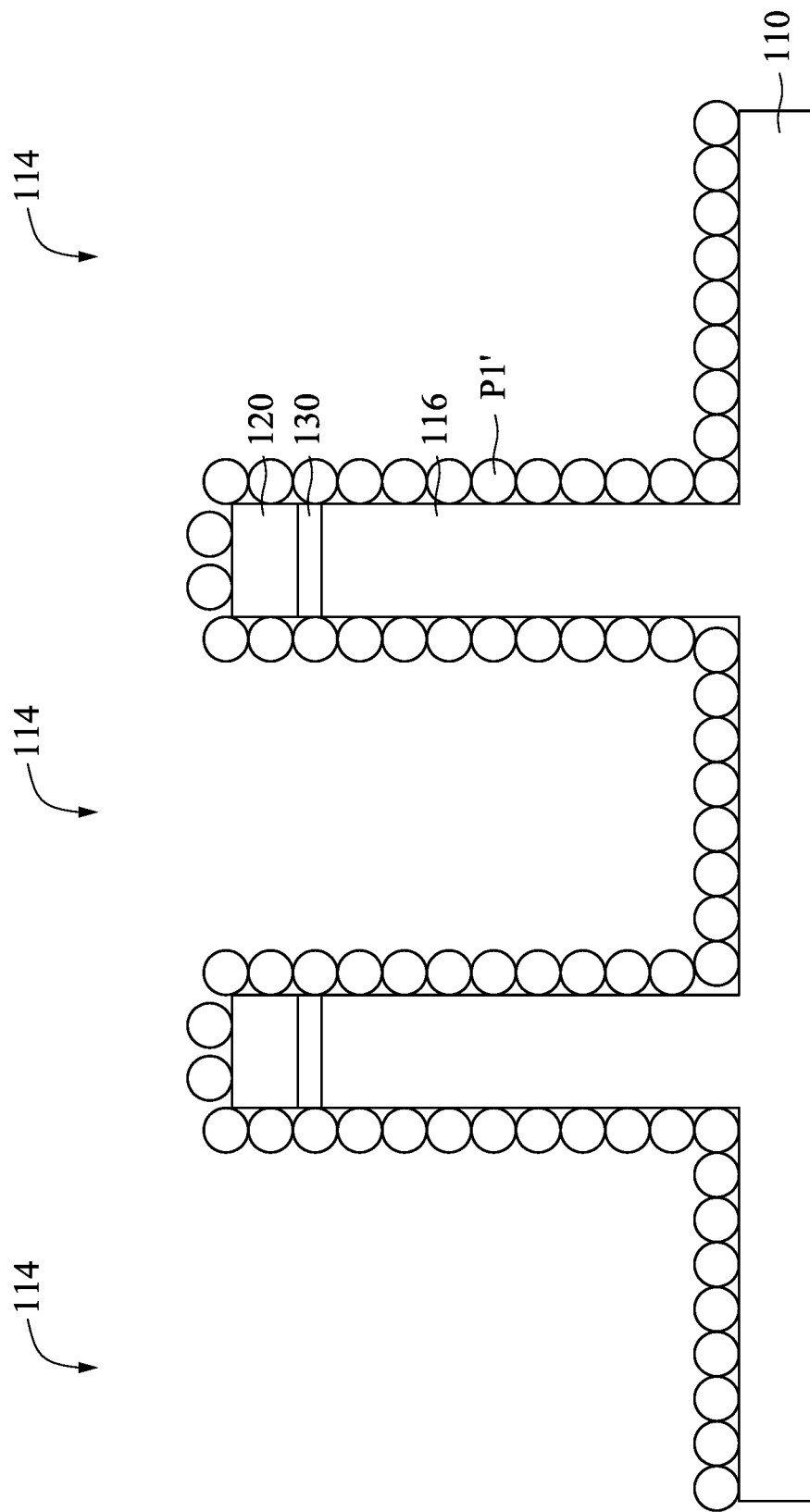
Figure 8C:
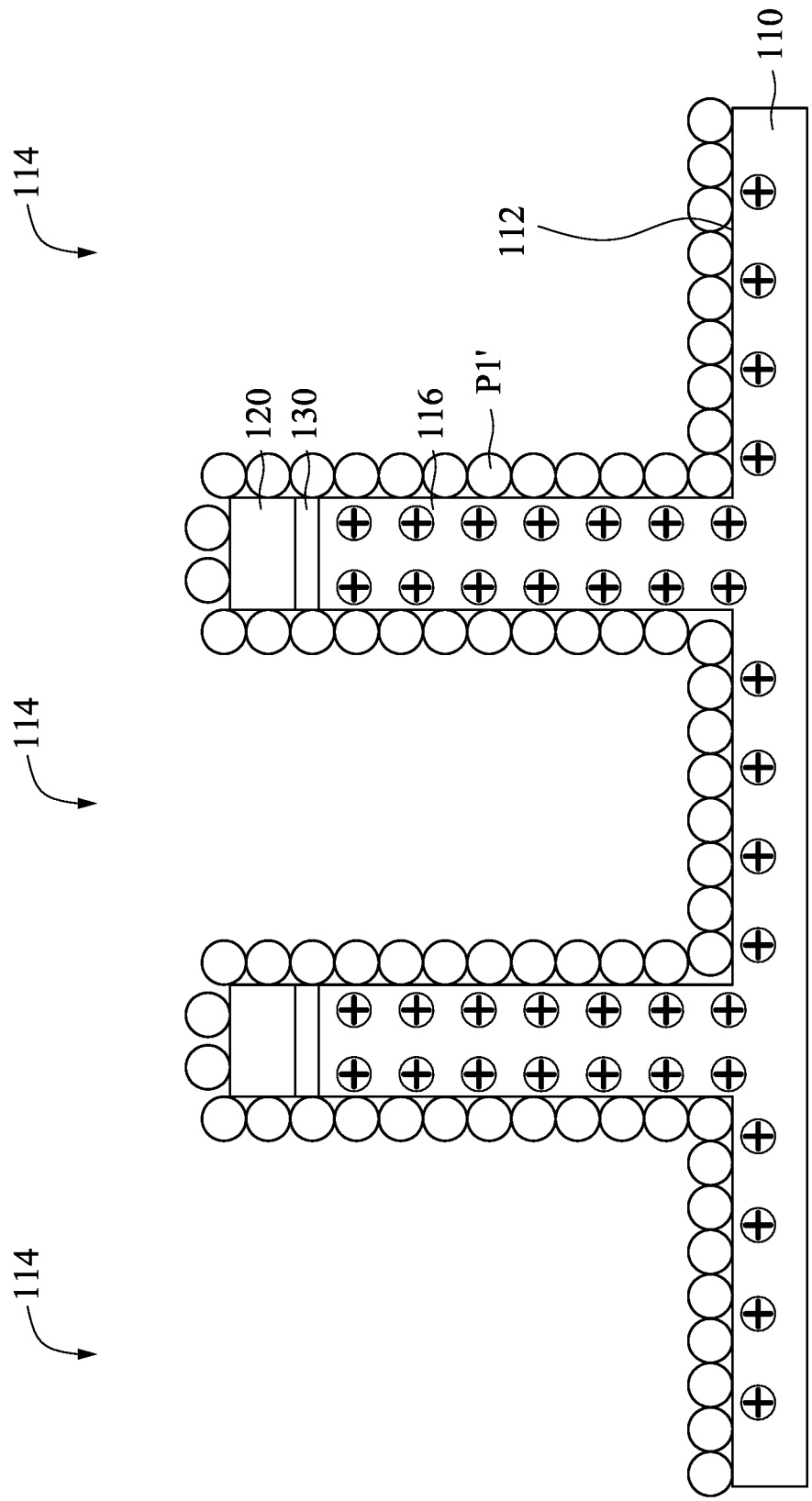

In operation S20 of the method M2, the excess first precursors are purged out of the chamber, leaving first precursors absorbed on the surfaces of the substrate 110 and the mask layer 120 as shown in FIG. 8B. In operation S14 of the method M2, a bias is applied to the chuck. The bias is a positive DC bias in the case of FIG. 8C. With the positive DC bias, since the substrate 110 (e.g., a semiconductor material) has an electrical conductivity higher than that of the mask layer 120 (e.g., a dielectric layer), charges (i.e., holes in this case) are accumulated within the substrate 110, such that more charges remain in the vicinity of the surface of the substrate 110 as shown in FIG. 8C. The bias source 270 in FIG. 3 is configured to apply the positive DC bias to the chuck 220, and the bias may have a power greater than 0 W and equal to or less than about 50 W, e.g., about 20 W.

In some embodiments, the bias applied to the chuck 220 continues a tenth period T10 as shown in FIG. 9. The bias is applied before the second precursors P2' (see FIG. 8D) are fed into the chamber 210. Once the positive DC bias is applied to the chuck 220, electron holes move to the surface 112 of the substrate 110. Hence, the surface 112 of the substrate 110 is positive charged in this case.

Figure 8D:
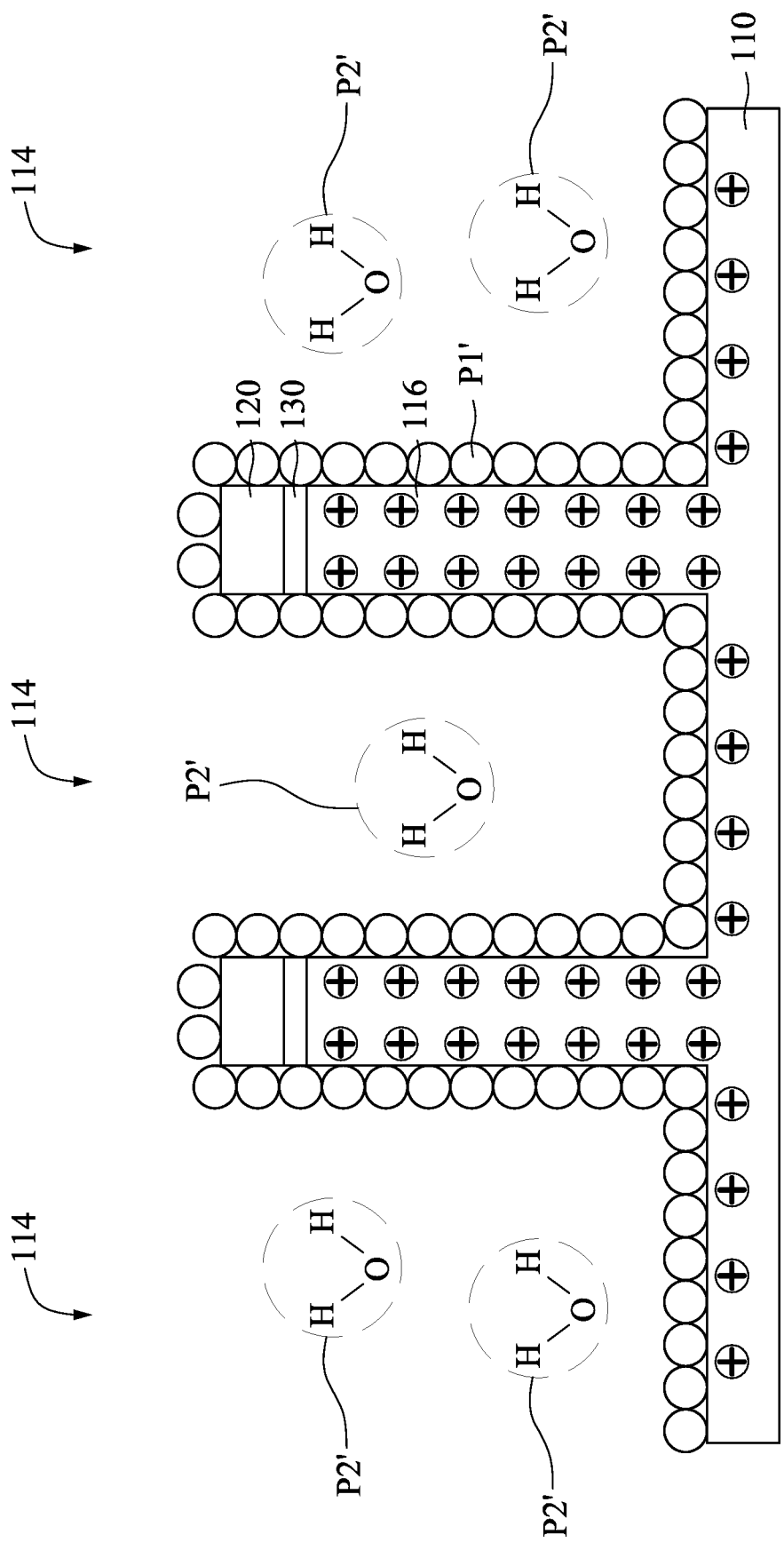
Figure 8E:
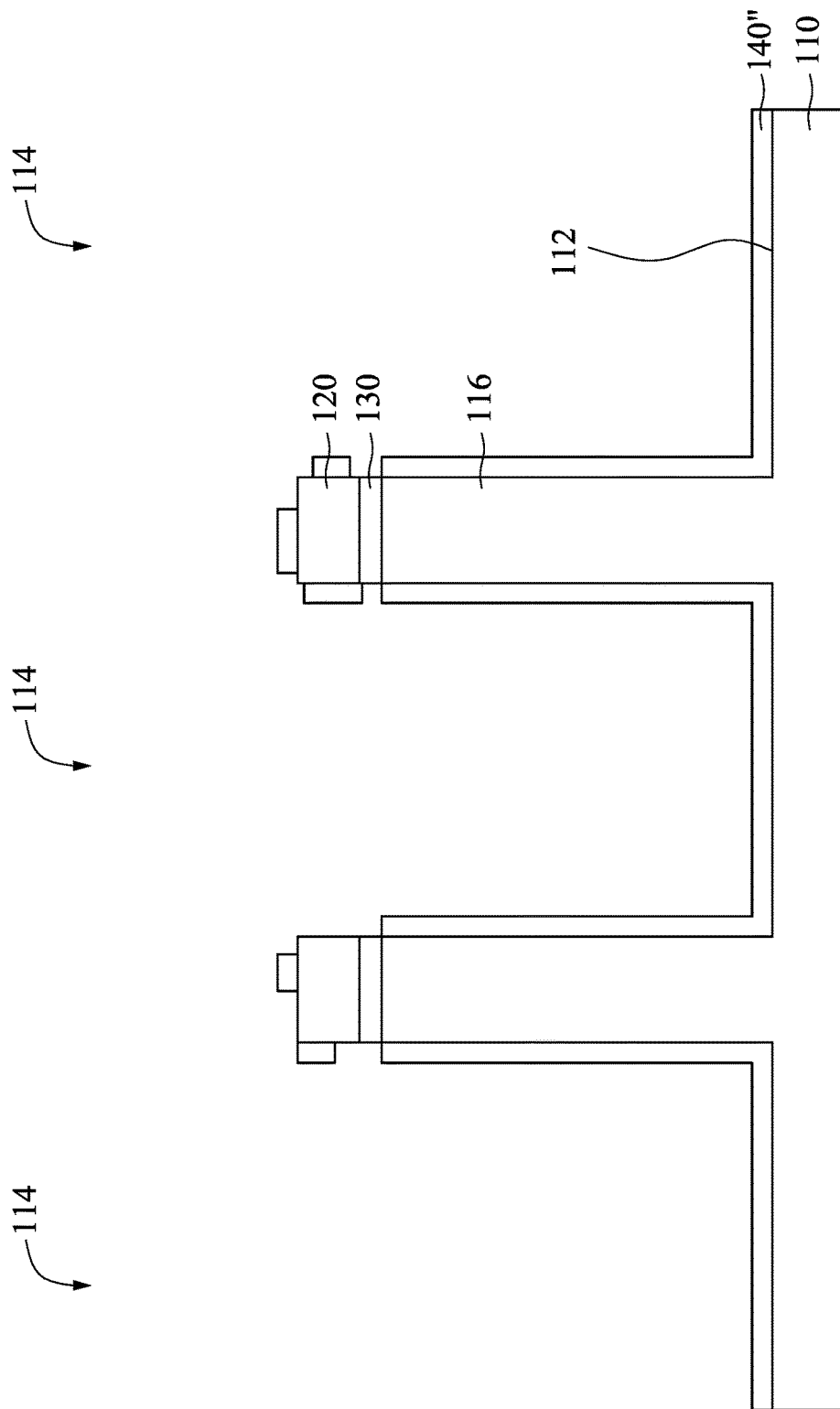

In operation S22 of the method M2, second precursors are fed into the chamber of the fabrication apparatus. Reference is made to FIGS. 3 and 8D. For example, second precursors P2' (e.g., $H_2O$ in this case) are fed into the chamber 210 from the precursor delivery 240. The positive charges (holes) in the vicinity of the surface of the substrate 110 attracts the $H_2O$ molecules due to their partial negative charges (oxygen). The $H_2O$ molecules may be mostly attracted by the substrate 110, and thus are mostly deposited on the substrate 110 rather than on the mask layer 120. As shown in FIG. 8E, the $H_2O$ molecules are mostly absorbed on the surface 112 of the substrate 110 to form the dielectric film 140". In some embodiments, there are still some $H_2O$ molecules are absorbed on the surfaces of the dielectric materials (i.e., the mask layer 120 and the pad layer 130 in this case).

Reference is made to FIG. 9. After the bias applied to the chuck 220 is turned on and before the bias is turned off, the second precursors P2' are fed into the chamber 210 for an eleventh period T11. In some embodiments, the eleventh period T11 is shorter than the tenth period T10 by multiple times. Further, the bias is turned off after the feeding of the second precursor P2' is stopped. A twelfth period T12 is between the beginning of the bias supply and the beginning of the second precursor feeding, and a thirteenth period T13 is between the finish of the second precursor feeding and the finish of the bias supply. In some embodiments, the twelfth period T12 is long enough to charge the substrate 110, and the thirteenth period T13 is long enough to provide the reaction time of the second precursor deposition.

In operation S18 of the method M2, the bias is turned off, and in operation S24 of the method M2, the excess second precursors are purged out of the chamber. After the operation S24, a dielectric film 140" is mostly formed on the surface 112 of the substrate 110 as shown in FIG. 8E, and this dielectric film 140" may expose portions of the surfaces of the mask layer 120 (and the pad layer 130). That is, the dielectric film 140" is not or barely deposited on the mask layer 120 and the pad layer 130. Then, the method M2 goes to the operation S16 to repeat the operations S16-S24 and form another dielectric film on the dielectric film 140". The cycle of the operations S16-S24 may be repeated many times to form the isolation materials 140' in the trenches 114, as shown in FIG. 1C. In operation S26 of the method M2, the wafer is taken out of the chamber to process the next manufacturing process.

FIGS. 10A-10I are perspective views of a method for manufacturing a semiconductor device at various stages in accordance with some embodiments of the present disclosure. In some embodiments, the semiconductor device shown in FIGS. 6A-6E may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 10A:
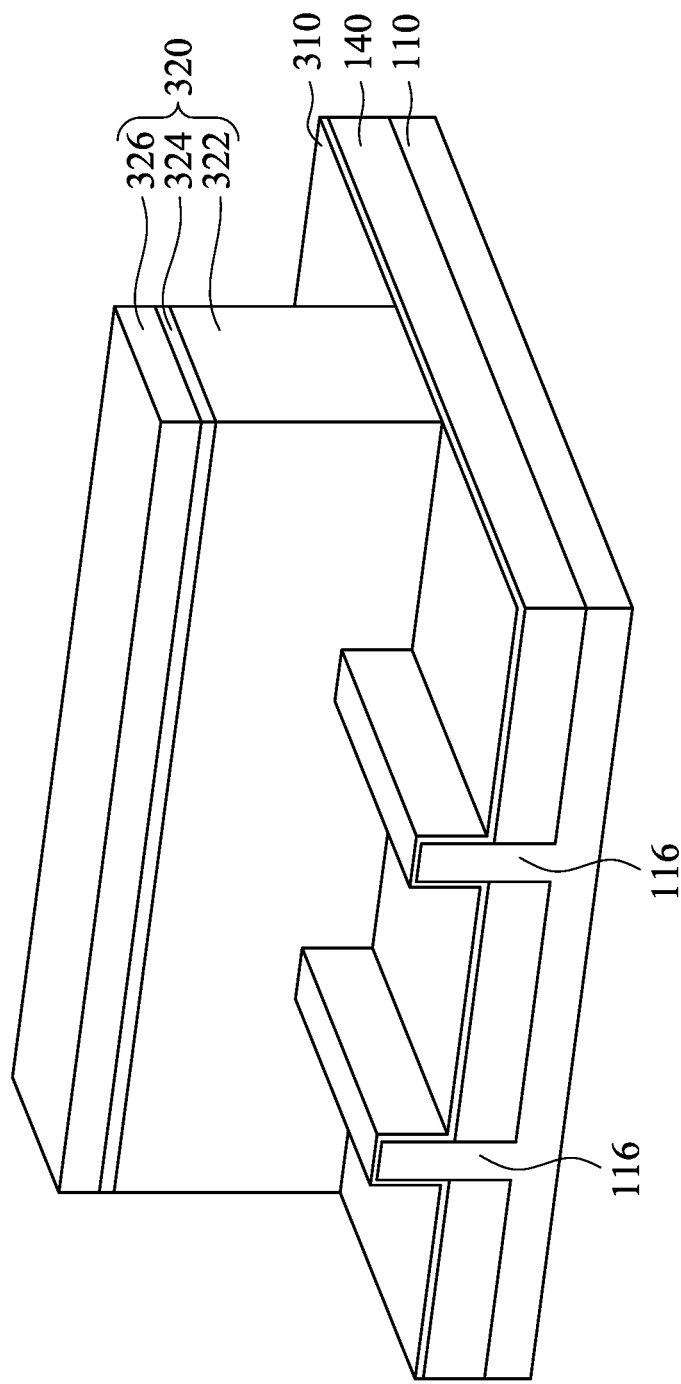
FIGS. 10A-10I are perspective views of a method for manufacturing a semiconductor device at various stages in accordance with some embodiments of the present disclosure.

Reference is made to FIG. 10A. A semiconductor structure is provided. The semiconductor structure includes a substrate 110, a plurality of semiconductor fins 116, and an isolation structure 140 laterally surrounds the semiconductor fins 116. In some embodiments, the formation of the semiconductor fins 116 may be the same or similar to the process shown in FIG. 1B, and, therefore, a detailed description is not repeated. In some embodiments, the formation of the isolation structure 140 may be similar to the process shown in FIGS. 1C-1E. In some other embodiments, the isolation structure 140 may include filling the trench by insulator materials such as silicon oxide, silicon nitride, or silicon oxynitride. The filled trench may have a multi-layer structure such as a thermal oxide liner layer with silicon nitride filling the trench. In some embodiments, the isolation structure 140 may be created by performing a flowable CVD process to deposit dielectric materials, and using chemical mechanical planarization (CMP) to remove the excessive dielectric materials.

Then, a dummy dielectric layer 310 is conformally formed to cover the semiconductor fins 116 and the isolation structures 140. In some embodiments, the dummy dielectric layer 310 may include silicon dioxide, silicon nitride, a high-κ dielectric material or other suitable material. In various examples, the dummy dielectric layer 310 may be deposited by an ALD process, a CVD process, a subatmospheric CVD (SACVD) process, a flowable CVD process, a PVD process, or other suitable process. By way of example, the dummy dielectric layer 310 may be used to prevent damage to the semiconductor fins 116 by subsequent processing (e.g., subsequent formation of the dummy gate structure).

Subsequently, at least one dummy gate structure 320 is formed over the dummy dielectric layer 310, the semiconductor fins 116, and the isolation structures 140. The dummy gate structure 320 includes a dummy gate electrode 322, a pad layer 324 formed over the dummy gate electrode 322, and a hard mask layer 326 formed over the pad layer 324. In some embodiments, a dummy gate layer (not shown) may be formed over the dummy dielectric layer 310, and the pad layer 324 and the hard mask layer 326 are formed over the dummy gate layer. The dummy gate layer is then patterned using the pad layer 324 and the hard mask layer 326 as masks to form the dummy gate electrode 322. As such, the dummy gate electrode 322, the pad layer 324, and the hard mask layer 326 are referred to as the dummy gate structure 320. In some embodiments, the dummy gate electrode 322 may be made of polycrystalline-silicon (poly-Si), polycrystalline silicon-germanium (poly-SiGe), or other suitable materials. The pad layer 324 may be made of silicon dioxide or other suitable materials, and the hard mask layer 326 may be made of silicon nitride or other suitable materials.

Figure 10B:
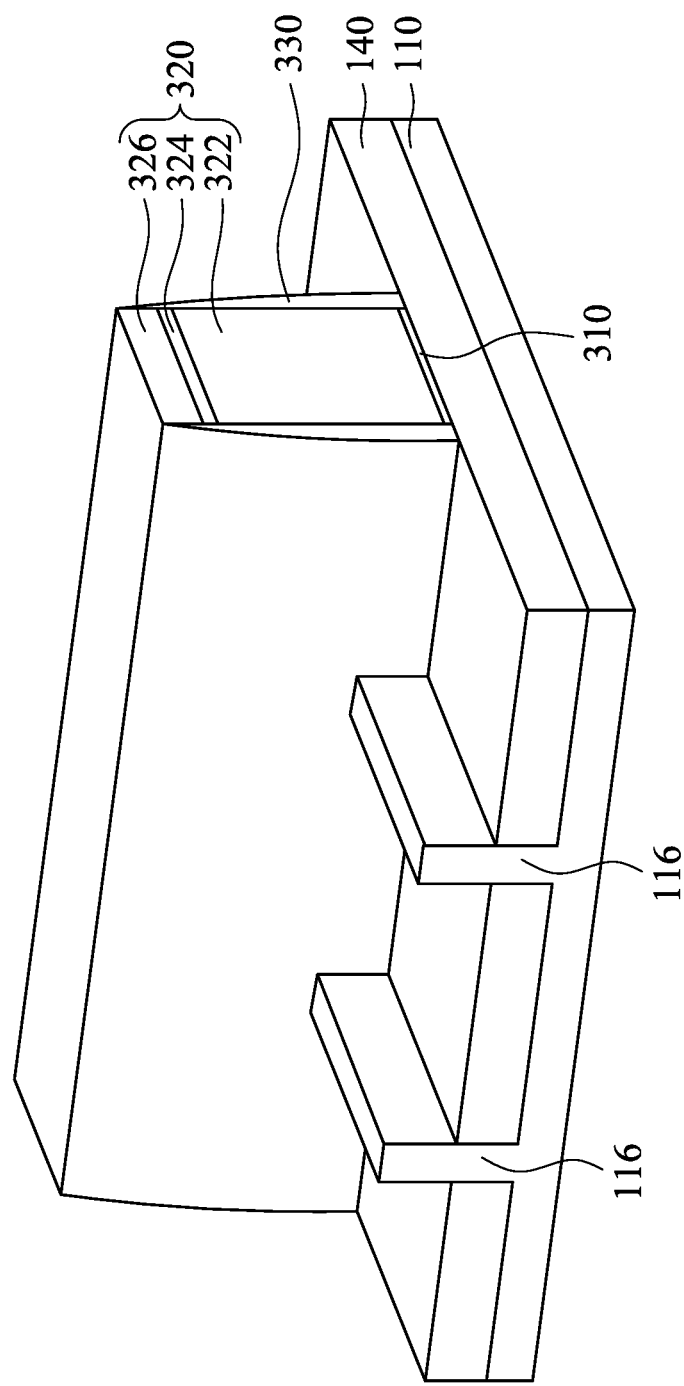

Reference is made to FIG. 10B. Portions of the dummy dielectric layer 310 uncovered by the dummy gate structure 320 are removed to expose the semiconductor fins 116. Spacer structures 330 are then formed at least on opposite sides of the dummy gate structure 320. The spacer structures 330 may include a seal spacer and a main spacer (not shown). The spacer structures 330 include one or more dielectric materials, such as silicon oxide, silicon nitride, silicon oxynitride, SiCN, SiCxOyNz, or combinations thereof. The seal spacers are formed on sidewalls of the dummy gate structure 320 and the main spacers are formed on the seal spacers. The spacer structures 330 can be formed using a deposition method, such as plasma enhanced chemical vapor deposition (PECVD), low-pressure chemical vapor deposition (LPCVD), sub-atmospheric chemical vapor deposition (SACVD), or the like. The formation of the spacer structures 330 may include blanket forming spacer layers and then performing etching operations to remove the horizontal portions of the spacer layers. The remaining vertical portions of the spacer layers form the spacer structures 330.

Figure 10C:
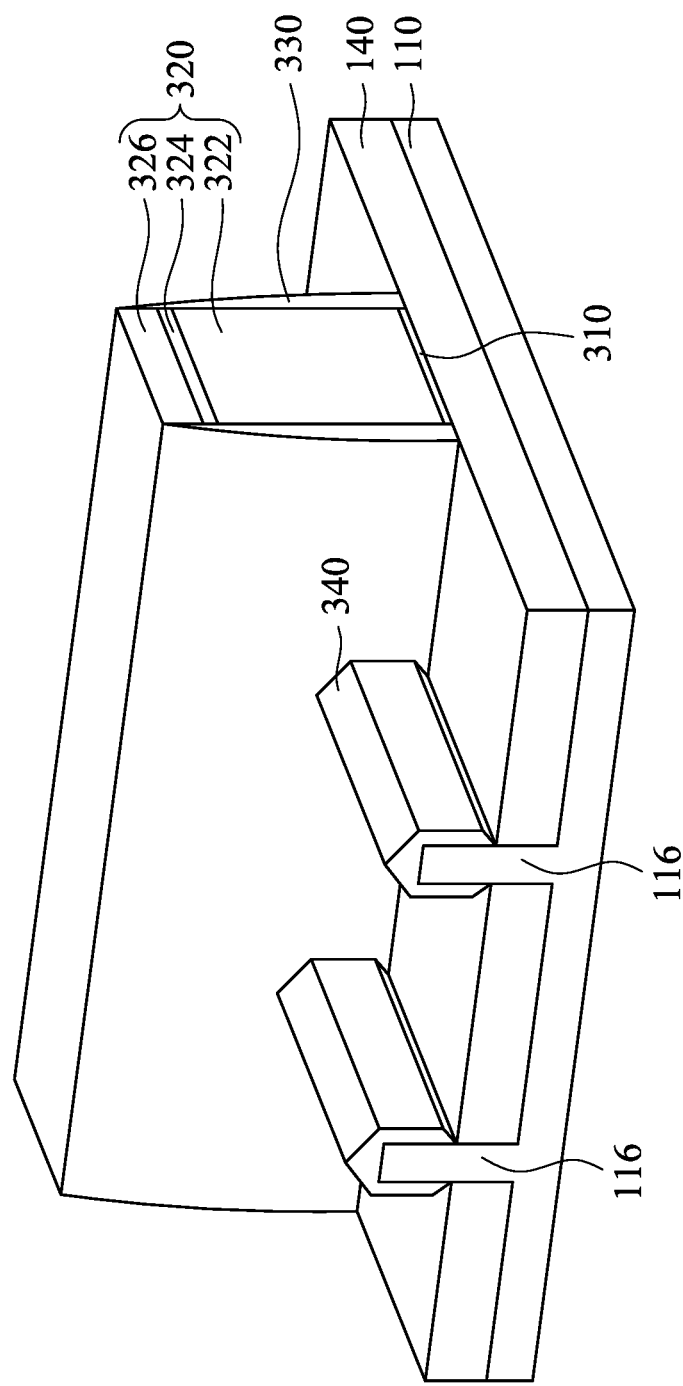

Reference is made to FIG. 10C. Epitaxial structures 340 are then formed on portions of the semiconductor fins 116 uncovered by the dummy gate structure 320 and the spacer structures 330 by performing, for example, a selectively growing process. The epitaxial structures 340 are formed by epitaxially growing a semiconductor material. The semiconductor material includes single element semiconductor material, such as germanium (Ge) or silicon (Si), compound semiconductor materials, such as gallium arsenide (GaAs) or aluminum gallium arsenide (AlGaAs), or semiconductor alloy, such as silicon germanium (SiGe) or gallium arsenide phosphide (GaAsP). The epitaxial structures 340 have suitable crystallographic orientations (e.g., a (100), (110), or (111) crystallographic orientation). In some embodiments, the epitaxial structures 340 include source/drain epitaxial structures. In some embodiments, where an N-type device is desired, the epitaxial structures 340 may include an epitaxially growing silicon phosphorus (SiP) or silicon carbon (SiC). In some embodiments, where a P-type device is desired, the epitaxial structures 340 may include an epitaxially growing silicon germanium (SiGe). The epitaxial processes include CVD deposition techniques (e.g., vapor-phase epitaxy (VPE) and/or ultra-high vacuum CVD (UHV-CVD)), molecular beam epitaxy, and/or other suitable processes.

Figure 10D:
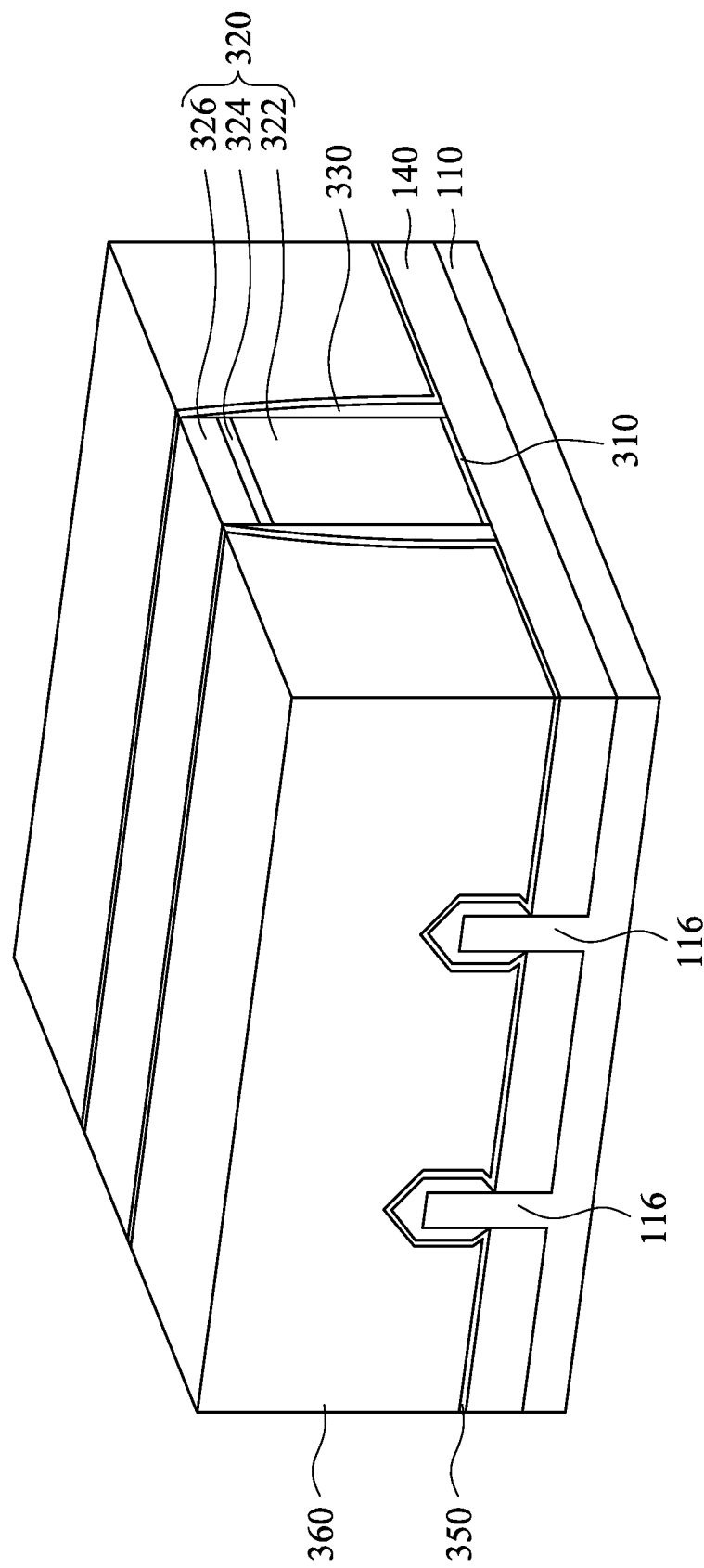

Reference is made to FIG. 10D. A contact etch stop layer (CESL) 350 is conformally formed over the structure of FIG. 10C. In some embodiments, the CESL 350 can be a stressed layer or layers. In some embodiments, the CESL 350 has a tensile stress and is formed of $Si_3N_4$. In some other embodiments, the CESL 350 includes materials such as oxynitride. In yet some other embodiments, the CESL 350 may have a composite structure including a plurality of layers, such as a silicon nitride layer overlying a silicon oxide layer. The CESL 350 can be formed using plasma enhanced CVD (PECVD), however, other suitable methods, such as low pressure CVD (LPCVD), atomic layer deposition (ALD), and the like, can also be used.

An interlayer dielectric (ILD) 360 is then formed on the CESL 350. The ILD 360 may be formed by chemical vapor deposition (CVD), high-density plasma CVD, spin-on, sputtering, or other suitable methods. In some embodiments, the ILD 360 includes silicon oxide. In some other embodiments, the ILD 360 may include silicon oxy-nitride, silicon nitride, or a low-k material. Then, a planarization process, such as a chemical mechanical planarization (CMP) process, is performed to planarize the ILD 360 and the CESL 350 to expose the dummy gate structure 320.

Figure 10E:
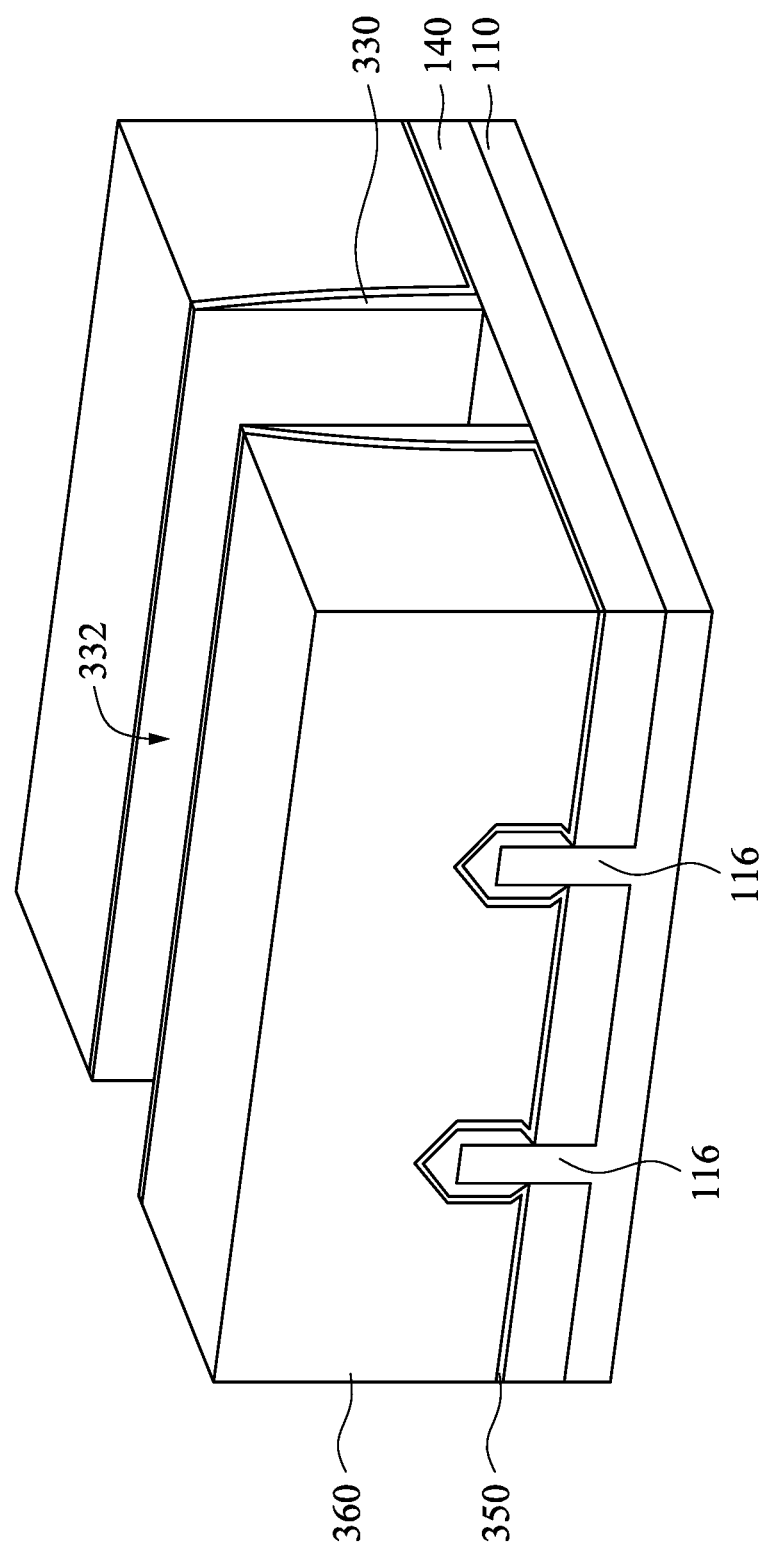

Reference is made to FIG. 10E. A replacement gate (RPG) process scheme is employed. In the RPG process scheme, a dummy polysilicon gate (the dummy gate structure 320 of FIG. 10A in this case) is formed in advance and is replaced later by a metal gate. In some embodiments, the dummy gate structure 320 is removed to form a gate trench 332 with the spacer structures 330 as its sidewalls. In some other embodiments, the dummy dielectric layer 310 (see FIG. 10B) is removed as well. The dummy gate structure 320 (and the dummy dielectric layer 310) may be removed by dry etch, wet etch, or a combination of dry and wet etch. For example, a wet etch process may include exposure to a hydroxide containing solution (e.g., ammonium hydroxide), deionized water, and/or other suitable etchant solutions.

Figure 10F:
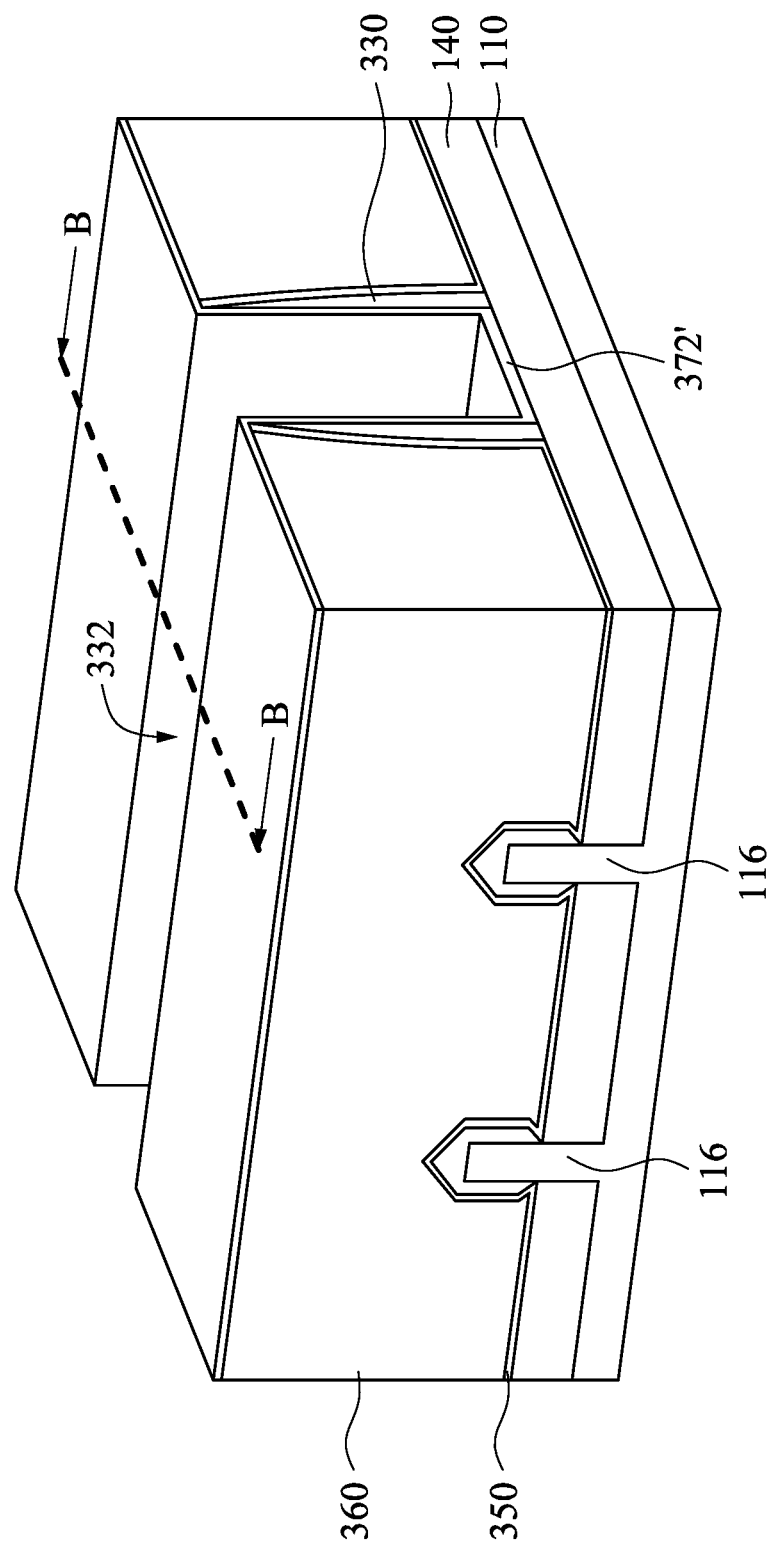

Reference is made to FIG. 10F. A gate dielectric layer 372 is formed in the gate trench 332. The gate dielectric layer 372 is formed by performing a bias-induced selectively ALD process, as described in greater detail below. FIGS. 11A-11F are cross-sectional views taking along line B-B of FIG. 10F at various stages in accordance with some embodiments of the present disclosure. In some embodiments, the gate dielectric layer 372 in FIG. 10F may be formed in the fabrication apparatus 200 of FIG. 3, and/or the gate dielectric layer 372 is formed by performing the method M1 in FIG. 2. In some embodiments, the timing diagram of FIG. 5 is also applied to the manufacturing processes in FIGS. 11A-11F. It is noted that the sizes of the precursors shown in FIGS. 11B-11D are illustrated only, and do not limit the scope of the embodiments.

Figure 11A:
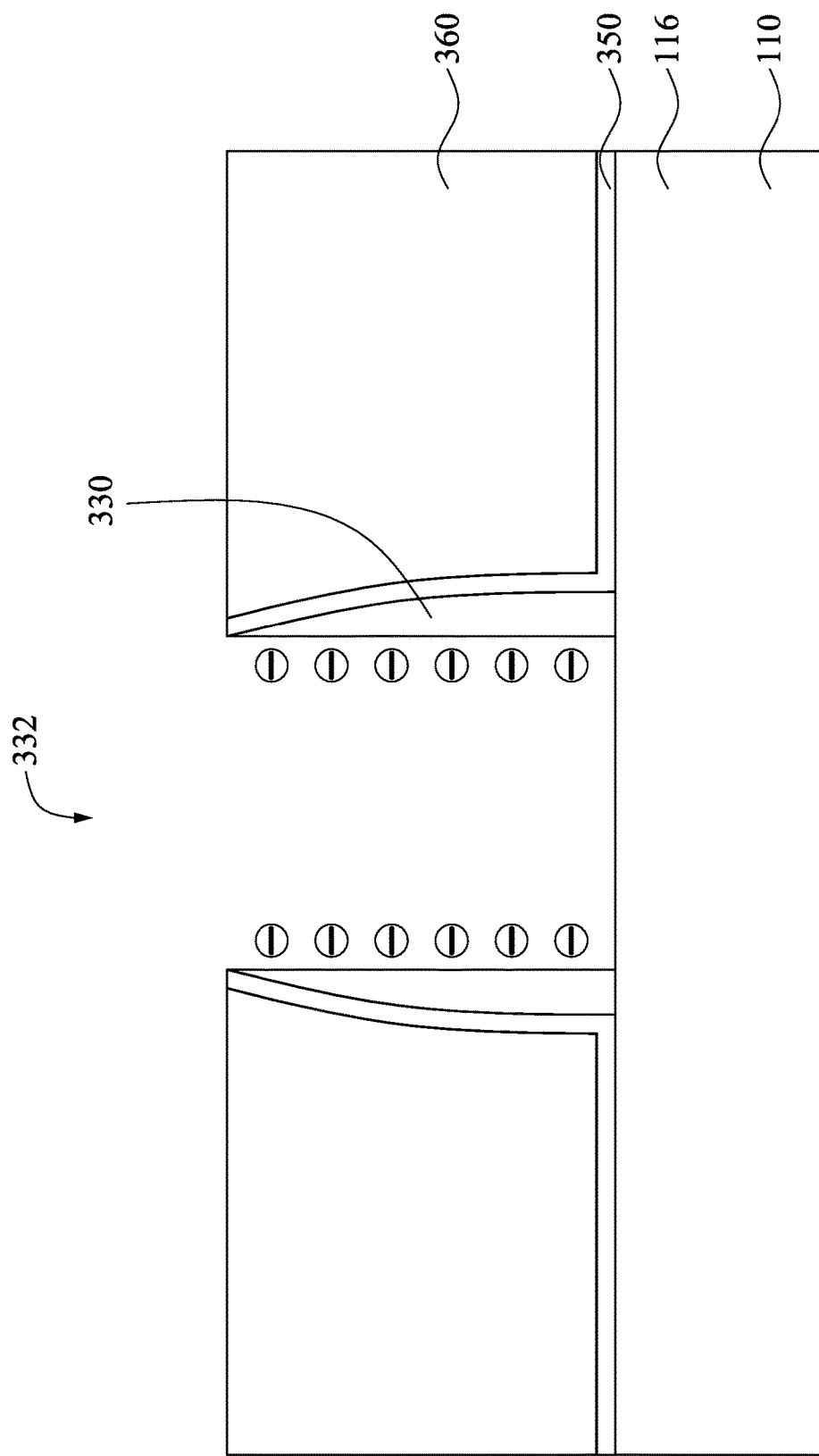
FIGS. 11A-11F are cross-sectional views taking along line B-B of FIG. 10F at various stages in accordance with some embodiments of the present disclosure.
Figure 11B:
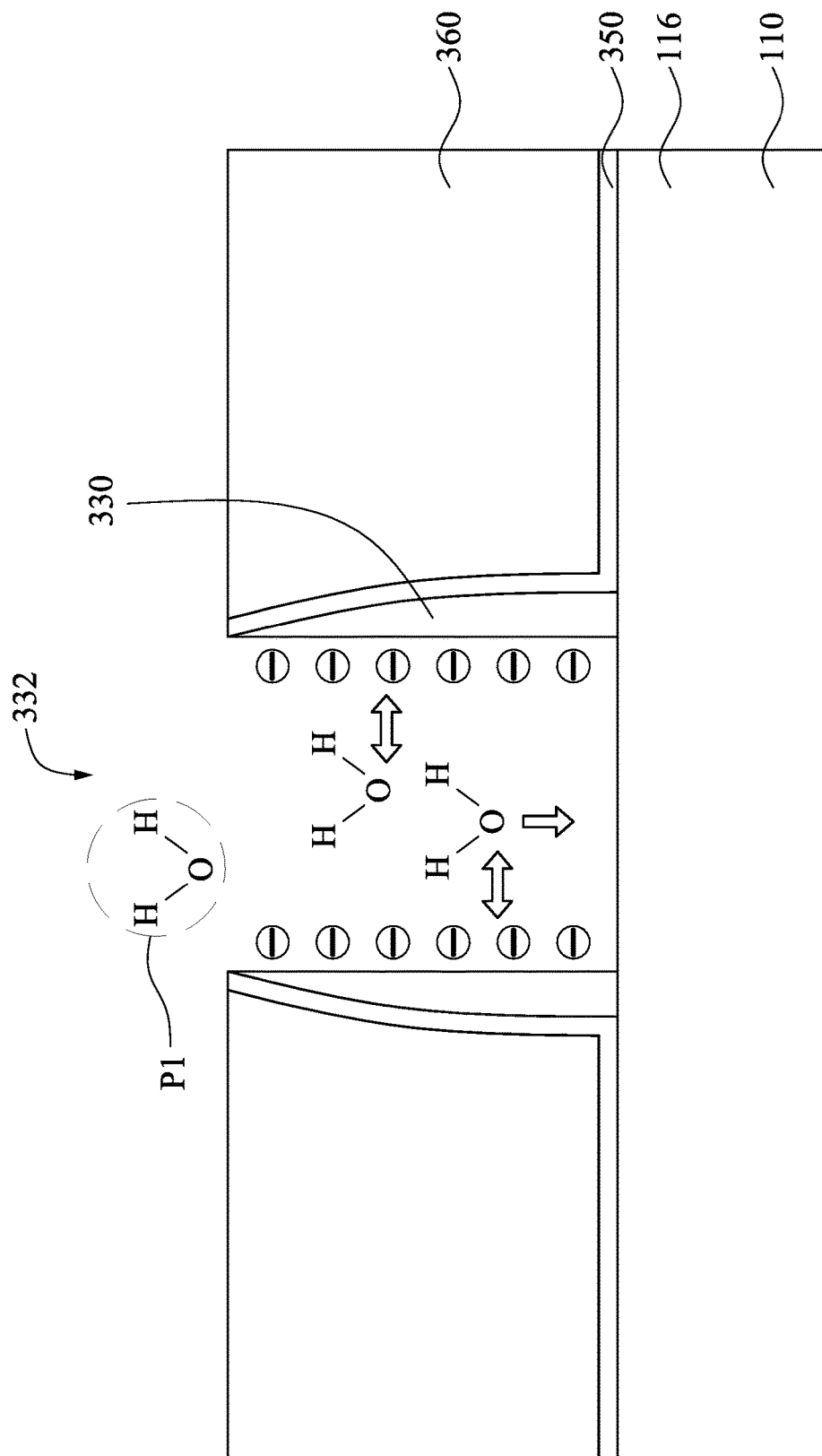
Figure 11C:
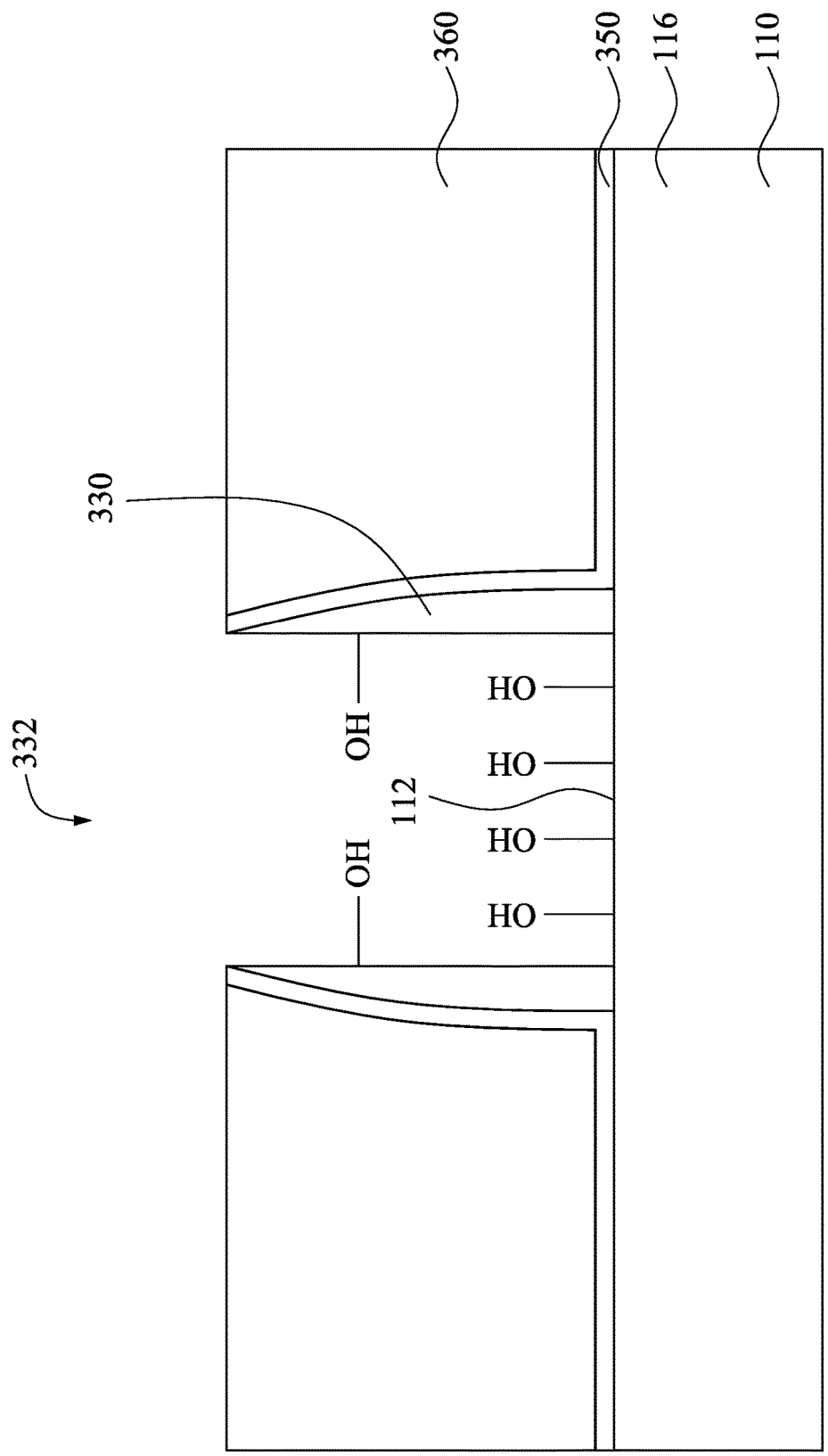
Figure 11D:
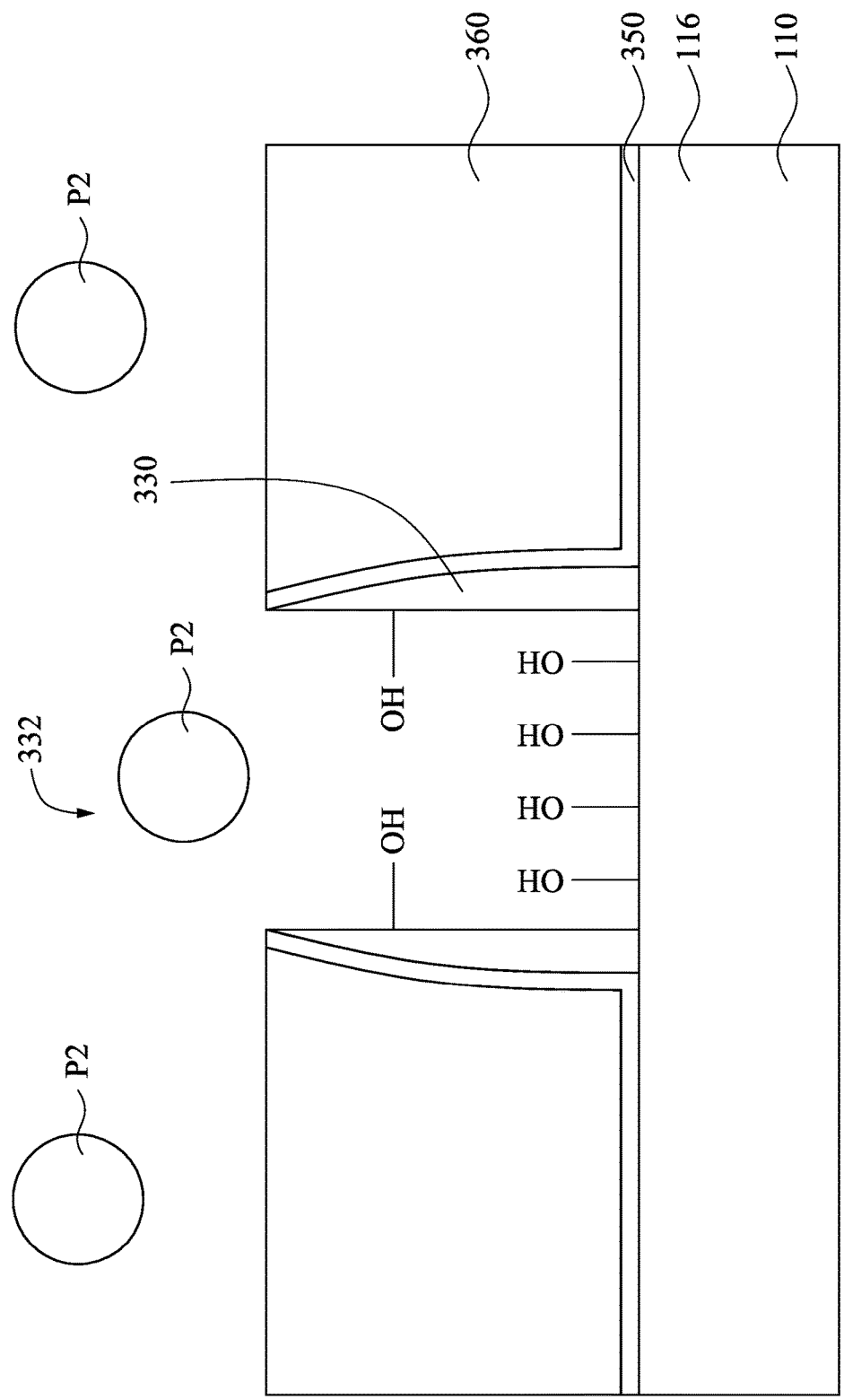

Reference is made to FIGS. 2, 3, and 11A. In operation S12 of the method M1, a wafer is positioned on a chuck in a fabrication apparatus. For example, the wafer (e.g., the structure in FIG. 10E) is positioned on a chuck 220 of the fabrication apparatus 200. In some embodiments, a vacuum is applied to the chamber 210 to remove oxygen and moisture and/or the temperature is raised to an acceptable level that is suitable for the ALD deposition.

In operation S14 of the method M1, a bias is applied to the chuck. For example, an RF bias is applied to the chuck 220 in the case of FIG. 11A. With the RF bias, since the spacer structure 330 (e.g., a dielectric layer) has an electrical conductivity lower than that of the substrate 110 (e.g., a semiconductor material), charges (i.e., electrons in this case) are less movable within the spacer structure 330 (and the ILD 360), such that more charges remain in the vicinity of the surface of the spacer structure 330 (and the ILD 360) as shown in FIG. 11A. Moreover, since the electrons are lighter than ions, the electrons are easier to accumulate in the vicinity of the surface of the spacer structure 330. In some embodiments, the bias may have a power greater than about 0 W and equal to or less than about 50 W, e.g., about 20 W. If the power is greater than about 50 W, the gases (e.g., the precursors/processing gases) in the chamber 210 may be ionized to form plasma, which may bombard the wafer to damage the structure formed thereon.

In some embodiments, the bias applied to the chuck 220 continues a first period T1 as shown in FIG. 5. The bias is applied before precursors are fed into the chamber 210. Once the RF bias is applied to the chuck 220, electrons move to the surfaces of the spacer structure 330 (and the ILD 360). Hence, the surfaces of the spacer structure 330 (and the ILD 360) are negative charged in this case.

In operation S16 of the method M1, first precursors are fed into the chamber of the fabrication apparatus. Reference is made to FIGS. 3 and 11B. For example, first precursors P1 (e.g., $H_2O$ in this case) are fed into the chamber 210 from the precursor delivery 240. As shown in FIG. 11B, the negative charges (electrons) in the vicinity of the surface of the spacer structures 330 repulse the $H_2O$ molecules due to their partial negative charges (oxygen). The $H_2O$ molecules may be mostly attracted by the substrate 110, and thus are deposited on the substrate 110 rather than on the spacer structures 330 and the ILD 360. As shown in FIG. 11C, the $H_2O$ are mostly absorbed on the surface 112 of the substrate 110. Stated differently, more $H_2O$ molecules are deposited on the substrate 110 than on the spacer structures 330 and the ILD 360. In some embodiments, there are still some $H_2O$ are absorbed on the surfaces of the dielectric materials (i.e., the spacer structure 330 in this case).

The first precursors P1 are fed into the chamber 210 for a second period T2 (see FIG. 5). In some embodiments, a third period T3 in FIG. 5 is long enough to charge the spacer structure 330, and a fourth period T4 in FIG. 5 is long enough to provide the reaction time of the first precursor deposition. Further, during the operations S14 and S16, the plasma source 230 is turned off, such that there is no or negligible plasma in the chamber 210 when the bias is applied to the chuck 220. In some other embodiments, the first precursors P1 is plasma, and the first precursors P1 are fed into the chamber 210 from the plasma source 230. During this process, the plasma is originated from the plasma source 230 and not in the chamber 210, such that a bias with a low power can be applied to the chuck 220 to perform the selective ALD process.

In operation S18 of the method M1, the bias is turned off, and in operation S20 of the method M1, the excess first precursors P1 are purged out of the chamber. Specifically, the first precursors P1 are mostly absorbed to the surface 112 of the substrate 110 during the periods T2 and T4 (see FIG. 5), and some of the first precursors P1 are absorbed to the surface of the spacer structures 330. After the fourth period T4, the bias is turned off, such that the electrons in the vicinity of the surface of the spacer structure 330 are gradually disappeared. Then, purging gases enter the chamber 210 to purge the excess first precursors P1 out of the chamber 210.

Figure 11E:
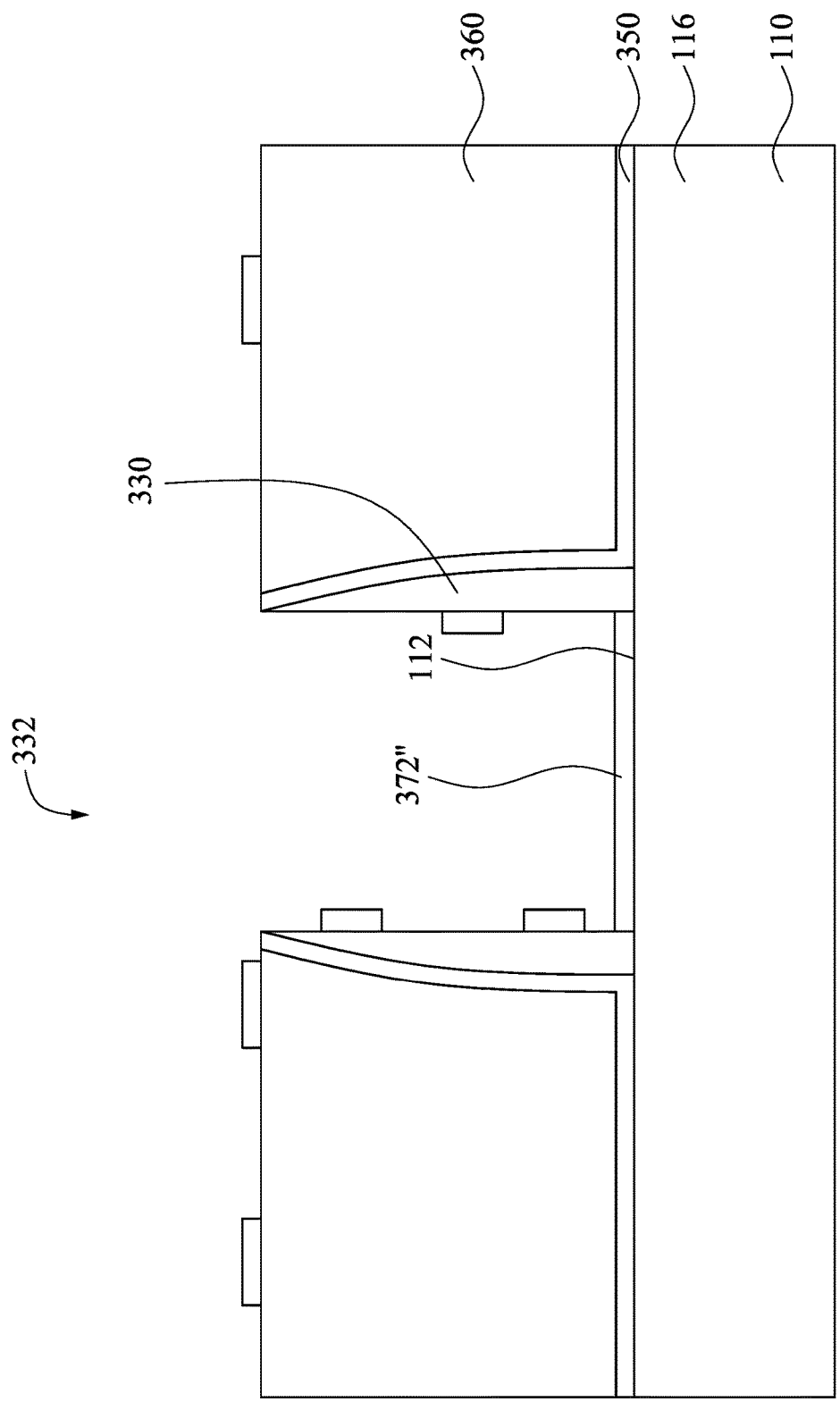

In operation S22 of the method M1, second precursors are fed into the chamber of the fabrication apparatus. Reference is made to FIGS. 3 and 11D. For example, second precursors P2 (e.g., high-k precursor in this case) are fed into the chamber 210 from the precursor delivery 240. As shown in FIG. 11D, the second precursors P2 are attracted by the first precursors absorbed on the substrate 110 (—OH in this case). The second precursors P2 may be attracted by —OH and thus are mostly deposited on the substrate 110 rather than on the spacer structure 330. As shown in FIG. 11E, the second precursors P2 are mostly absorbed on the surface 112 of the substrate 110 and form a dielectric film 372" thereon. As shown in FIG. 11E, the dielectric film 372" has a first growth rate (i.e., deposition rate) on the substrate 110 greater than a second growth rate on the spacer structure 330 and greater than a third growth rate on the ILD 360.

In some embodiments, the dielectric film 372" may be a high-k dielectric layer, such as $Al_2O_3$, $ZrO_2$, $HfO_2$, $TiO_2$, or other suitable materials. When the monolayer is made of $Al_2O_3$, the second precursors P2 may be Trimethylaluminum(TMA), Triethylaluminium(TEA), Tetrakis(dimethylamido) aluminum (TDMAA), or other suitable materials. When the monolayer is made of $ZrO_2$, the fourth precursors P4 may be Tetrakis(dimethylamido)zirconium (TDMAZ), $ZrCl_4$, or other suitable materials. When the monolayer is made of $HfO_2$, the second precursors P2 may be Tetrakis (dimethylamido)hafnium (TDMAH), $HfCl_4$, or other suitable materials. When the monolayer is made of $TiO_2$, the second precursors P2 may be Tetrakis(dimethylamido)titanium (TDMAT), $TiCl_4$, or other suitable materials.

In FIG. 5, the purging of the second precursors P2 maintains for a fifth period T5. In some embodiments, a sixth period T6 of FIG. 5 is for neutralizing the surface of the spacer structure 330. In some embodiments, a seventh period T7 of FIG. 5 provides the reaction time of the second precursor deposition.

In operation S24 of the method M1, the excess second precursors are purged out of the chamber. After the operation S24, the dielectric film 372" is mostly formed on the surface 112 of the substrate 110 as shown in FIG. 11E, and this dielectric film 372" may expose portions of the surfaces of the spacer structure 330 (and the ILD 360). That is, the selective ALD deposition process results in no or negligible dielectric film 372" deposited on the spacer structure 330 and/or the ILD 360. For example, the dielectric film 372" unintentionally deposited on the spacer structures 330 and/or the ILD 360 may have a thinner thickness than that deposited on the substrate 110. Then, the method M1 goes to the operation S14 to repeat the operations S14-S24 and form another dielectric film on the dielectric film 372". The cycle of the operations S14-S24 may be repeated many times to form the dielectric layer 372' in the gate trench 332, as shown in FIGS. 11F and 10F.

Figure 11F:
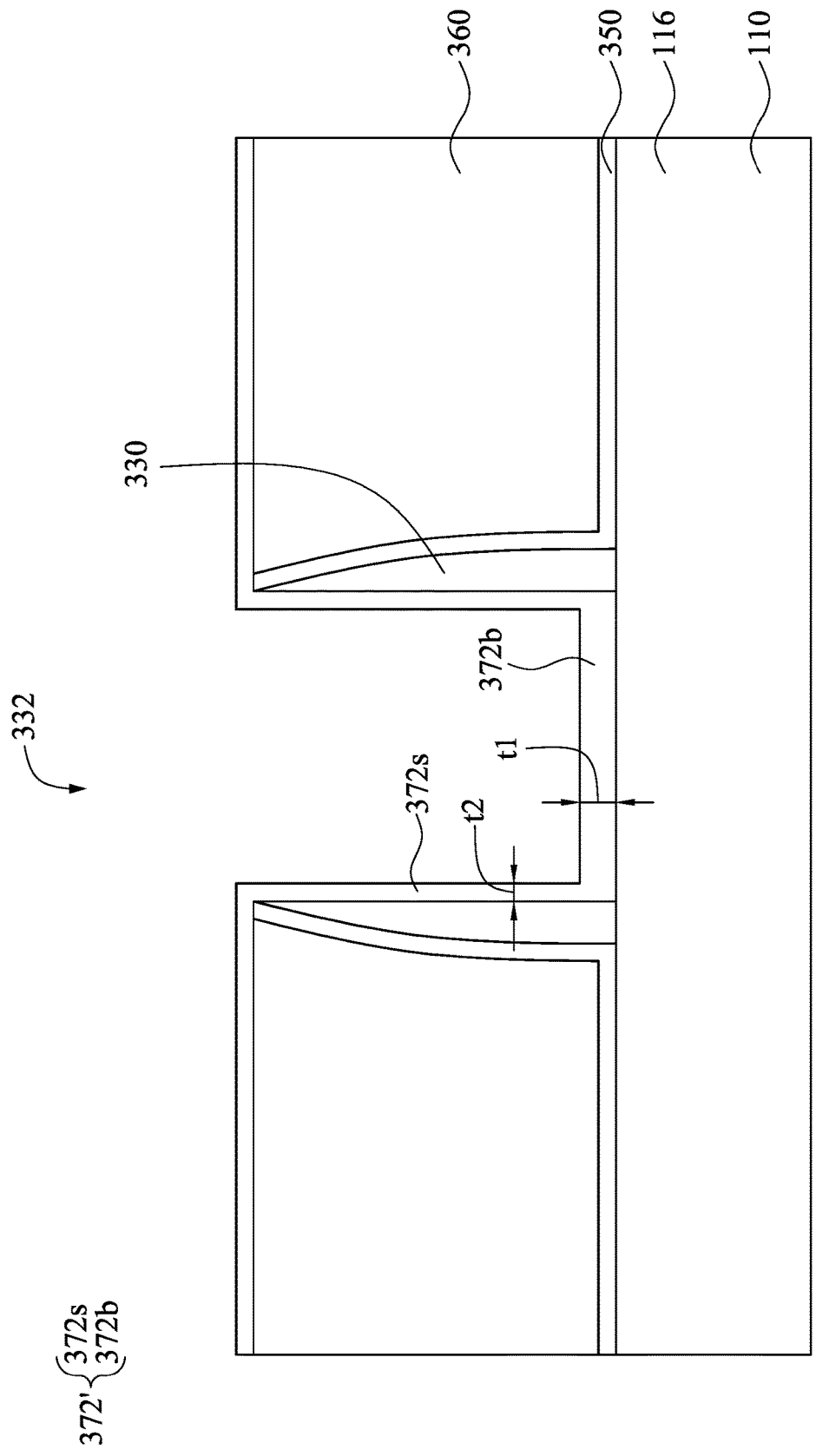

In FIG. 11F, the dielectric layer 372' has a bottom portion 372b and sidewall portions 372s. The bottom portion 372b is in contact with the substrate 110, and the sidewall portions 372s are in contact with the spacer structures 330. The bottom portion 372b has a thickness t1 greater than a thickness t2 of the sidewall portion 372s due to the bias-induced selective ALD process. With such configuration, the bottom portion 372b is thick enough to isolate the semiconductor fin 116 and the following formed gate electrode, while the sidewall portions 372s are thin enough to provide large window to deposit the gate metal materials. In operation S26 of the method M1, the wafer is taken out of the chamber to process the next manufacturing process.

Figure 10G:
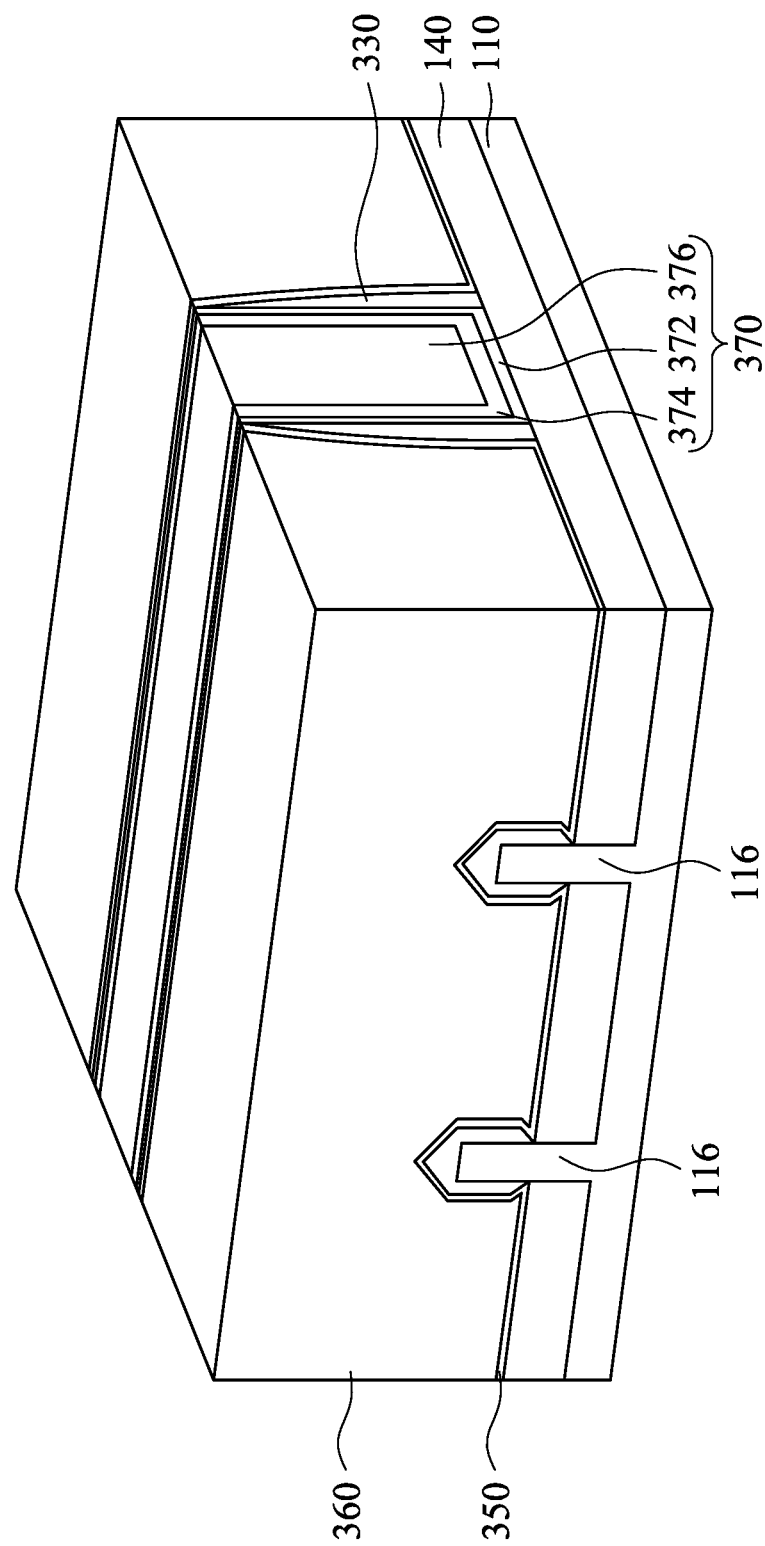

Reference is made to FIG. 10G. At least one metal layer is formed in the gate trench 332 and on the gate dielectric layer 372. Subsequently, a chemical mechanical planarization (CMP) process is performed to planarize the metal layer and the dielectric layer 372' (see FIG. 10F) to form a metal gate structure 370 in the gate trench 332. The metal gate structure 370 crosses over the semiconductor fins 116. The metal gate structure 370 includes a gate dielectric layer 372 and a metal gate electrode over the gate dielectric layer 372. The metal gate electrode may include one or more metal layers 374, e.g., work function metal layer(s) and capping layer(s), a fill metal 376, and/or other suitable layers. The work function metal layer may include n-type and/or p-type work function metal. Exemplary n-type work function metals include Ti, Ag, TaAl, TaAlC, TiAlN, TaC, TaCN, TaSiN, Mn, Zr, other suitable n-type work function materials, or combinations thereof. Exemplary p-type work function metals include TiN, TaN, Ru, Mo, Al, WN, $ZrSi_2$, $MoSi_2$, $TaSi_2$, $NiSi_2$, WN, other suitable p-type work function materials, or combinations thereof. The work function metal layer may have multiple layers. The work function metal layer(s) may be deposited by CVD, PVD, electroplating and/or other suitable process. In some embodiments, the metal gate electrode is a p-type metal gate including a p-type work function metal layer. In some embodiments, the capping layer in the metal gate electrodes may include refractory metals and their nitrides (e.g. TiN, TaN, $W_2N$, TiSiN, TaSiN). The capping layer may be deposited by PVD, CVD, metal-organic chemical vapor deposition (MOCVD) ALD, or the like. In some embodiments, the fill metal 376 that fills a remainder of the gate trench 332 may include tungsten (W). The fill metal 376 may be deposited by ALD, PVD, CVD, or other suitable process.

Figure 10H:
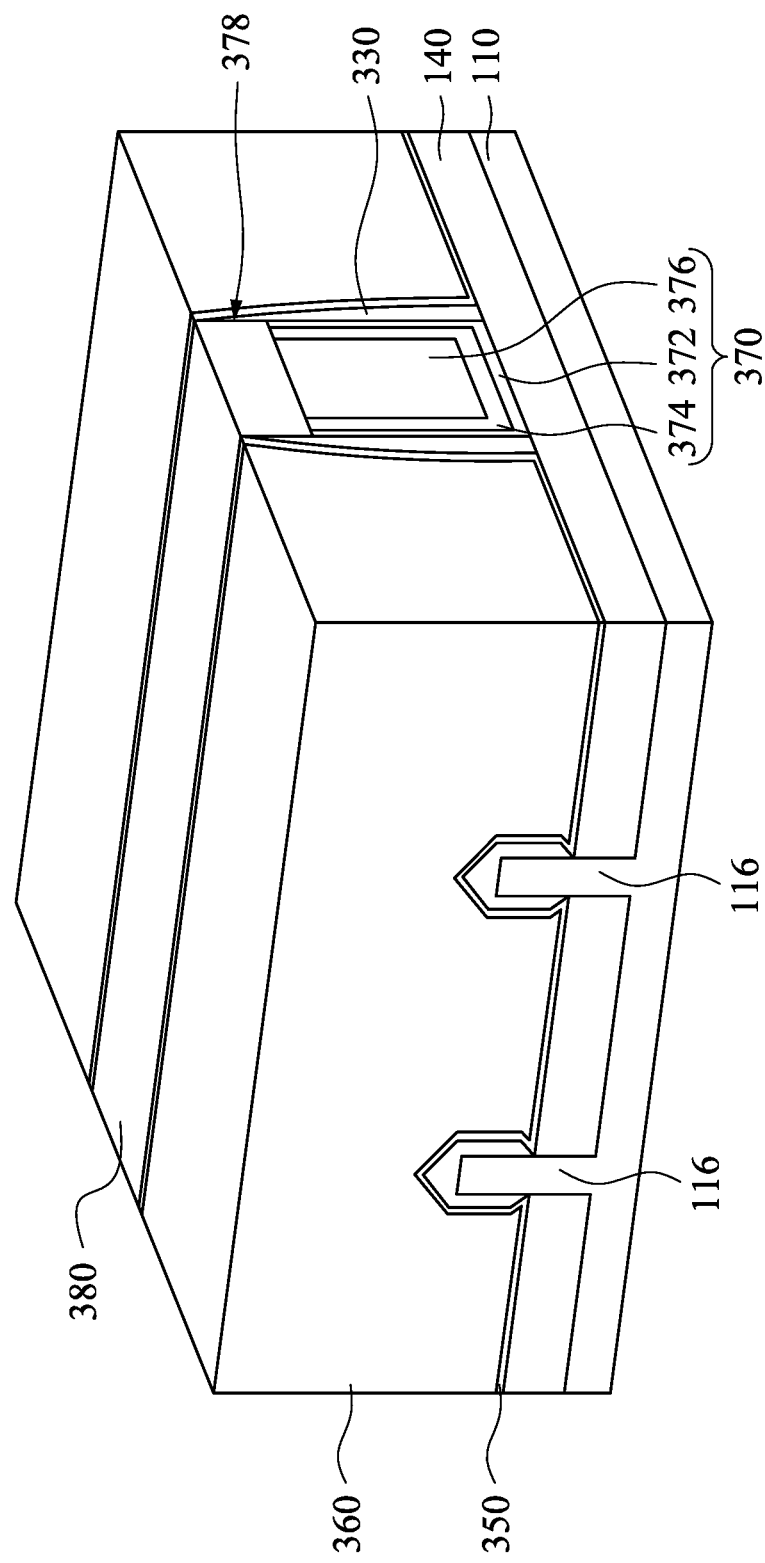

Reference is made to FIG. 10H. In some embodiments, the metal gate structure 370 is etched back to a predetermined level and form another gate trench 378 thereon. Then, a capping layer 380 is formed over the etched metal gate structure 370 using, for example, a deposition process to deposit a dielectric material over the substrate 110, followed by a CMP process to remove excess dielectric material outside the gate trenches. In some embodiments, the capping layer 380 includes silicon nitride or other suitable dielectric material. In some embodiments, the capping layer 380 is formed by performing a bias-induced selective ALD process as mentioned above and using the fabrication apparatus 200 of FIG. 3. Since the formation of the capping layer 380 may be the same or similar to the formation of the isolation materials 140' in FIG. 1C, the detailed description is not repeated in this respect. The capping layer 380 can be used to define self-aligned contact region and thus referred to as SAC structures or a SAC layer.

Figure 10I:
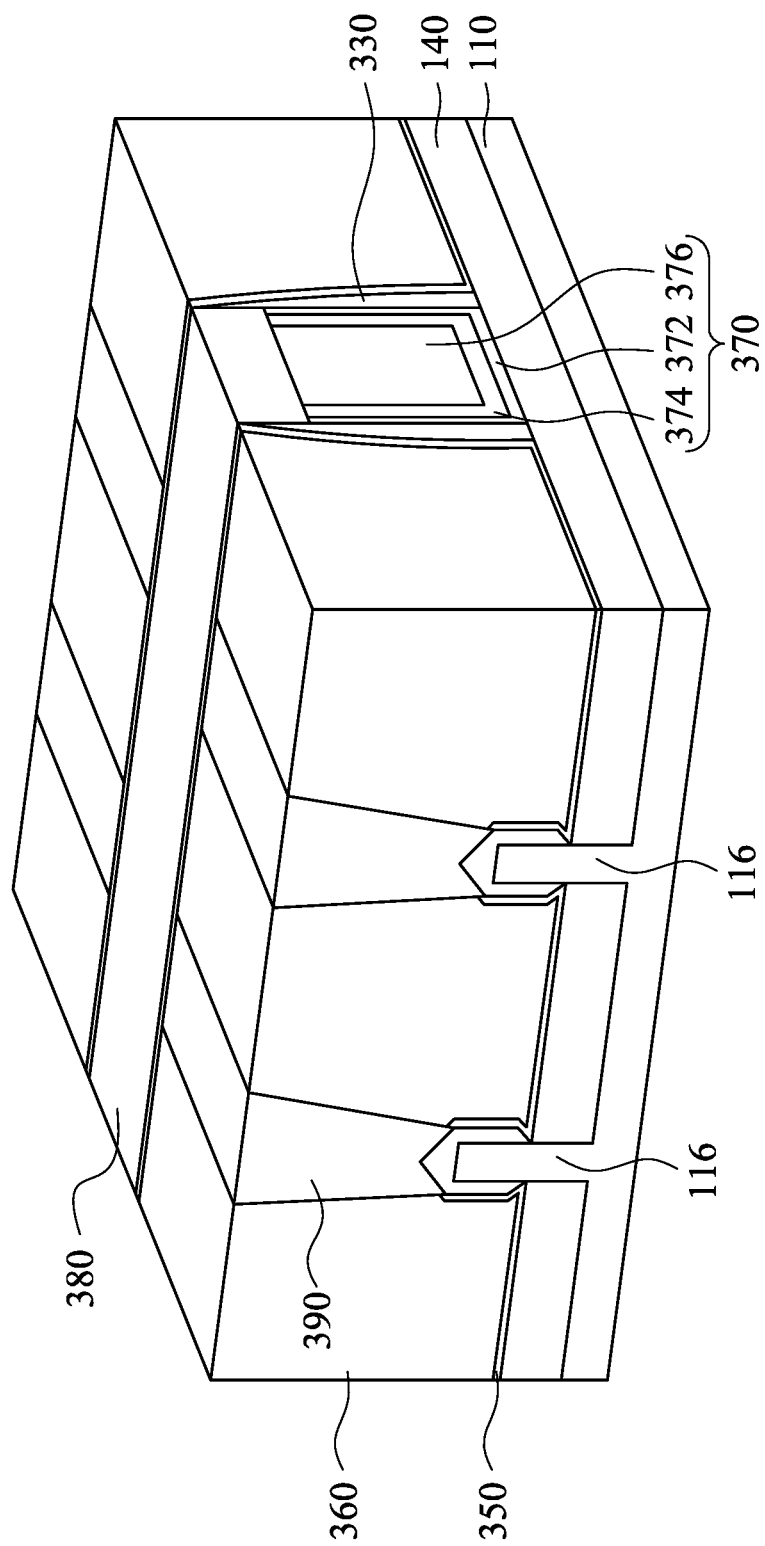

Reference is made to FIG. 10I. A plurality of source/drain contacts 390 are formed over the epitaxial structures 340. For example, a plurality of the source/drain openings are formed through the ILD 360 and the CESL 350 to expose the source/drain epitaxy structures 340, and conductive materials are filled in the openings and over the source/drain epitaxy structures 340. The excess portions of the conductive materials are removed to form the source/drain contacts 390. The source/drain contacts 390 may be made of tungsten, aluminum, copper, or other suitable materials.

In FIGS. 10F and 11F, the dielectric layer 372' is formed by performing the bias-induced selective ALD process. By providing a bias on the chuck 220, the charges have different distributions in different materials. The charges may attract or repulse the precursors to increase or decrease the corresponding deposition rate. With such configuration, the bottom portion 372b of the dielectric layer 372' is thick enough to isolate the semiconductor fin 116 and the following formed gate electrode, while the sidewall portions 372s of the dielectric layer 372' are thin enough to provide large window to deposit the gate electrode. Furthermore, a self-aligned monolayers (SAMs), which may formed using an additional deposition process and cause defect issues, can be omitted to simplify the manufacturing process.

Further, in FIG. 10H, the capping layer 380 can be formed by performing the bias-induced selective ALD process. By providing a bias on the chuck 220, the charges have different distributions in different materials. The charges may attract or repulse the precursors to increase or decrease the corresponding deposition rate. In some other embodiments, the planarization process (e.g., CMP) performed after depositing the capping layer 380 can be omitted when there is a high deposition selectivity between the dielectric layer (i.e., the spacer structure 330 and ILD 360) and the conductive layer (i.e., the metal gate structure 370). Furthermore, a self-aligned monolayers (SAMs), which may formed using an additional deposition process and cause defect issues, can be omitted to simplify the manufacturing process.

The dielectric layer 372' in FIG. 10F may be formed using other bias and/or precursors. FIGS. 12A-12F are cross-sectional views taking along line B-B of FIG. 10F at various stages in accordance with some embodiments of the present disclosure. Throughout the various views and illustrative embodiments, like reference numbers are used to designate like elements. The present embodiment may repeat reference numerals and/or letters used in FIGS. 11A-11F. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 12A-12F. In some embodiments, the dielectric layer 372' in FIGS. 12A-12F is performed in the fabrication apparatus 200 of FIG. 3 and/or using the method M1 in FIG. 2. In some embodiments, the timing diagram of FIG. 5 is also applied to the manufacturing processes in FIGS. 12A-12F. It is noted that the sizes of the precursors shown in FIGS. 12A-12D are illustrated only, and do not limit the scope of the embodiments.

Figure 12A:
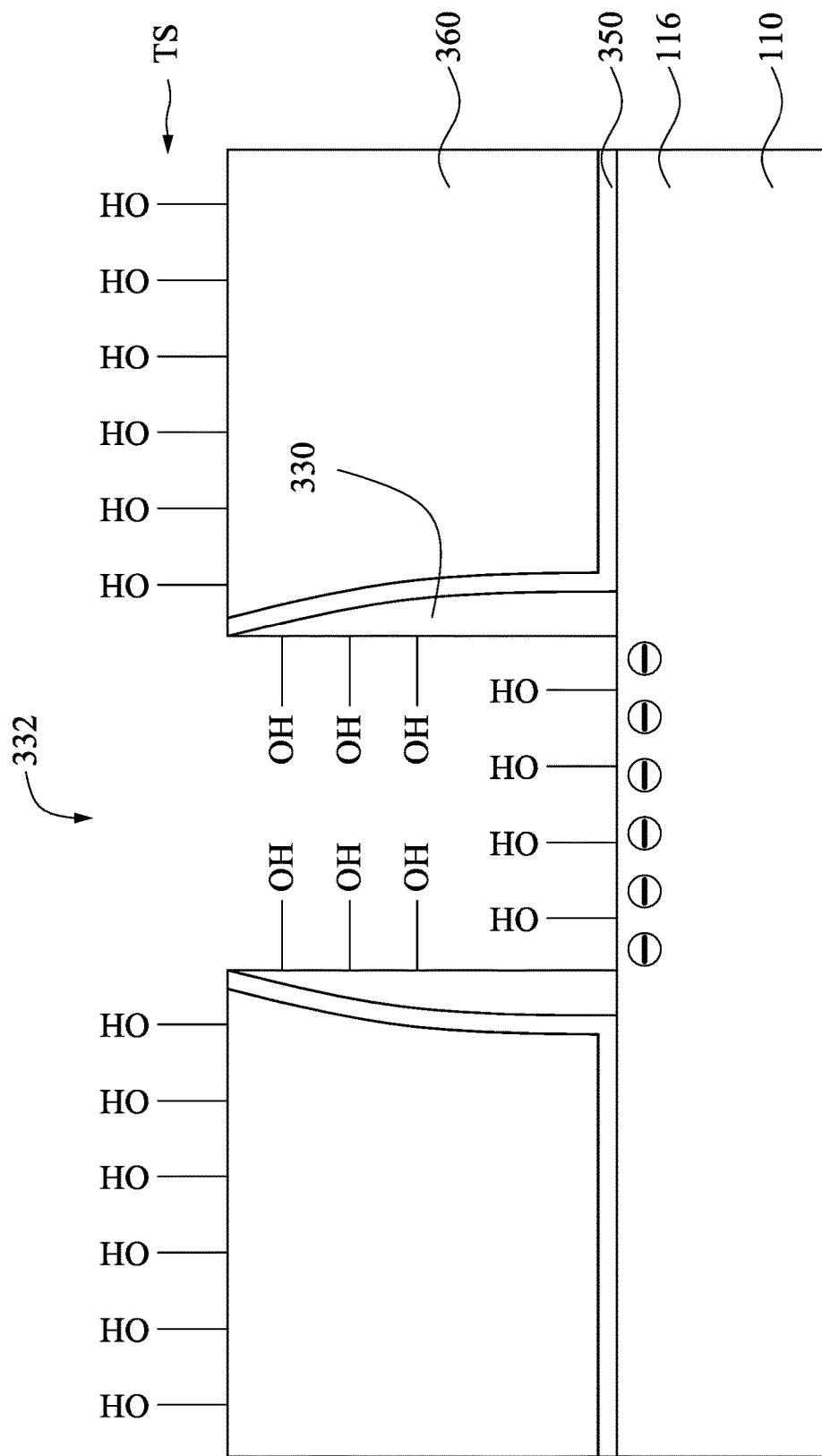
FIGS. 12A-12F are cross-sectional views taking along line B-B of FIG. 10F at various stages in accordance with some embodiments of the present disclosure.

Reference is made to FIGS. 2, 3, and 12A. In operation S12 of the method M1, a wafer is positioned on a chuck of a fabrication apparatus. In some embodiments, the surfaces of the structure (i.e., the substrate 110, the spacer structure 330, and the ILD 360) may be terminated with terminating species TS. In some embodiments, the surfaces of the substrate 110, the spacer structure 330, and the ILD 360 initially carries the terminating species TS. In some other embodiments, the surfaces of the substrate 110, the spacer structure 330, and the ILD 360 are initially neutral, and a surface treatment (e.g., the cleaning and/or stripping process mentioned above) can be performed on the surfaces to change or modify the surface termination. In still some other embodiments, $H_2O$ are fed into the chamber 210 to form the terminating species TS on the surfaces.

In operation S14 of the method M1, a bias is applied to the chuck. The bias is a negative DC bias in the case of FIG. 12A. With the negative DC bias, since the substrate 110 (e.g., a semiconductor material) has an electrical conductivity higher than that of the spacer structure 330 and the ILD 360 (e.g., a dielectric layer), charges (i.e., electrons in this case) are accumulated within the substrate 110, such that more charges remain in the vicinity of the surface of the substrate 110 as shown in FIG. 12A. The bias source 270 in FIG. 3 is configured to apply the negative DC bias to the chuck 220, and the bias may have a power greater than about 0 W and equal to or less than about 50 W, e.g., about 20 W.

In some embodiments, the bias applied to the chuck 220 continues a first period T1 as shown in FIG. 5. The bias is applied before precursors are fed into the chamber 210. Once the negative DC bias is applied to the chuck 220, electrons move to the surface 112 of the substrate 110. Hence, the surface of the substrate 110 is negative charged in this case.

Figure 12B:
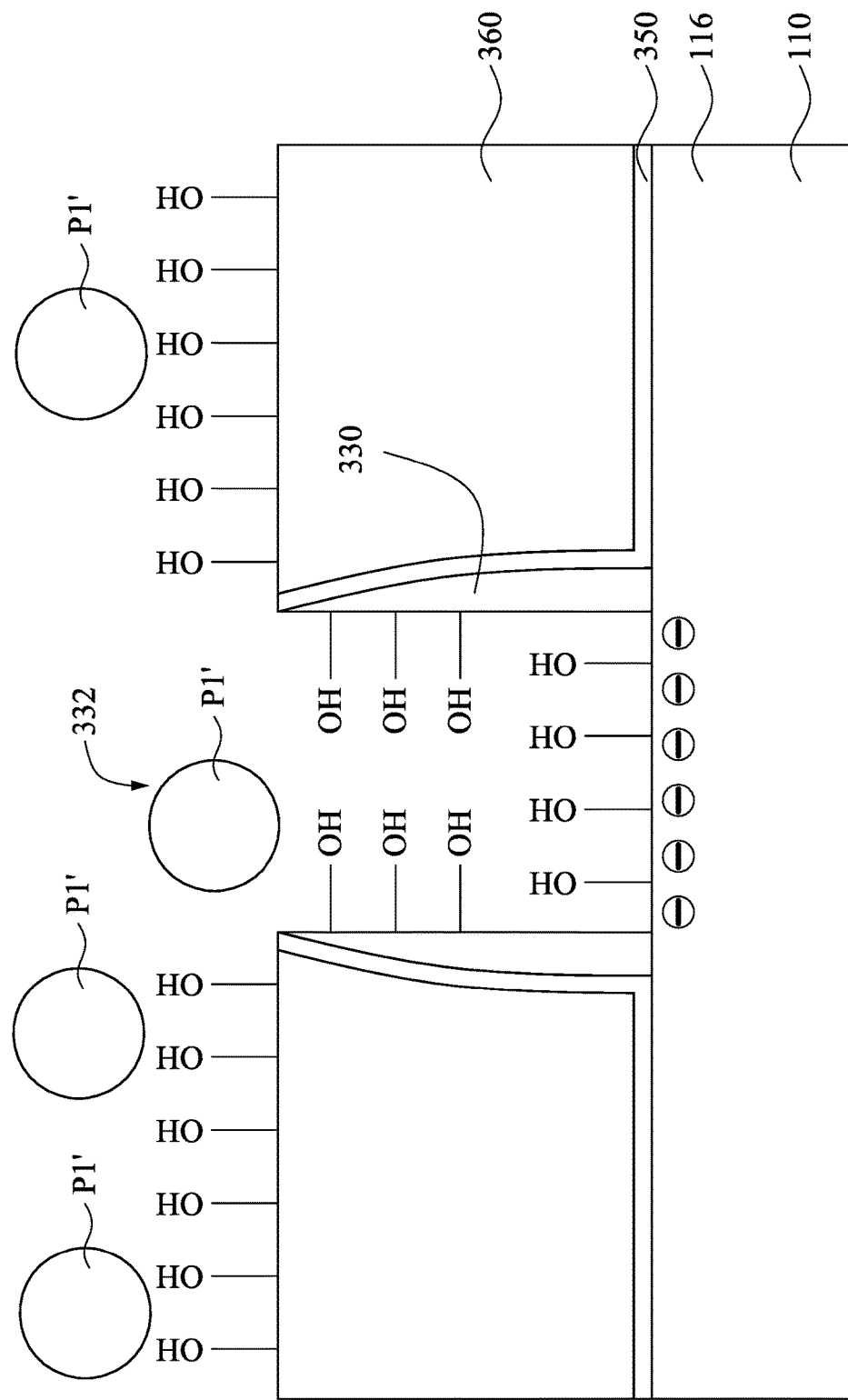
Figure 12C:
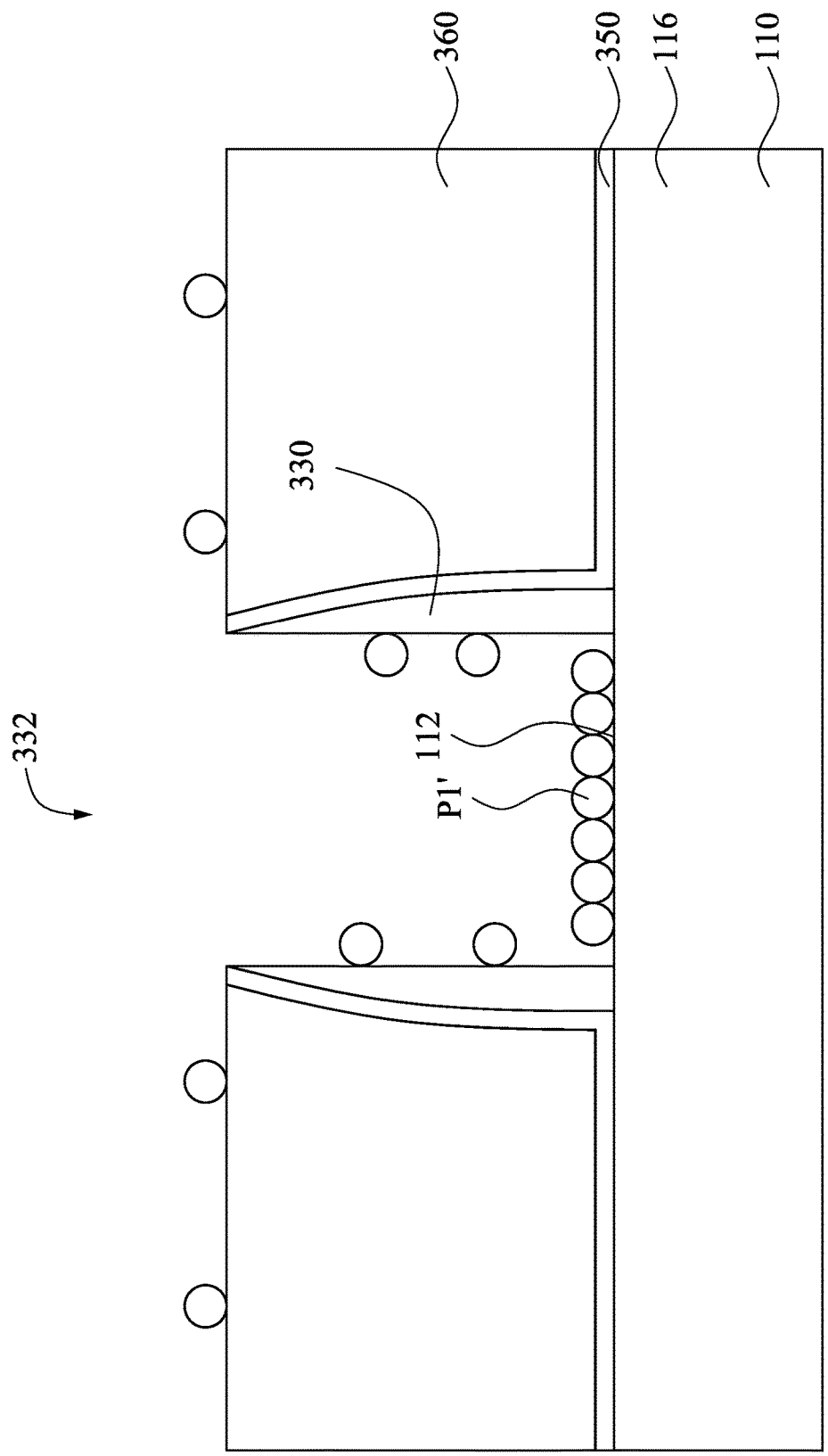

In operation S16 of the method M1, first precursors are fed into the chamber of the fabrication apparatus. Reference is made to FIGS. 3 and 12B. For example, first precursors P1' (e.g., high-k precursors in this case) are fed into the chamber 210 from the precursor delivery 240. In some embodiments, by controlling the temperature of the chamber 210 and/or feeding reaction gases into the chamber 210, a chemical reaction occurs such that a substituent is removed from the first precursor P1', and thus the first precursors P1' become partially positive. The first precursors P1' with partial positive charges are mostly attracted by the substrate 110, and thus are mostly deposited on the substrate 110 rather than on the mask layer 120. As shown in FIG. 12C, the first precursors P1' are mostly absorbed on the surface 112 of the substrate 110. In some embodiments, there are still some first precursors P1' are absorbed on the surfaces of the dielectric materials (i.e., the spacer structure 330 and/or ILD 360 in this case).

The first precursors P1' are fed into the chamber 210 for a second period T2 (see FIG. 5). In some embodiments, a third period T3 in FIG. 5 is long enough to charge the mask layer 120, and a fourth period T4 in FIG. 5 is long enough to provide the reaction time of the first precursor deposition. Further, during the operations S14 and S16, the plasma source 230 is turned off, such that there is no or negligible plasma in the chamber 210 when the bias is applied to the chuck 220. In some other embodiments, the first precursors P1' is plasma, and the first precursors P1' are fed into the chamber 210 from the plasma source 230. During this process, the plasma is originated from the plasma source 230 and not in the chamber 210, such that a bias with a low power can be applied to the chuck 220 to perform the selective ALD process.

Figure 12D:
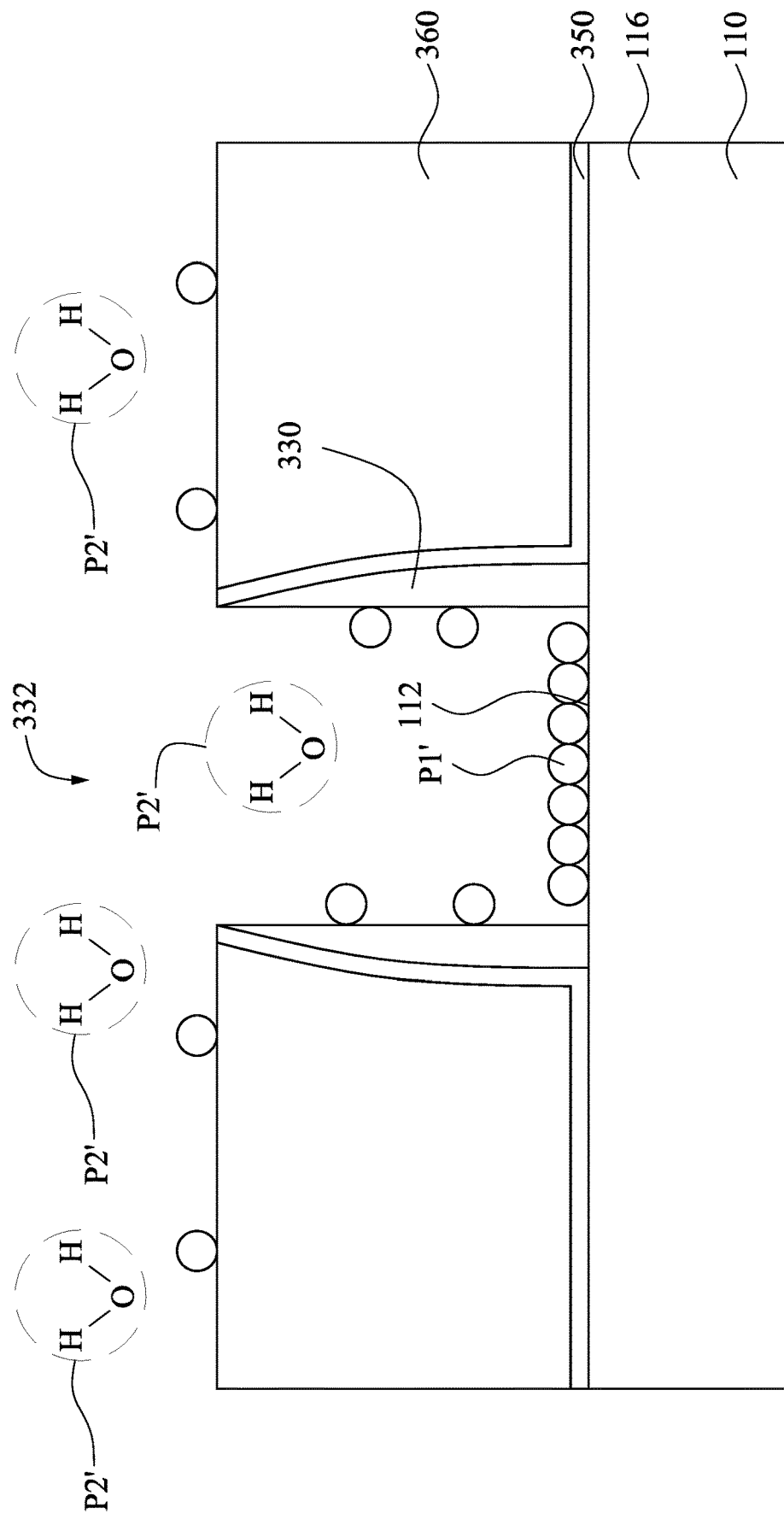
Figure 12E:
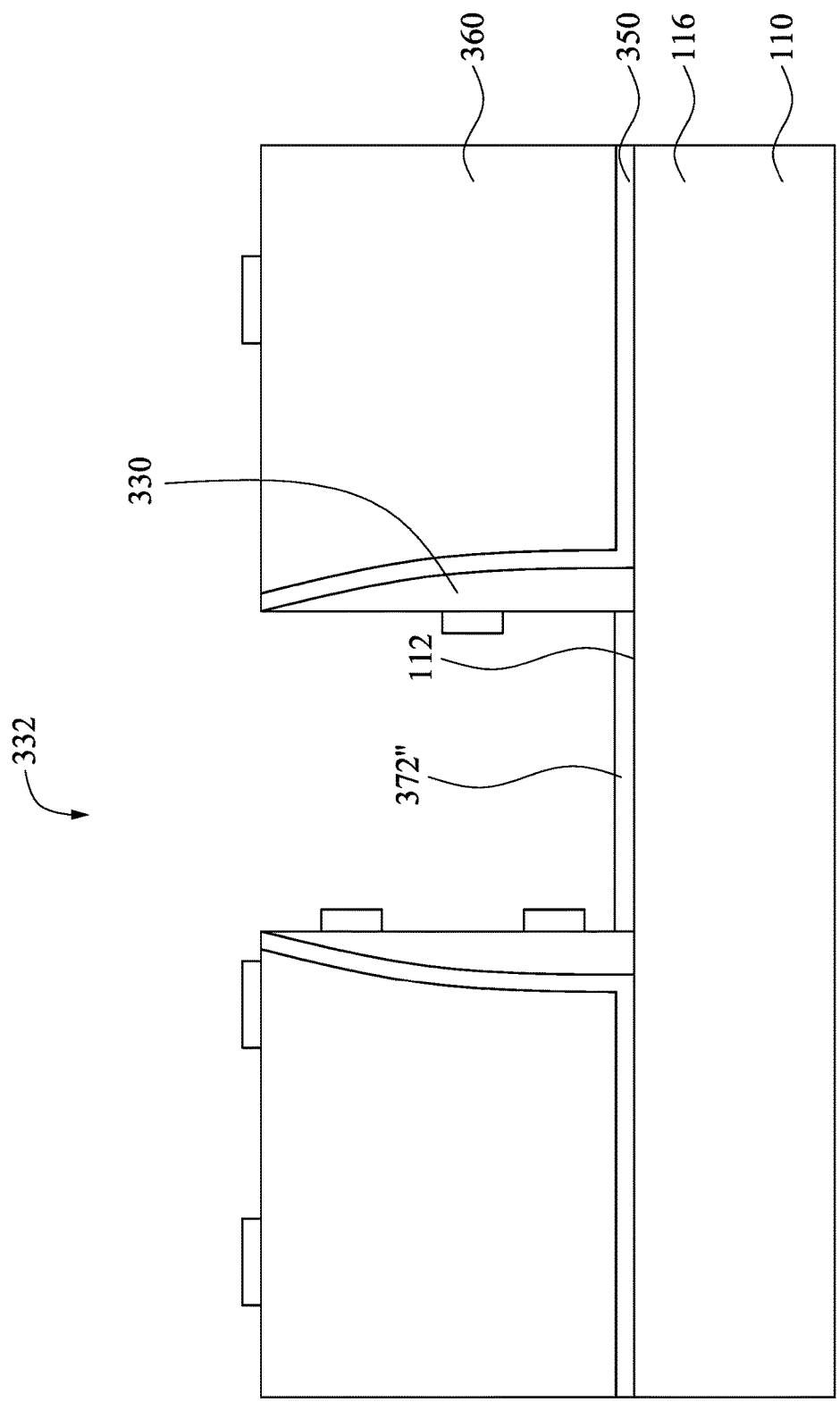

In operation S18 of the method M1, the bias is turned off, and in operation S20 of the method M1, the excess first precursors are purged out of the chamber. In operation S22 of the method M1, second precursors are fed into the chamber of the fabrication apparatus. Reference is made to FIGS. 3 and 12D. For example, second precursors P2' (e.g., oxidizers such as $H_2O$ vapor, $O_3$, or $O_2$ plasma in this case) are fed into the chamber 210 from the precursor delivery 240 or the plasma source 230 (for the $O_2$ plasma oxidizers). As shown in FIG. 12D, the second precursors P2' are attracted by the first precursors absorbed on the substrate 110. The second precursors P2' are likely to be attracted by the first precursors, and thus more second precursors P2' are deposited on the surface 112 of the substrate 110 and less second precursors P2' are deposited on the surfaces of the spacer structures 330 (and/or the ILD 360). As shown in FIG. 12E, a dielectric film 372" is formed on the surfaces of the substrate 110, the spacer structure 330, and/or the ILD 360.

In FIG. 5, the purging of the second precursors P2' maintains for a fifth period T5. In some embodiments, a sixth period T6 of FIG. 5 is for neutralizing the surface of the substrate 110. In some embodiments, a seventh period T7 of FIG. 5 provides the reaction time of the second precursor deposition.

Figure 12F:
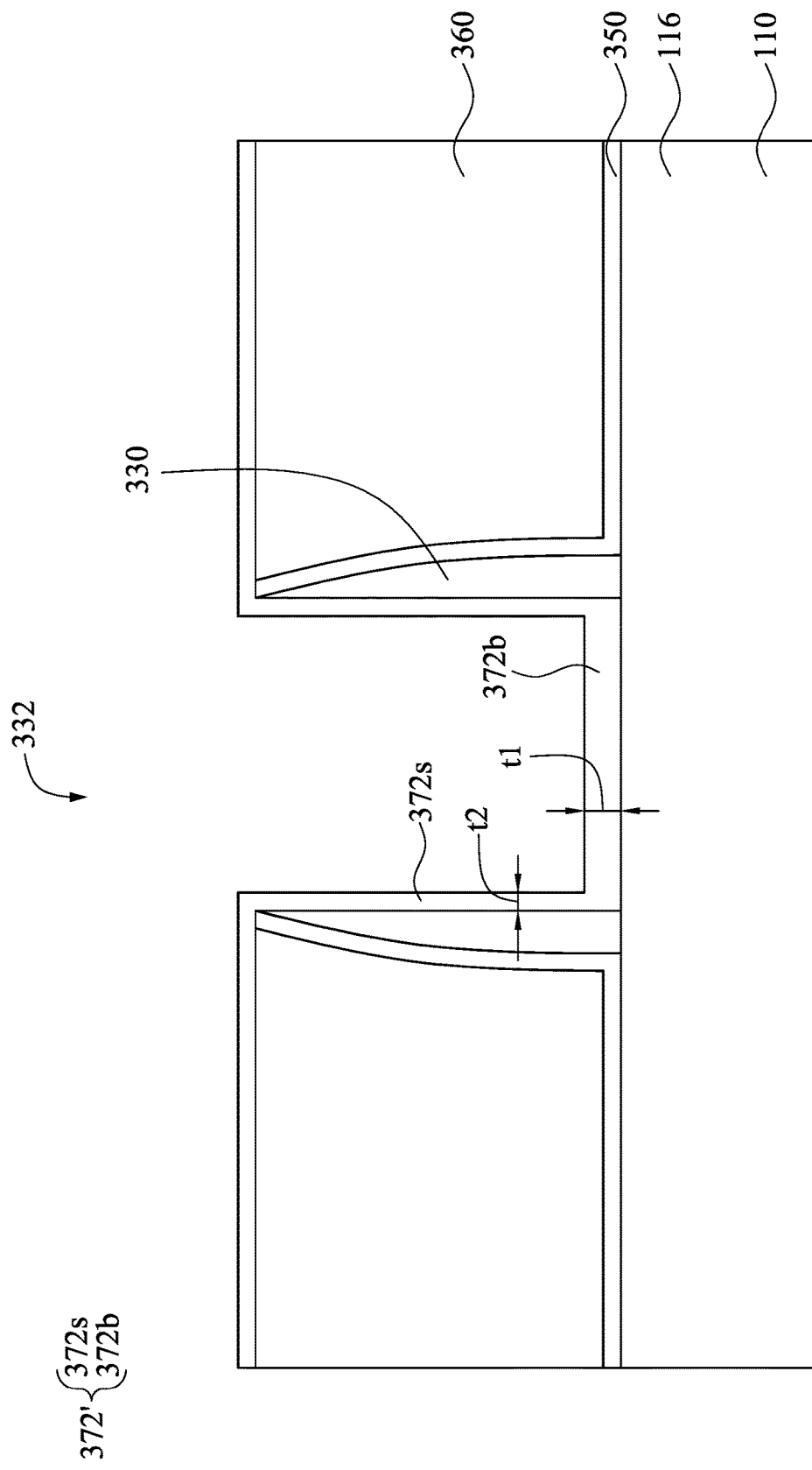

In operation S24 of the method M1, the excess second precursors are purged out of the chamber. After the operation S24, a dielectric film 372" is mostly formed on the surface of the substrate 110 as shown in FIG. 12E, and this dielectric film 372" may expose portions of the surfaces of the spacer structure 330 (and/or the ILD 360). That is, the selective ALD process results in no or negligible dielectric film 372" deposited on the spacer structure 330 and/or the ILD 360. Then, the method M1 goes to the operation S14 to repeat the operations S14-S24 and form another dielectric film on the dielectric film 372". The cycle of the operations S14-S24 may be repeated many times to form the dielectric layer 372' in the gate trench, as shown in FIGS. 12F and 10F. In operation S26 of the method M1, the wafer is taken out of the chamber to process the next manufacturing process.

FIGS. 13A-13F are cross-sectional views taking along line B-B of FIG. 10F at various stages in accordance with some embodiments of the present disclosure. Throughout the various views and illustrative embodiments, like reference numbers are used to designate like elements. The present embodiment may repeat reference numerals and/or letters used in FIGS. 10A-10F. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 13A-13F. In some embodiments, the dielectric layer 372' in FIGS. 13A-13F is formed in the fabrication apparatus 200 of FIG. 3 and is performed using the method M2 of FIG. 7. In some embodiments, the timing diagram of FIG. 9 is also applied to the manufacturing processes in FIGS. 13A-13F. It is noted that the sizes of the precursors shown in FIGS. 13A-13D are illustrated only, and do not limit the scope of the embodiments.

Figure 13A:
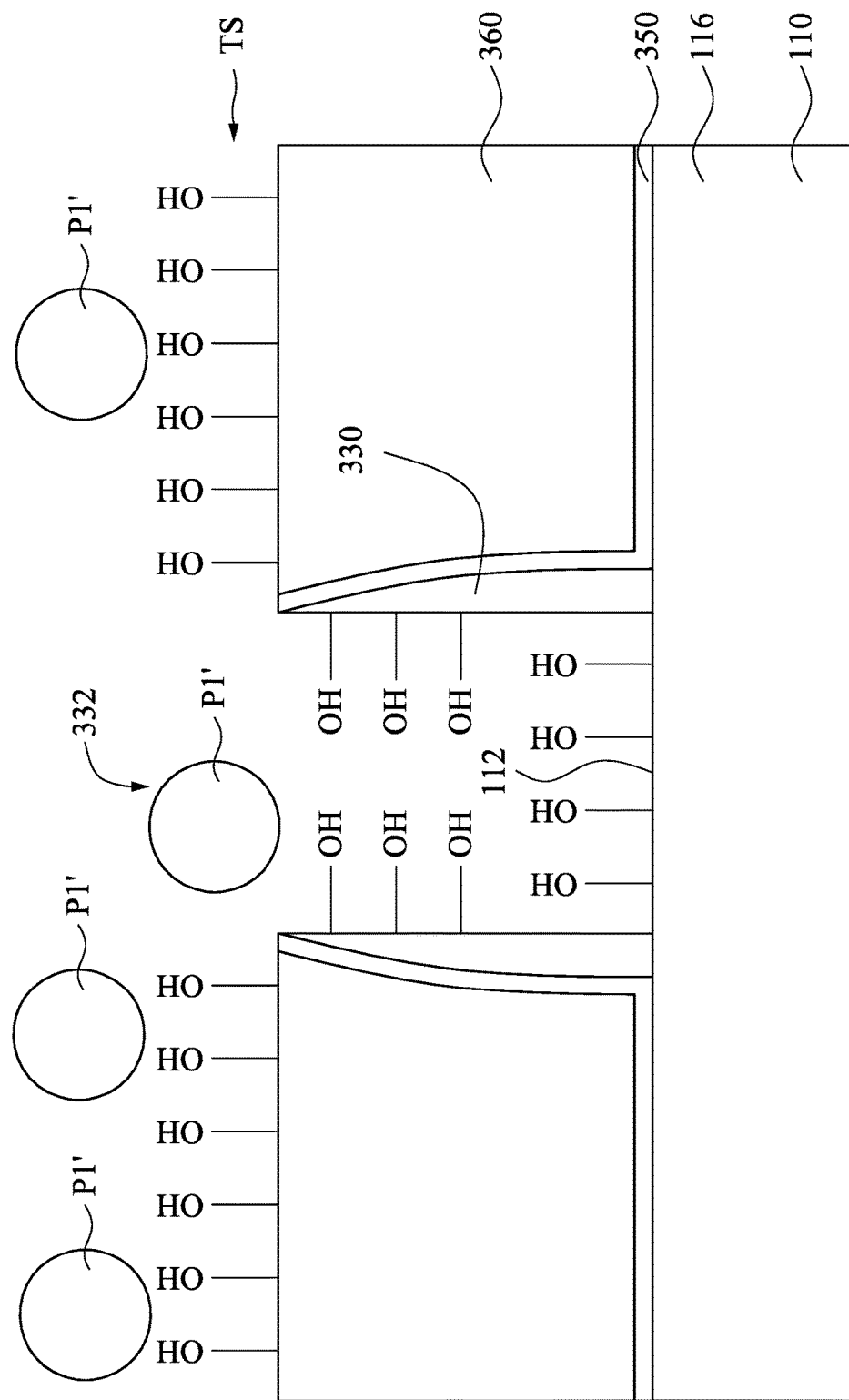
FIGS. 13A-13F are cross-sectional views taking along line B-B of FIG. 10F at various stages in accordance with some embodiments of the present disclosure.

Reference is made to FIGS. 3, 7, and 13A. In operation S12 of the method M2, a wafer is positioned on a chuck of a fabrication apparatus. In some embodiments, the surfaces of the structure (i.e., the substrate 110, the spacer structure 330, and the ILD 360) may be terminated with terminating species TS. In operation S16 of the method M2, first precursors are fed into the chamber of the fabrication apparatus. Reference is made to FIGS. 3 and 13A. For example, first precursors P1' (e.g., high-k precursors in this case) are fed into the chamber 210 from the precursor delivery 240. The first precursors P1' are absorbed both on the surfaces of the substrate 110, the spacer structure 330, and the ILD 360 as shown in FIG. 13B.

Reference is made to FIGS. 3, 9, and 13A. In FIG. 9, the first precursors P1' are fed into the chamber 210 for an eighth period T8. In some embodiments, during the operation S16, the plasma source 230 is turned off, such that there is no or negligible plasma in the chamber 210 when the first precursors P1' are fed into the chamber 210. In some other embodiments, the first precursors P1 is plasma, and the first precursors P1 are fed into the chamber 210 from the plasma source 230. In some embodiments, a ninth period T9 in FIG. 9 is long enough to provide the reaction time of the first precursor deposition.

Figure 13B:
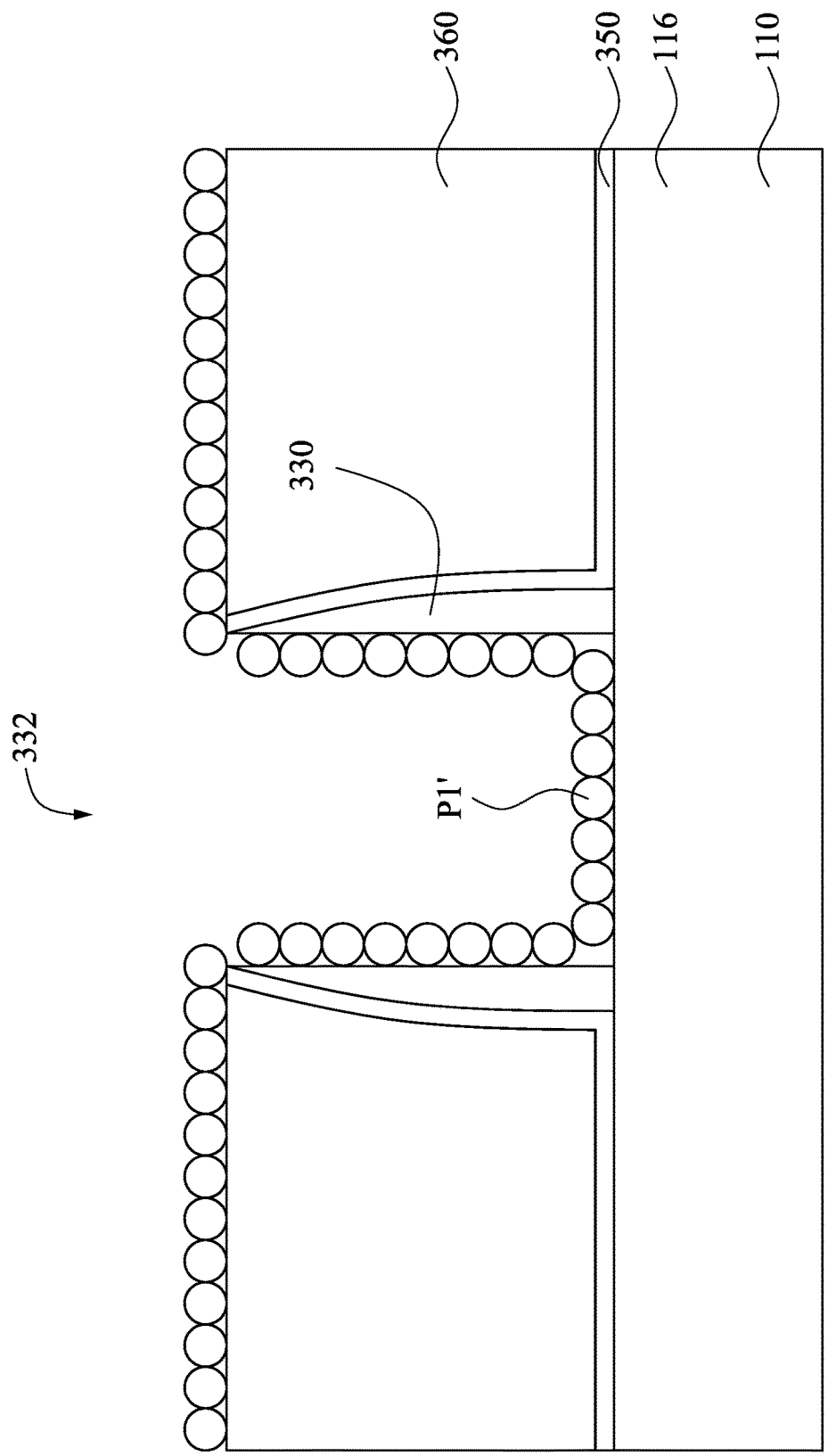
Figure 13C:
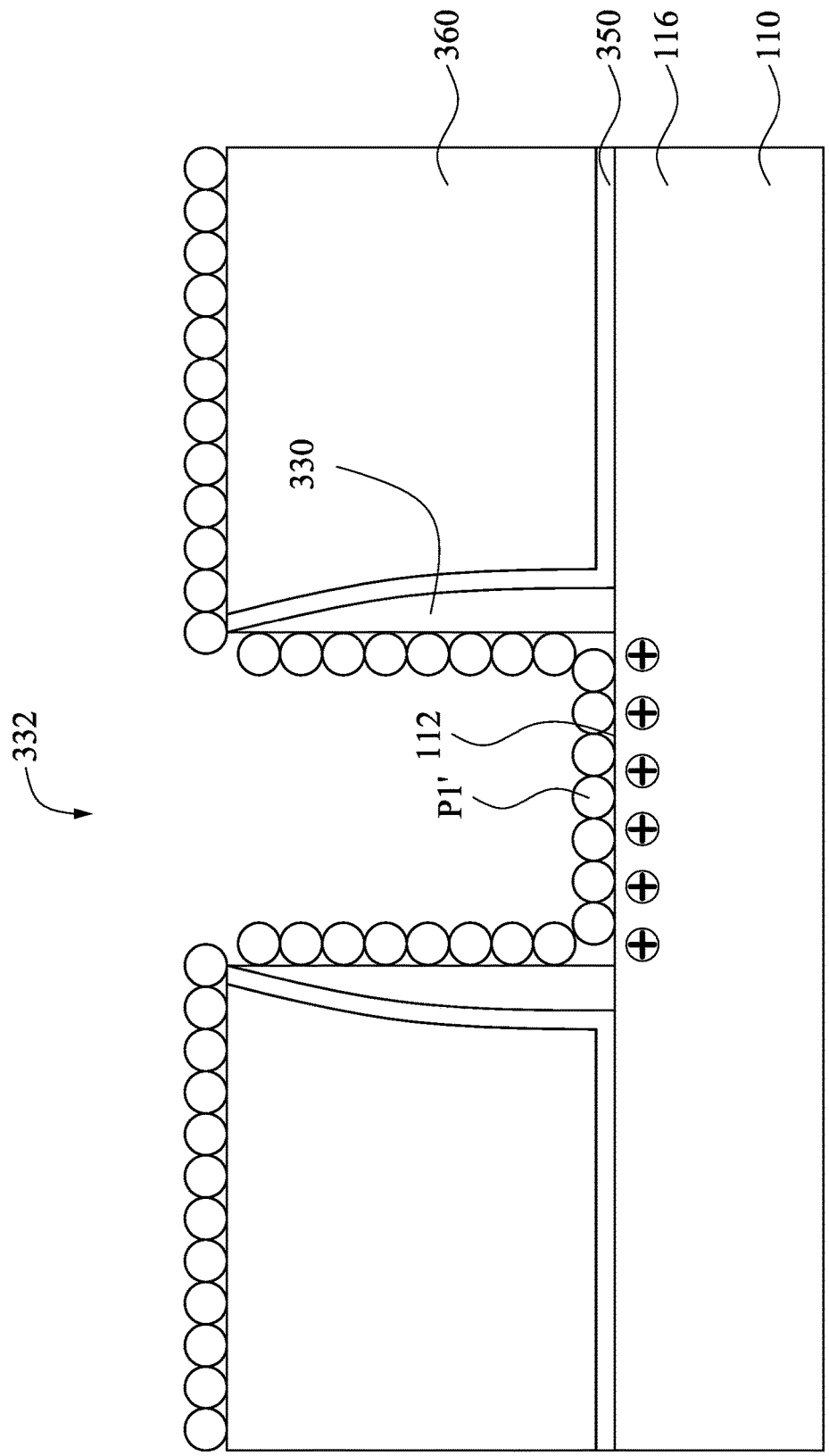

In operation S20 of the method M2, the excess first precursors are purged out of the chamber, leaving first precursors absorbed on the surfaces of the substrate 110, the spacer structure 330, and the ILD 360 as shown in FIG. 13B. In operation S14 of the method M2, a bias is applied to the chuck. The bias is a positive DC bias in the case of FIG. 13C. With the positive DC bias, since the substrate 110 (e.g., a semiconductor material) has an electrical conductivity higher than that of the spacer structure 330 and the ILD 360 (e.g., a dielectric layer), charges (i.e., holes in this case) are accumulated within the substrate 110, such that more charges remain in the vicinity of the surface 112 of the substrate 110 as shown in FIG. 13B. The bias source 270 in FIG. 3 is configured to apply the positive DC bias to the chuck 220, and the bias may have a power greater than about 0 W and equal to or less than about 50 W, e.g., about 20 W.

In some embodiments, the bias applied to the chuck 220 continues a tenth period T10 as shown in FIG. 9. The bias is applied before the second precursors P2' (see FIG. 13D) are fed into the chamber 210. Once the positive DC bias is applied to the chuck 220, holes move to the surface 112 of the substrate 110. Hence, the surface 112 of the substrate 110 is positive charged in this case.

Figure 13D:
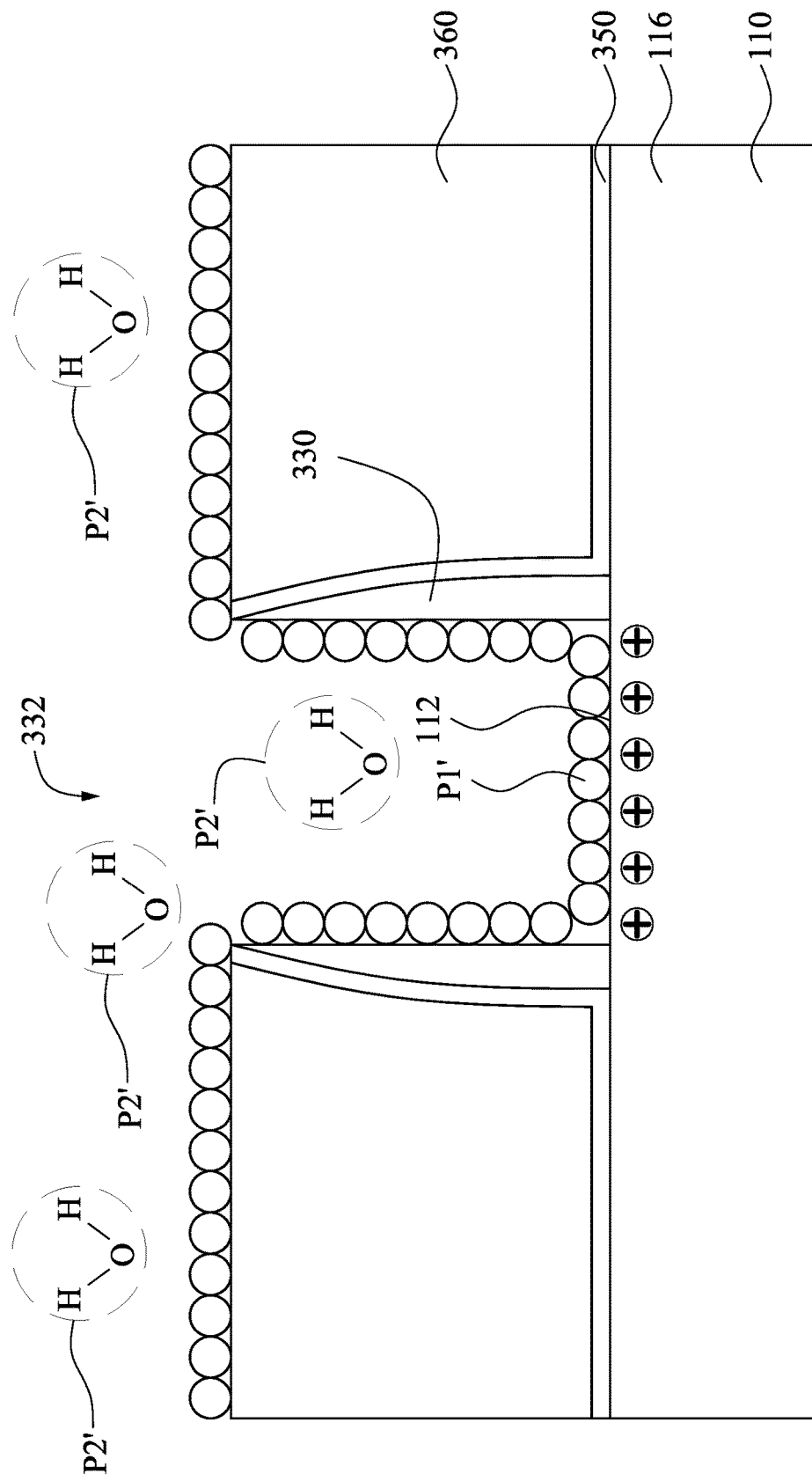
Figure 13E:
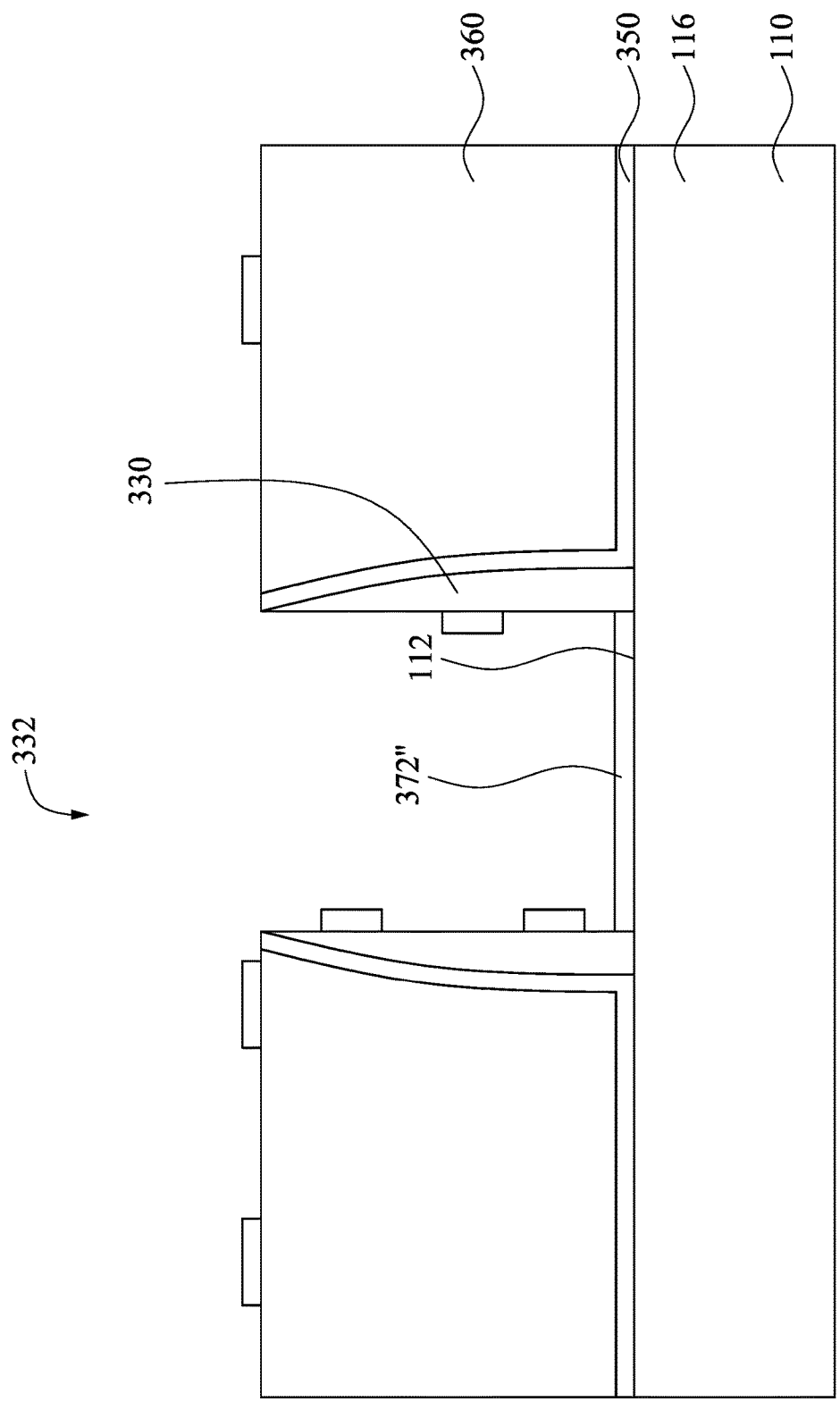

In operation S22 of the method M2, second precursors are fed into the chamber of the fabrication apparatus. Reference is made to FIGS. 3 and 13D. For example, second precursors P2' (e.g., $H_2O$ in this case) are fed into the chamber 210 from the precursor delivery 240. The positive charges (holes) in the vicinity of the surface of the substrate 110 attract the $H_2O$ molecules due to their partial negative charges (oxygen). The $H_2O$ molecules may be mostly attracted by the substrate 110, and thus are mostly deposited on the substrate 110 rather than on the spacer structure 330 (and/or the ILD 360). As shown in FIG. 13E, the $H_2O$ molecules are mostly absorbed on the surface 112 of the substrate 110 to form the dielectric film 372". In some embodiments, there are still some $H_2O$ molecules are absorbed on the surfaces of the dielectric materials (i.e., the spacer structure 330 and the ILD 360 in this case).

Reference is made to FIG. 9. After the bias applied to the chuck 220 is turned on and before the bias is turned off, the second precursors P2' are fed into the chamber 210 for an eleventh period T11. In some embodiments, the eleventh period T11 is shorter than the tenth period T10 by multiple times. Further, the bias is turned off after the feeding of the second precursor P2' is stopped. A twelfth period T12 is between the beginning of the bias supply and the beginning of the second precursor feeding, and a thirteenth period T13 is between the finish of the second precursor feeding and the finish of the bias supply. In some embodiments, the twelfth period T12 is long enough to charge the substrate 110, and the thirteenth period T13 is long enough to provide the reaction time of the second precursor deposition.

Figure 13F:
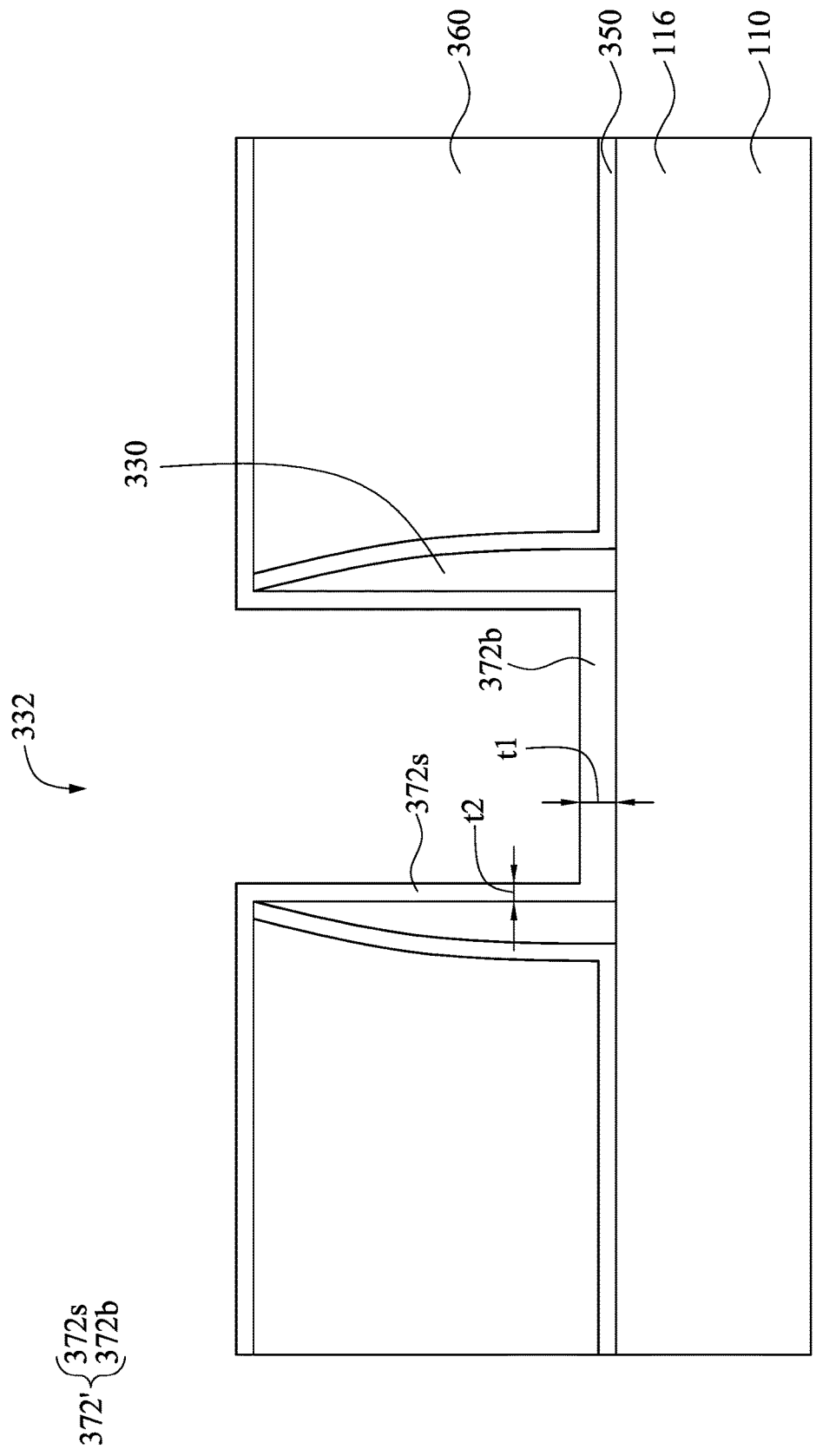

In operation S18 of the method M2, the bias is turned off, and in operation S24 of the method M2, the excess second precursors are purged out of the chamber. After the operation S24, a dielectric film 372" is mostly formed on the surface 112 of the substrate 110 as shown in FIG. 13E, and this dielectric film 372" may expose portions of the surfaces of the spacer structure 330 (and/or the ILD 360). That is, the selective ALD process results in no or negligible dielectric film 372" deposited on the spacer structure 330 and the ILD 360. Then, the method M2 goes to the operation S16 to repeat the operations S16-S24 and form another dielectric film on the dielectric film 372". The cycle of the operations S16-S24 may be repeated many times to form the dielectric layer 372' in the gate trench 332, as shown in FIGS. 13F and 10F. In operation S26 of the method M2, the wafer is taken out of the chamber to process the next manufacturing process.

Figure 14:
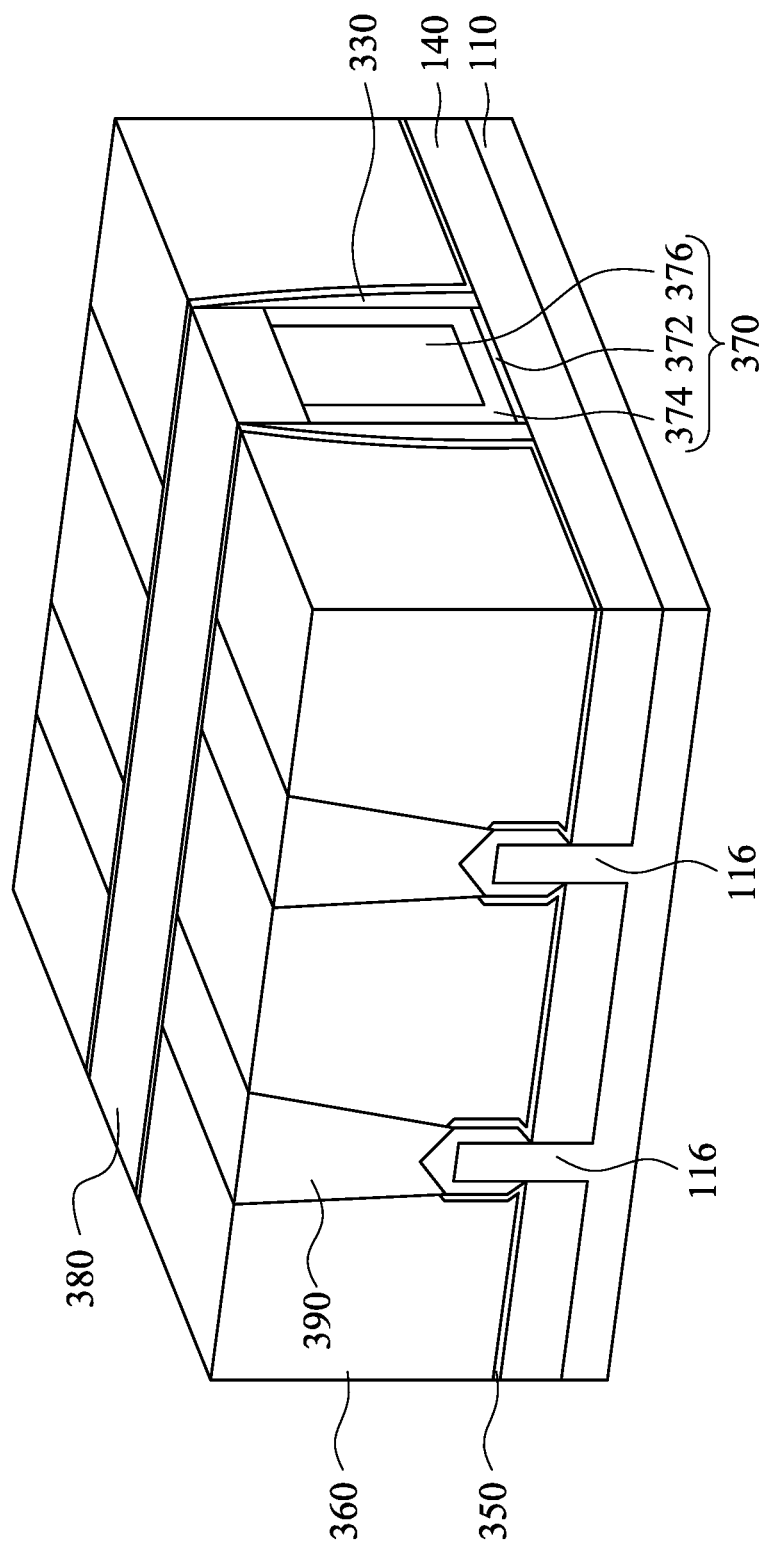
FIG. 14 is a perspective view of a semiconductor device according to some embodiments.

FIG. 14 is a perspective view of a semiconductor device according to some embodiments. In some embodiments, after the formation of the dielectric layer 372' (e.g., the processes shown in FIGS. 11F, 12F, and 13F), an isotropic etching process is performed to the dielectric layer 372' to remove the sidewall portions 372s of the dielectric layer 372' and also thin down the bottom portion 372b of the dielectric layer 372'. Then, the metal layer 374 and the fill metal 376 are formed in the gate trench 332 to form the metal gate structure 370. In FIG. 14, the metal layer 374 is in contact with the spacer structure 330 and the gate dielectric layer 372. Since other structural and manufacturing details of the semiconductor device in FIG. 14 are similar to the semiconductor device in FIG. 10I, detailed description is not repeated hereinafter.

FIGS. 15A-15K are cross-sectional views of a method for manufacturing a semiconductor structure at various stages in accordance with some embodiments of the present disclosure. In some embodiments, the semiconductor structure shown in FIGS. 15A-15K may be intermediate devices fabricated during processing of an integrated circuit (IC), or a portion thereof, that may include static random access memory (SRAM), logic circuits, passive components, such as resistors, capacitors, and inductors, and/or active components, such as p-type field effect transistors (PFETs), n-type FETs (NFETs), multi-gate FETs, metal-oxide semiconductor field effect transistors (MOSFETs), complementary metal-oxide semiconductor (CMOS) transistors, bipolar transistors, high voltage transistors, high frequency transistors, other memory cells, and combinations thereof.

Figure 15A:
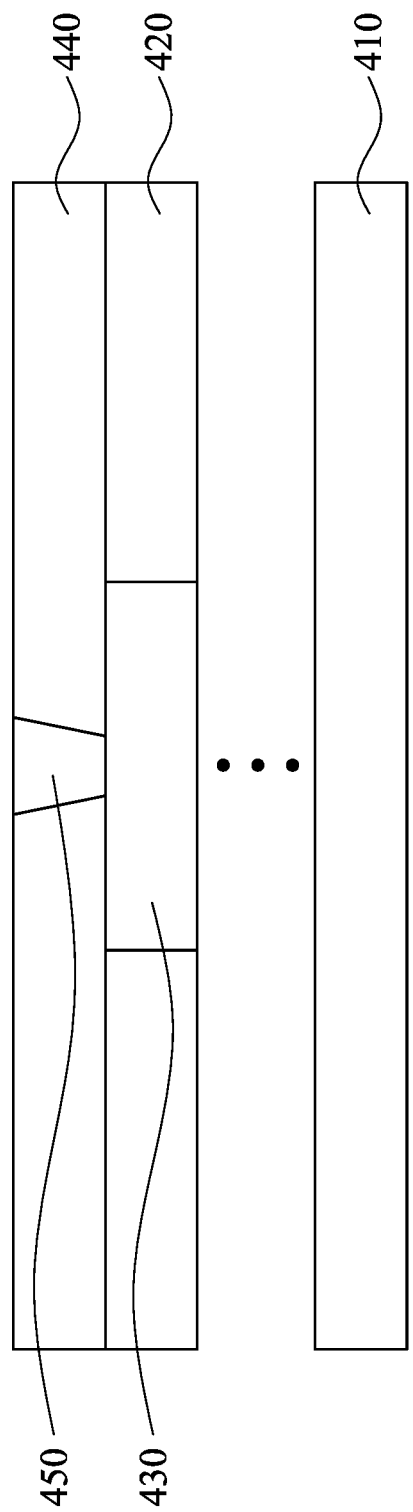
FIGS. 15A-15K are cross-sectional views of a method for manufacturing a semiconductor structure at various stages in accordance with some embodiments of the present disclosure.

Reference is made to FIG. 15A. A substrate 410 is provided. The semiconductor substrate 410 may be or include a bulk semiconductor, a semiconductor-on-insulator (SOI) substrate, or the like, which may be doped (e.g., with a p-type or an n-type dopant) or undoped. In some embodiments, the semiconductor material of the semiconductor substrate 410 may include elemental semiconductor like silicon (Si) and germanium (Ge); a compound semiconductor; an alloy semiconductor; or a combination thereof.

Various devices may be on the semiconductor substrate 410. For example, the semiconductor substrate 410 may include Field Effect Transistors (FETs), such as Fin FETs (FinFETs), planar FETs, vertical gate all around FETs (VGAA FETs), or the like; diodes; capacitors; inductors; and other devices. Devices may be formed wholly within the semiconductor substrate 410, in a portion of the semiconductor substrate 410 and a portion of one or more overlying layers, and/or wholly in one or more overlying layers, for example. Processing described herein may be used to form and/or to interconnect the devices to form an integrated circuit. The integrated circuit can be any circuit, such as for an Application Specific Integrated Circuit (ASIC), a processor, memory, or other circuit.

A first dielectric layer 420 is formed above the semiconductor substrate 410. The first dielectric layer 420 may be directly on the semiconductor substrate 410, or any number of other layers may be disposed between the first dielectric layer 420 and the semiconductor substrate 410. For example, the first dielectric layer 420 may be or include an Inter-Metal Dielectric (IMD) or an Inter-Layer Dielectric (ILD). The first dielectric layer 420, for example, may be or include a low-k dielectric having a k-value less than about 4.0, such as about 2.0 or even less. In some examples, the first dielectric layer 420 includes silicon oxide, phosphosilicate glass (PSG), borophosphosilicate glass (BPSG), fluorosilicate glass (FSG), $SiO_xC_y$, silicon carbon material, a compound thereof, a composite thereof, or combinations thereof.

A conductive feature 430 is in and/or through the first dielectric layer 420. The conductive feature 430 may be or include a conductive line and/or a conductive via, a gate structure of a transistor, or a contact to a gate structure of a transistor and/or to a source/drain region of a transistor. In some embodiments, the first dielectric layer 420 is an IMD, and the conductive feature 430 may include a conductive line and/or a conductive via (collectively or individually, "interconnect structure"). The interconnect structure may be formed by forming an opening and/or recess through and/or in the IMD, for example, using a damascene process. Some examples of forming an interconnect structure are described further below, although other processes and interconnect structures may be implemented. In other examples, the first dielectric layer 420 may include an ILD, and the conductive feature 430 may include a gate electrode (e.g., tungsten, cobalt, etc.) in the ILD formed using a replacement gate process, for example. In some other embodiments, the first dielectric layer 420 may be an ILD, and the conductive feature 430 may include a contact. The contact may be formed by forming an opening through the ILD to, for example, a gate electrode and/or source/drain region of a transistor formed on the semiconductor substrate 410. The contact can include an adhesion layer (e.g., Ti, etc.), a barrier layer (e.g., TiN, etc.) on the adhesion layer, and a conductive fill material (e.g., tungsten, cobalt, etc.) on the barrier layer. The contact can also be made of a less diffusive metal like tungsten, Mo, or Ru without a barrier layer.

A second dielectric layer 440 is formed above the first dielectric layer 420 and the conductive feature 430. For example, the second dielectric layer 440 may be or include an IMD. The second dielectric layer 440 is deposited on the top surfaces of the first dielectric layer 420 and the conductive feature 430. The second dielectric layer 440, for example, may be or include a low-k dielectric having a k-value less than about 4.0, such as about 2.0 or even less. In some examples, the second dielectric layer 440 includes silicon oxide, PSG, BPSG, FSG, $SiO_xC_y$, silicon carbon material, a compound thereof, a composite thereof, or combinations thereof. The second dielectric layer 440 may be deposited using a CVD, such as PECVD or Flowable CVD (FCVD); spin-on coating; or another deposition technique. In some examples, a Chemical Mechanical Planarization (CMP) or another planarization process may be performed to planarize the top surface of second dielectric layer 440.

At least one via 450 is formed in the second dielectric layer 440. In some embodiments, at least one opening is formed in the second dielectric layer 440, conductive materials are filled in the opening, and a planarization process is performed to remove the excess conductive materials. Hence, the via 450 is formed and in contact with the conductive feature 430. The via 450 may be made of tungsten, aluminum, copper, or other suitable materials.

Then, an etching stop layer (ESL) 460 (see FIG. 15H) is formed above the second dielectric layer 440. The ESL 460 is formed by performing a bias-induced selective ALD process, as described in greater detail below. In some embodiments, the ESL 460 is formed in the fabrication apparatus 200 of FIG. 3 and/or by performing the method M1 in FIG. 2. Also, the time table in FIG. 5 may be applied to the formation of the ESL 460. It is noted that the sizes of the precursors shown in FIGS. 15C-15E are illustrated only, and do not limit the scope of the embodiments.

Figure 15B:
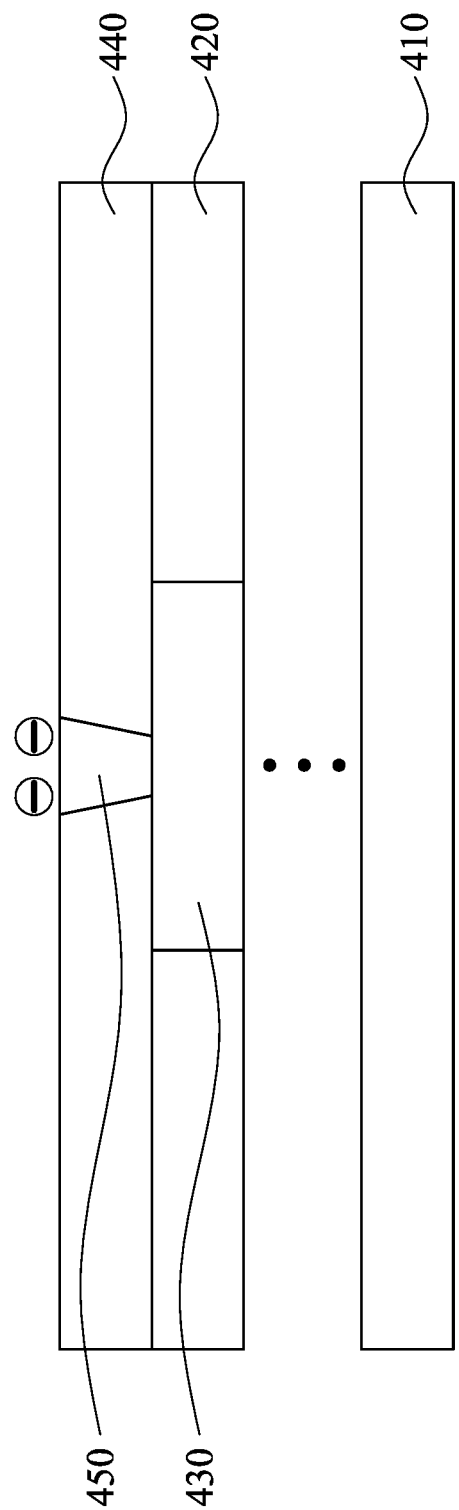
Figure 15C:
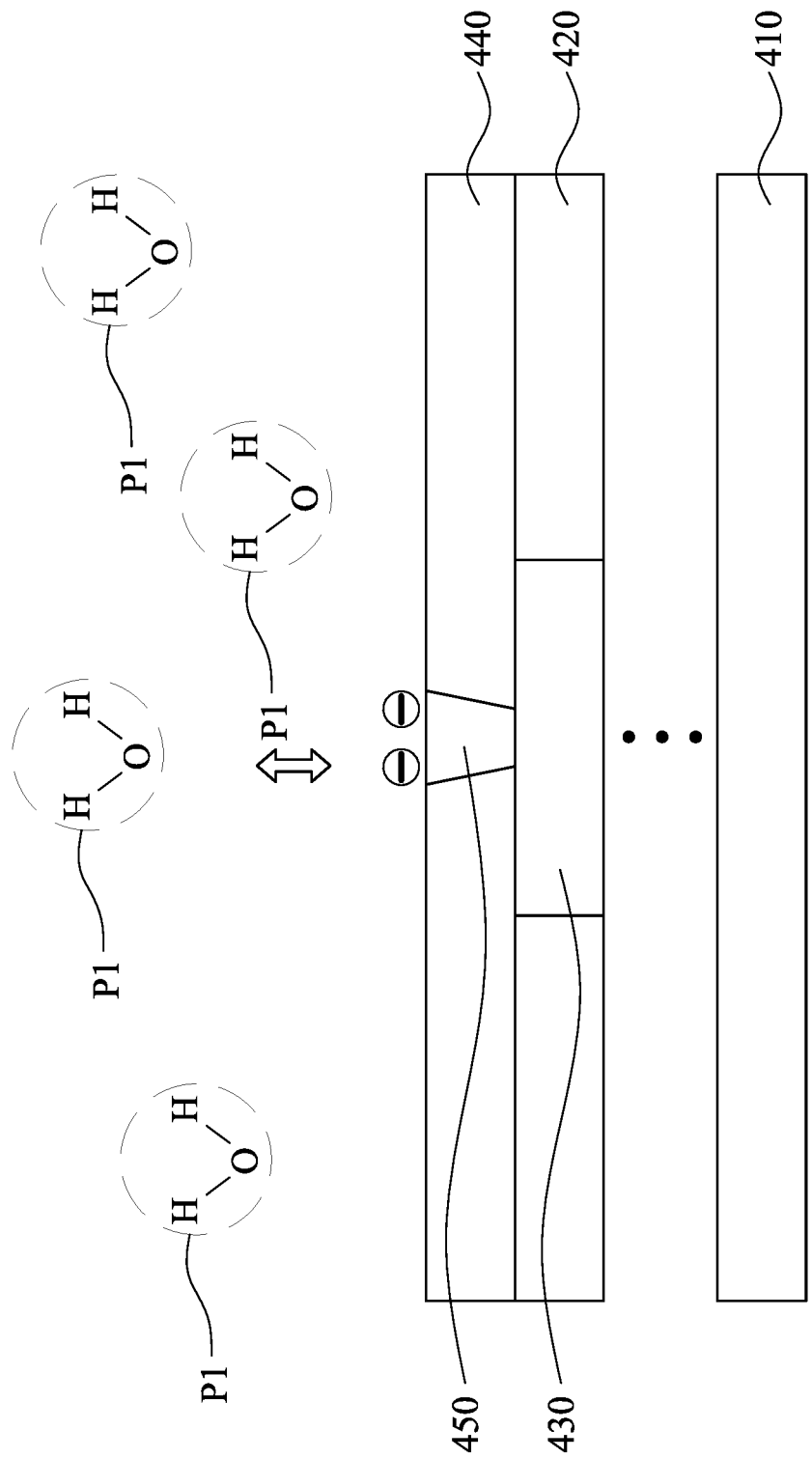
Figure 15D:
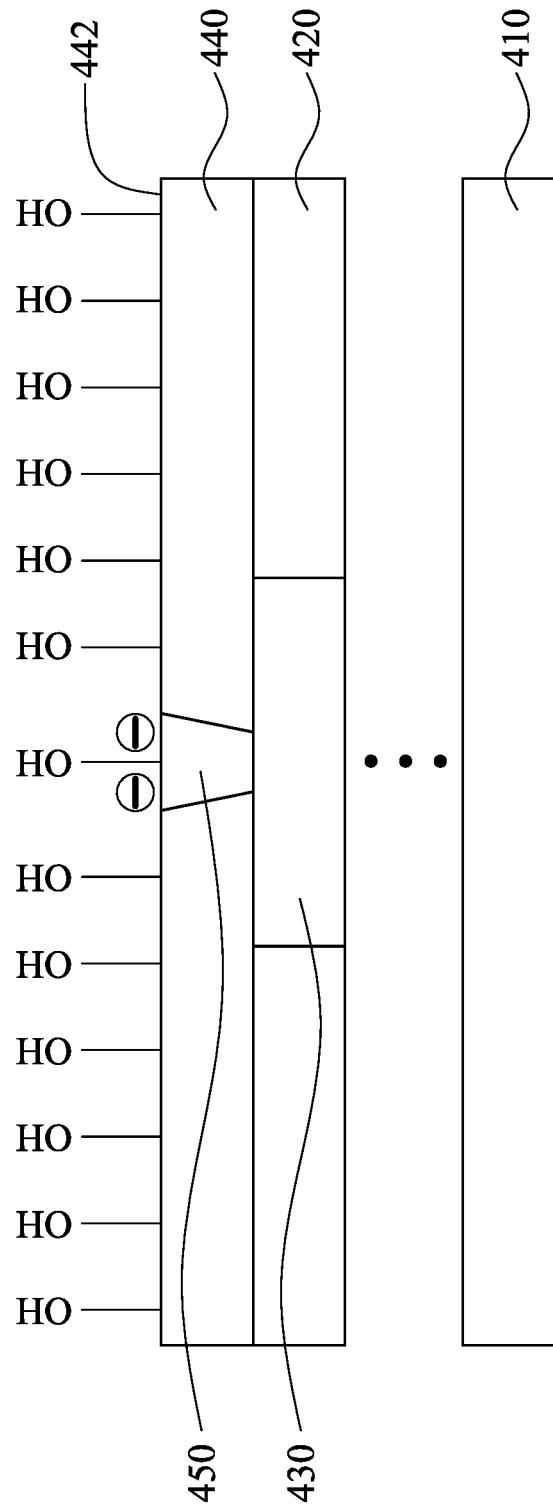
Figure 15E:
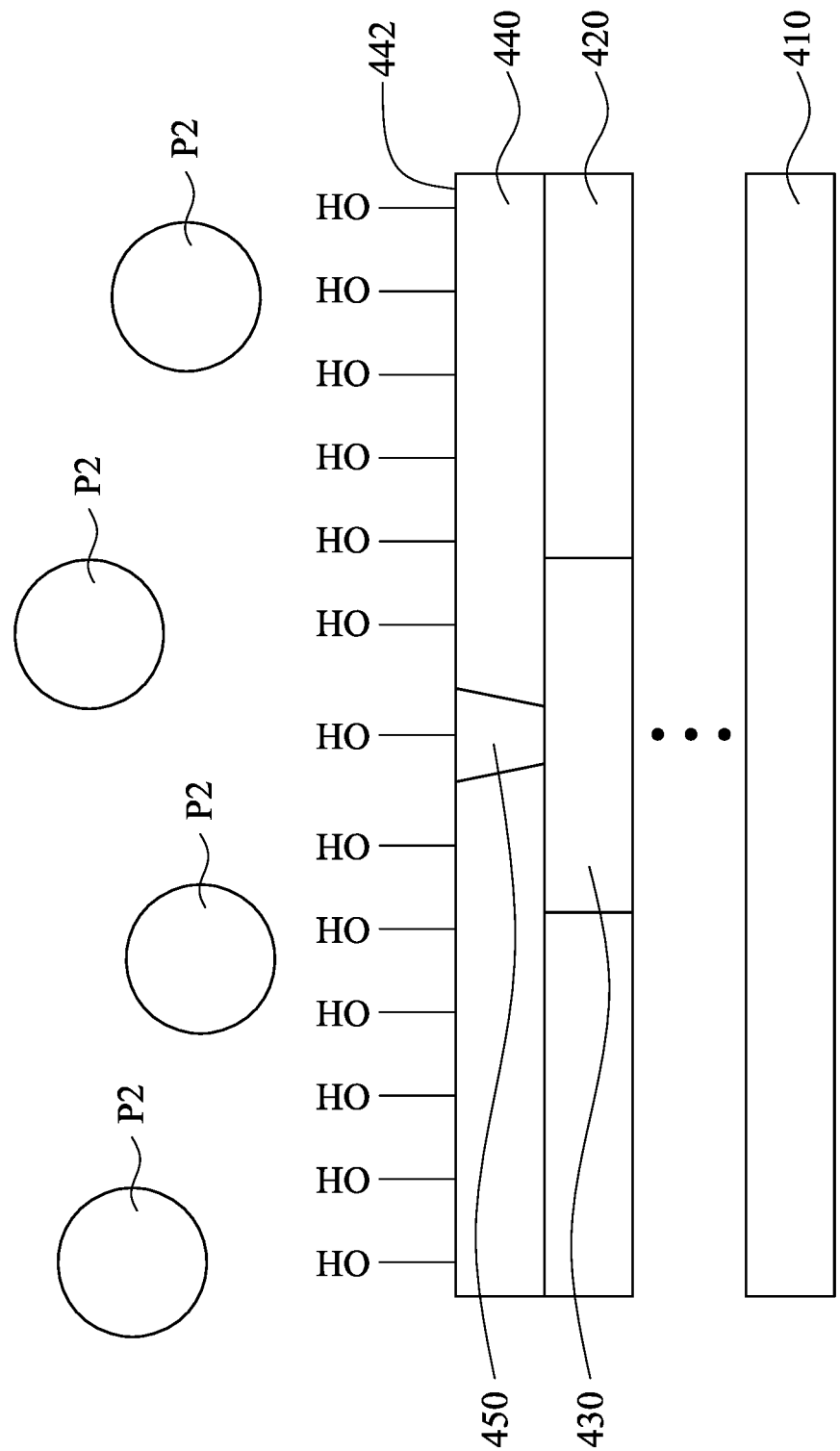

Reference is made to FIGS. 2, 3, and 15B. In operation S12 of the method M1, a wafer is positioned on a chuck in a fabrication apparatus. For example, the wafer (e.g., the structure in FIG. 15A) is positioned on a chuck 220 of the fabrication apparatus 200. In some embodiments, a vacuum is applied to the chamber 210 to remove oxygen and moisture and/or the temperature is raised to an acceptable level that is suitable for the ALD deposition.

In operation S14 of the method M1, a bias is applied to the chuck. For example, a negative DC bias is applied to the chuck 220 in the case of FIG. 15B. With the DC bias, since the via 450 (e.g., a conductive material) has an electrical conductivity higher than that of the second dielectric layer 440 (e.g., a dielectric material), charges (i.e., electrons in this case) are accumulated within the via 450, such that more charges remain in the vicinity of the surface of the via 450 as shown in FIG. 15B. In some embodiments, the bias may have a power greater than about 0 W and equal to or less than about 50 W, e.g., about 20 W. If the power is greater than about 50 W, the gases (e.g., the precursors/processing gases) in the chamber 210 may be ionized to form plasma, which may bombard the wafer to damage the structure formed thereon.

In some embodiments, the bias applied to the chuck 220 continues a first period T1 as shown in FIG. 5. The bias is applied before precursors are fed into the chamber 210. Once the negative DC bias is applied to the chuck 220, electrons move to the surfaces of the via 450. Hence, the surface of the via 450 is negative charged in this case.

In operation S16 of the method M1, first precursors are fed into the chamber of the fabrication apparatus. Reference is made to FIGS. 3 and 15C. For example, first precursors P1 (e.g., $H_2O$ in this case) are fed into the chamber 210 from the precursor delivery 240. As shown in FIG. 15C, the negative charges (electrons) in the vicinity of the surface of the via 450 repulse the $H_2O$ molecules due to their partial negative charges (oxygen). The $H_2O$ molecules may be mostly attracted by the second dielectric layer 440, and thus are deposited on the second dielectric layer 440 rather than on the via 450. As shown in FIG. 15D, the $H_2O$ are mostly absorbed on the surface 442 of the second dielectric layer 440. In some embodiments, there are still some $H_2O$ are absorbed on the surfaces of the via 450.

The first precursors P1 are fed into the chamber 210 for a second period T2 (see FIG. 5). In some embodiments, a third period T3 in FIG. 5 is long enough to charge the via 450, and a fourth period T4 in FIG. 5 is long enough to provide the reaction time of the first precursor deposition. Further, during the operations S14 and S16, the plasma source 230 is turned off, such that there is no or negligible plasma in the chamber 210 when the bias is applied to the chuck 220. In some other embodiments, the first precursors P1 is plasma, and the first precursors P1 are fed into the chamber 210 from the plasma source 230. During this process, the plasma is originated from the plasma source 230 and not in the chamber 210, such that a bias with a low power can be applied to the chuck 220 to perform the selective ALD process.

In operation S18 of the method M1, the bias is turned off, and in operation S20 of the method M1, the excess first precursors P1 are purged out of the chamber. Specifically, the first precursors P1 are mostly absorbed to the surface 442 of the second dielectric layer 440 during the periods T2 and T4 (see FIG. 5), and some of the first precursors P1 are absorbed to the surface of the via 450. After the fourth period T4, the bias is turned off, such that the electrons in the vicinity of the surface of the via 450 are gradually disappeared. Then, purging gases enter the chamber 210 to purge the excess first precursors P1 out of the chamber 210.

Figure 15F:
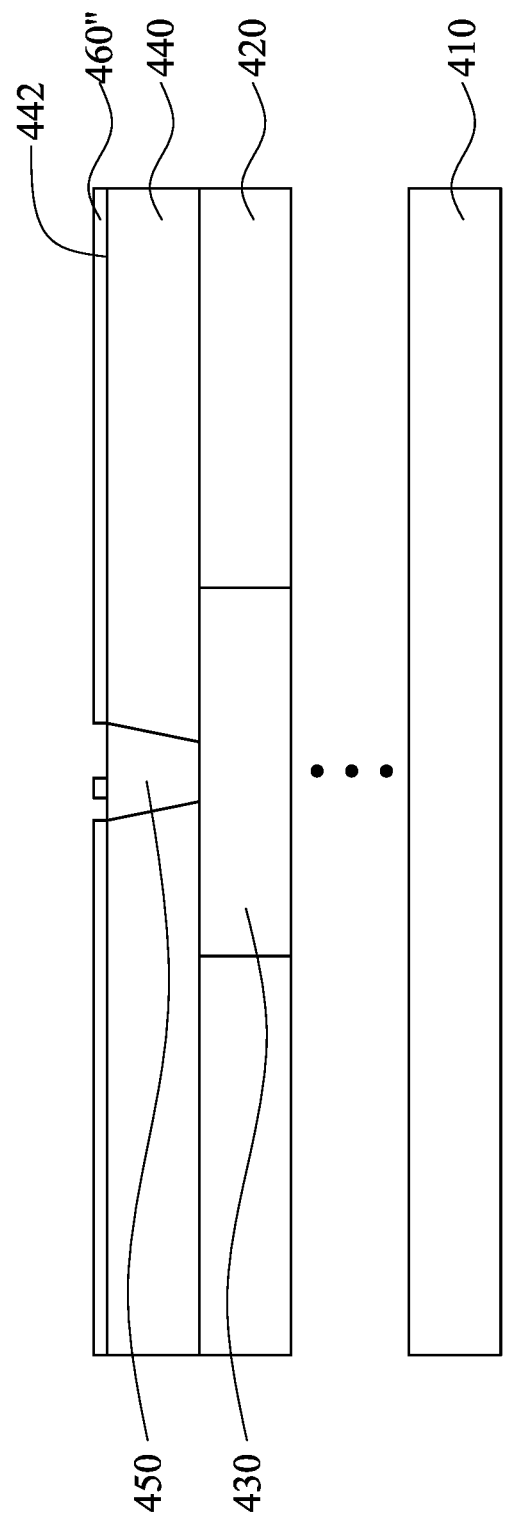

In operation S22 of the method M1, second precursors are fed into the chamber of the fabrication apparatus. Reference is made to FIGS. 3 and 15E. For example, second precursors P2 (e.g., high-k precursor in this case) are fed into the chamber 210 from the precursor delivery 240. As shown in FIG. 15E, the second precursors P2 are attracted by the first precursors absorbed on the second dielectric layer 440 (—OH in this case). The second precursors may be attracted by —OH and thus are mostly deposited on the second dielectric layer 440 rather than on the via 450. As shown in FIG. 15F, the second precursors P2 are mostly absorbed on the surface 442 of the second dielectric layer 440 and form a dielectric film 460" thereon. In some embodiments, the dielectric film 460" may be a high-k dielectric layer.

In FIG. 5, the purging of the second precursors P2 maintains for a fifth period T5. In some embodiments, a sixth period T6 of FIG. 5 is for neutralizing the surface of the via 450. In some embodiments, a seventh period T7 of FIG. 5 provides the reaction time of the second precursor deposition.

Figure 15G:
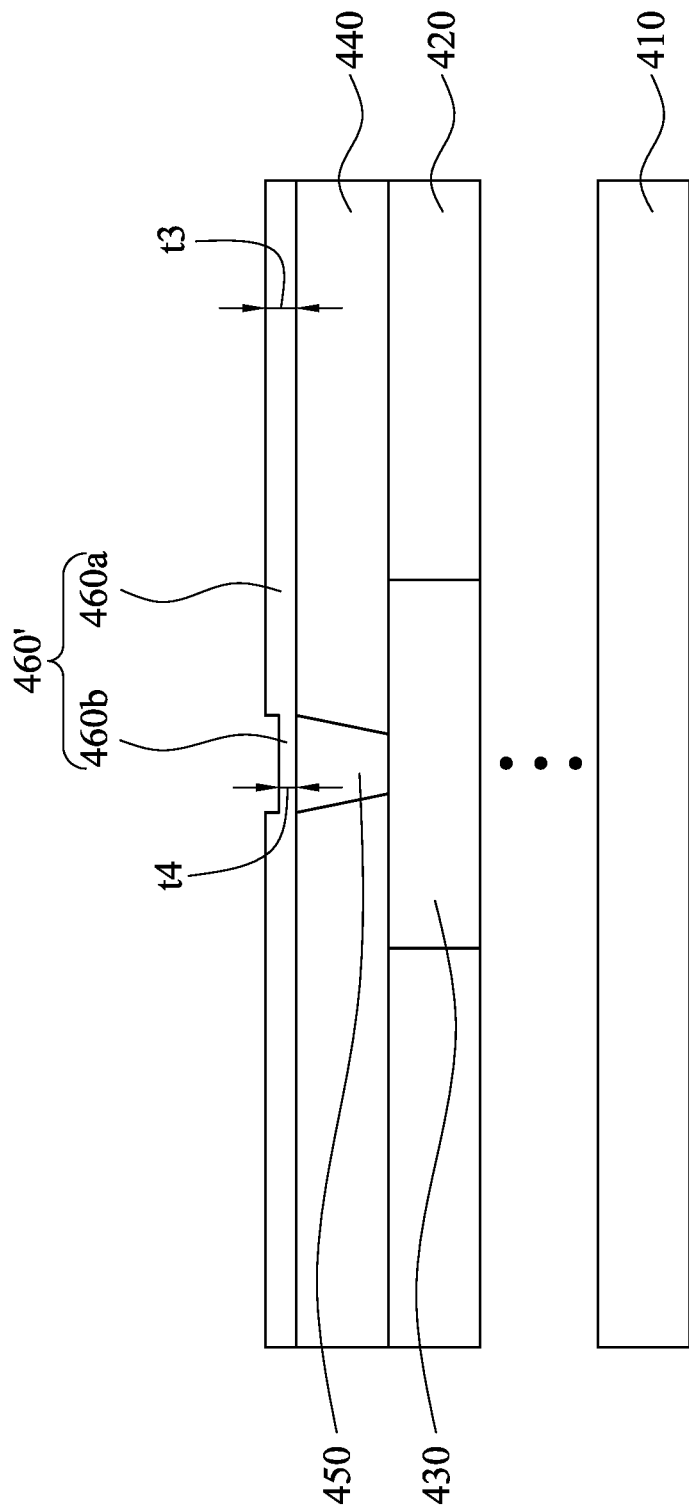

In operation S24 of the method M1, the excess second precursors are purged out of the chamber. After the operation S24, a dielectric film 460" is mostly formed on the surface 442 of the second dielectric layer 440 as shown in FIG. 15F, and this dielectric film 460" may expose portions of the surfaces of the via 450. That is, the selective ALD process results in no or negligible dielectric film 460" deposited on the via 450. Then, the method M1 goes to the operation S14 to repeat the operations S14-S24 and form another dielectric film on the dielectric film 460". The cycle of the operations S14-S24 may be repeated many times to form the dielectric layer 460' above the second dielectric layer 440, as shown in FIG. 15G. In FIG. 15G, the dielectric layer 460' includes a thick portion 460a directly above the second dielectric layer 440 and a thin portion 460b directly above the via 450. A thickness t3 of the thick portion 460a is greater than a thickness t4 of the thin portion 460b.

Figure 15H:
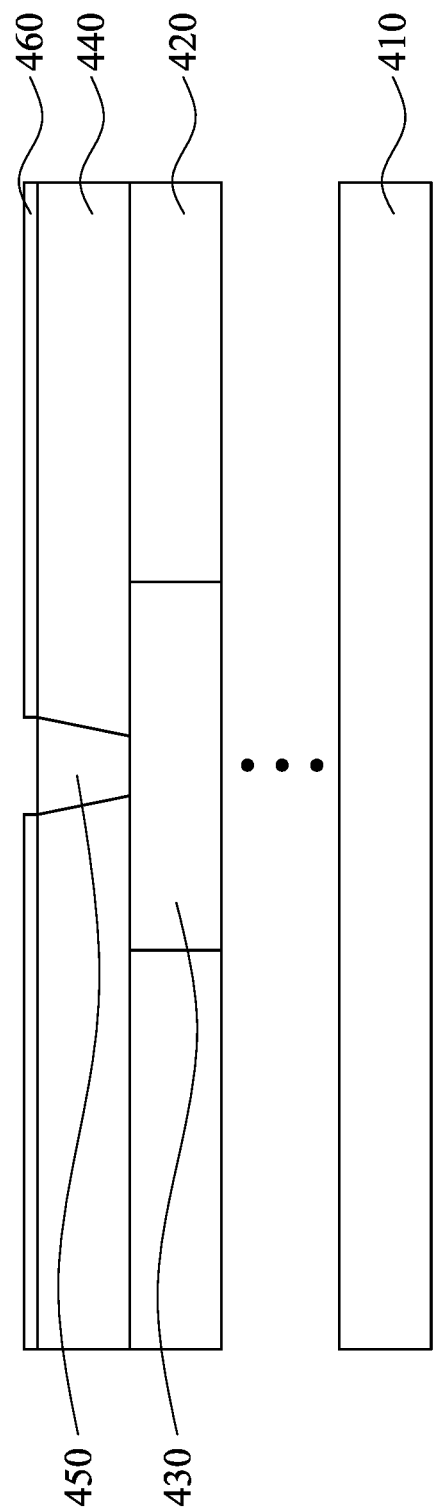

Reference is made to FIG. 15H. An etching process is performed on the dielectric layer 460' to remove the thin portion 460b and thin down the thick portion 460a of FIG. 15G. Hence, the ESL 460 is formed. The ESL 460 exposes the via 450 while covers the second dielectric layer 440. In some embodiments, a sidewall of the ESL 460 is substantially aligned with a sidewall of the via 450.

Figure 15I:
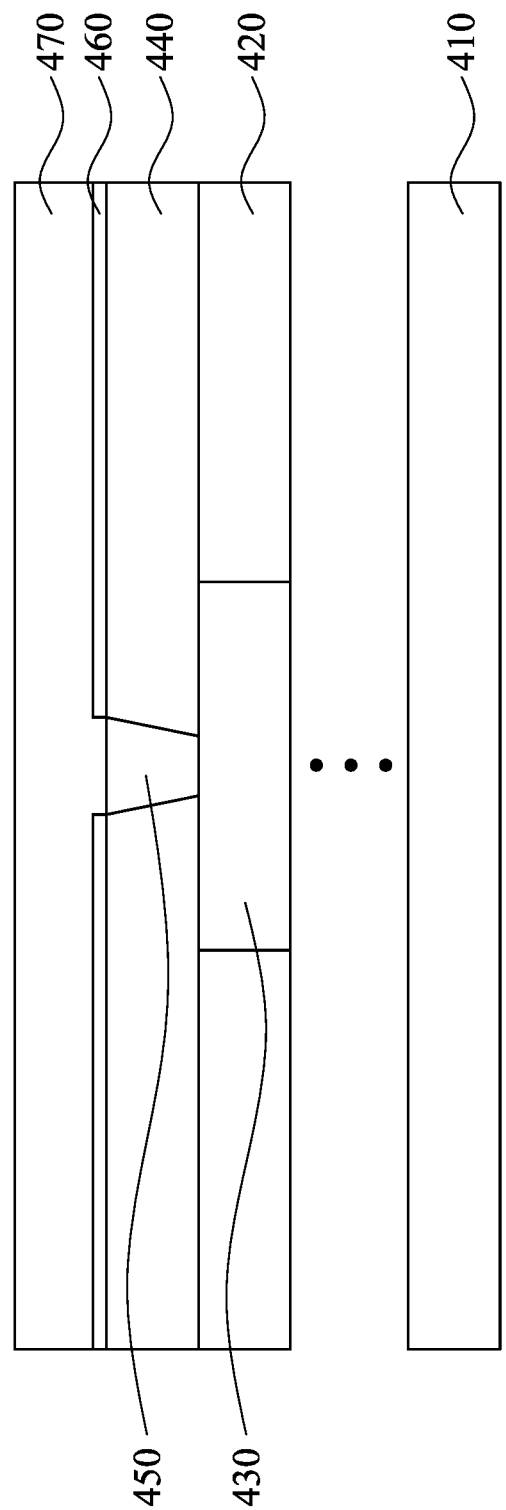

Reference is made to FIG. 15I. A third dielectric layer 470 is formed above the ESL 460. For example, the third dielectric layer 470 may be or include an IMD. The third dielectric layer 470 is deposited on the top surface of the ESL 460 and in contact with the via 450. The third dielectric layer 470, for example, may be or include a low-k dielectric having a k-value less than about 4.0, such as about 2.0 or even less. In some examples, the third dielectric layer 470 includes silicon oxide, PSG, BPSG, FSG, $SiO_xC_y$, silicon carbon material, a compound thereof, a composite thereof, or combinations thereof. The third dielectric layer 470 may be deposited using a CVD, such as PECVD or Flowable CVD (FCVD); spin-on coating; or another deposition technique. In some examples, a Chemical Mechanical Planarization (CMP) or another planarization process may be performed to planarize the top surface of third dielectric layer 470.

Figure 15J:
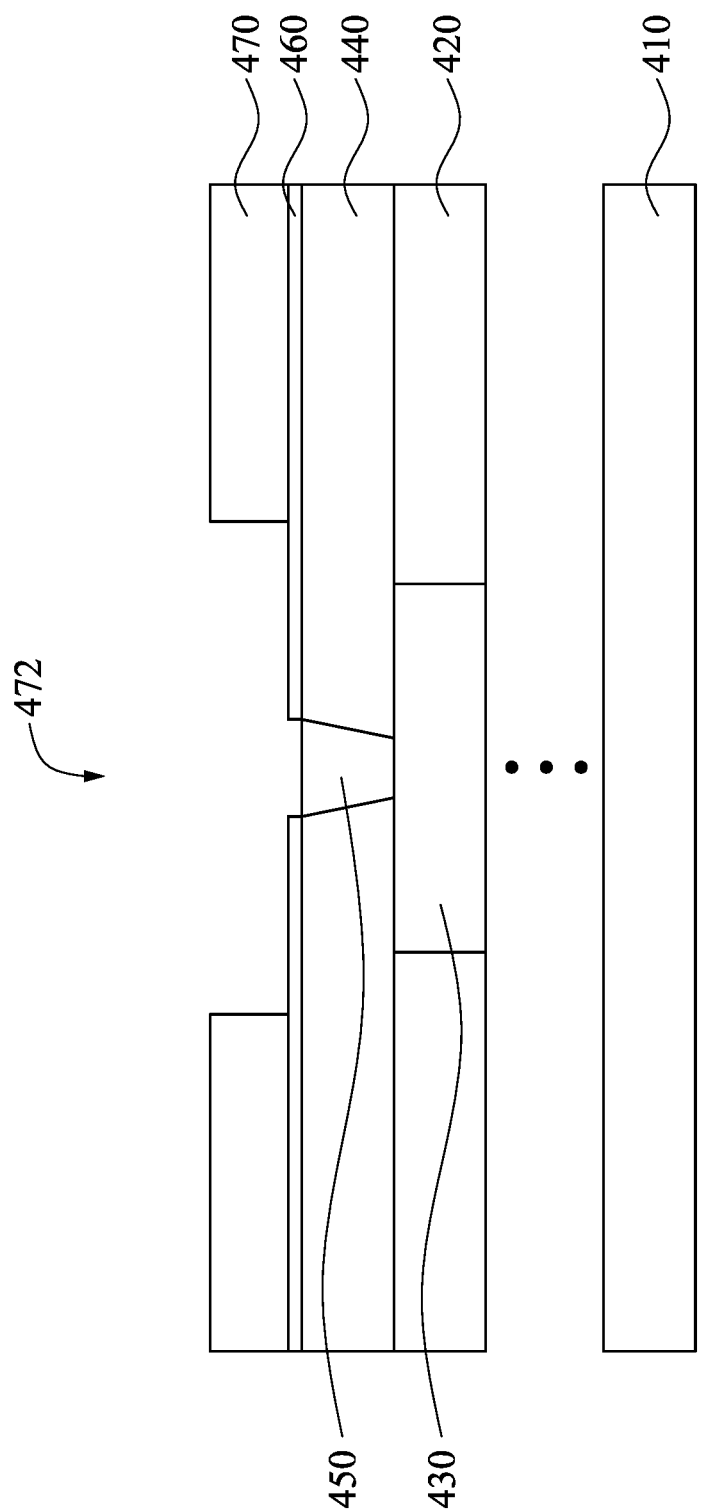

Reference is made to FIG. 15J. An opening 472 is formed in the third dielectric layer 470. The opening 472 may formed using photolithography and etch processes, such as in a dual damascene process. For example, a photo resist can be formed on the third dielectric layer 470, such as by using spin-on coating, and patterned with a pattern corresponding to the opening 472 by exposing the photo resist to light using an appropriate photomask. Exposed or unexposed portions of the photo resist may then be removed depending on whether a positive or negative resist is used. The pattern of the photo resist may then be transferred to the third dielectric layer 470, such as by using a suitable etch process, which forms the opening 472 in the third dielectric layer 470. The etch process may include a reactive ion etch (RIE), neutral beam etch (NBE), inductive coupled plasma (ICP) etch, the like, or a combination thereof. The etch process may be anisotropic. The ESL 460 is used as an etch stop for the etch process, such that the opening 472 does not expose the second dielectric layer 440 but the via 450. Subsequently, the photo resist is removed in an ashing or wet strip process, for example.

Figure 15K:
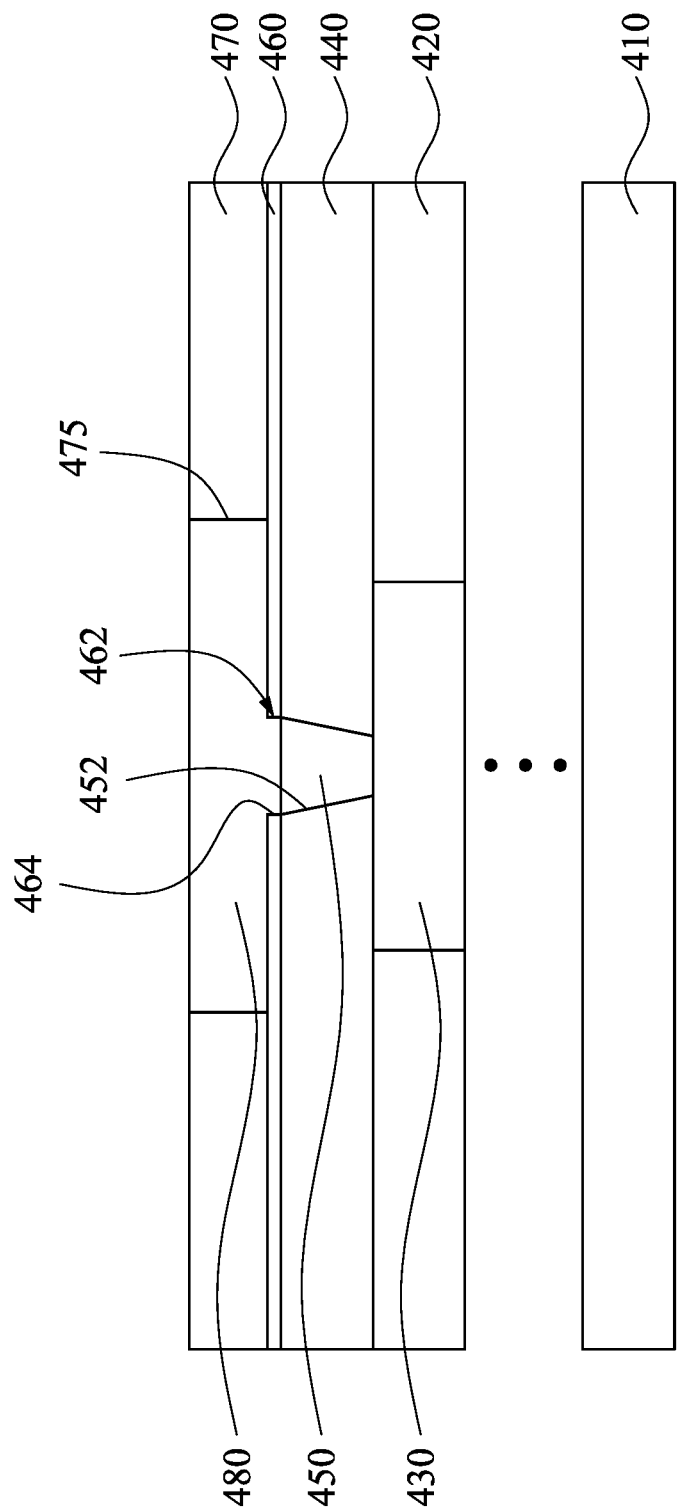

Reference is made to FIG. 15K. A conductive line 480 is formed in the opening 472. For example, a conductive material fills in the opening 472 (see FIG. 15J). The conductive material at least includes metal element, e.g., copper (Cu). The conductive material may include other suitable materials such as Ru, W, Ti, Al, Co, or combinations thereof. Then, a planarization process (e.g., CMP) is performed after the formation of the conductive material to remove the excess portions of the conductive material outside the opening 472, thus exposing the top surface of the third dielectric layer 470 and achieving a planarized surface. The portion of the conductive material in the opening 472 is referred to as the conductive line 480.

In FIG. 15K, the ESL 460 has an opening 462 directly above the via 450. The opening 462 has a side surface 464 substantially coterminous with a sidewall 452 of the via 450. A portion of the conductive line 480 is in the opening 462 and in contact with the via 450. The conductive line 480 is spaced apart from the second dielectric layer 440. The ESL 460 is sandwiched between the second dielectric layer 440 and the conductive line 480, and the conductive line 480 is in contact with the side surface 464 of the ESL 460 and a top surface of the ESL 460. Further, an interface 475 between the third dielectric layer 470 and the conductive line 480 is set back from the side surface 464 of the ESL 460. The conductive line 480 and the second dielectric layer 440 are respectively in contact with opposite surfaces of the ESL 460. The sidewall 452 of the via 450 is non-parallel with the side surface 464 of the ESL 460.

In FIG. 15G, the dielectric layer 460' is formed by performing the bias-induced selective ALD process. By providing a bias on the chuck 220, the charges have different distributions in different materials. The charges may attract or repulse the precursors to increase or decrease the corresponding deposition rate. In some other embodiments, the etching process shown in FIG. 15H can be omitted when there is a high deposition selectivity between the dielectric layer (i.e., the second dielectric layer 440) and the conductive layer (i.e., the via 450). Furthermore, a self-aligned monolayers (SAMs), which may formed using an additional deposition process and cause defect issues, can be omitted to simplify the manufacturing process.

The dielectric layer 460' in FIG. 15G may be formed using other bias and/or precursors. FIGS. 16A-16G are cross-sectional views a method for manufacturing a semiconductor structure at various stages in accordance with some embodiments of the present disclosure. Throughout the various views and illustrative embodiments, like reference numbers are used to designate like elements. The present embodiment may repeat reference numerals and/or letters used in FIGS. 15A-15K. This repetition is for the purpose of simplicity and clarity and does not in itself dictate a relationship between the various embodiments and/or configurations discussed. In the following embodiments, the structural and material details described before are not repeated hereinafter, and only further information is supplied to perform the semiconductor devices of FIGS. 16A-16G. In some embodiments, the dielectric layer 460' in FIGS. 16A-16F is formed in the fabrication apparatus 200 of FIG. 3 and/or by performing the method M1 of FIG. 2. In some embodiments, the time table of FIG. 5 is also applied to the manufacturing processes in FIGS. 16A-16F. It is noted that the sizes of the precursors shown in FIGS. 16B-16D are illustrated only, and do not limit the scope of the embodiments.

Figure 16A:
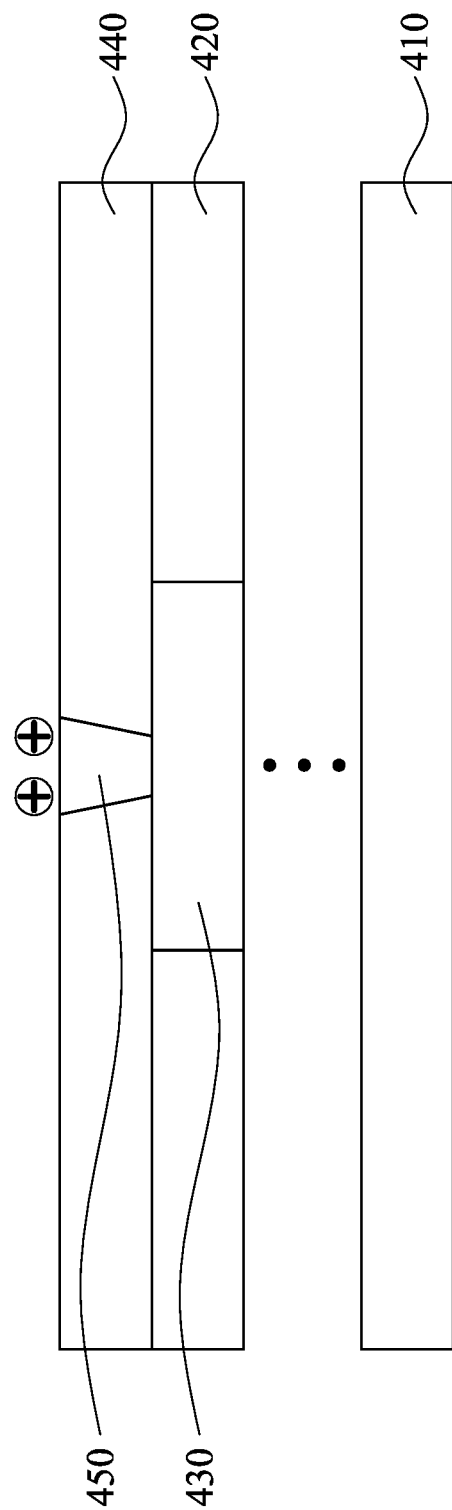
FIGS. 16A-16G are cross-sectional views a method for manufacturing a semiconductor structure at various stages in accordance with some embodiments of the present disclosure.
Figure 16B:
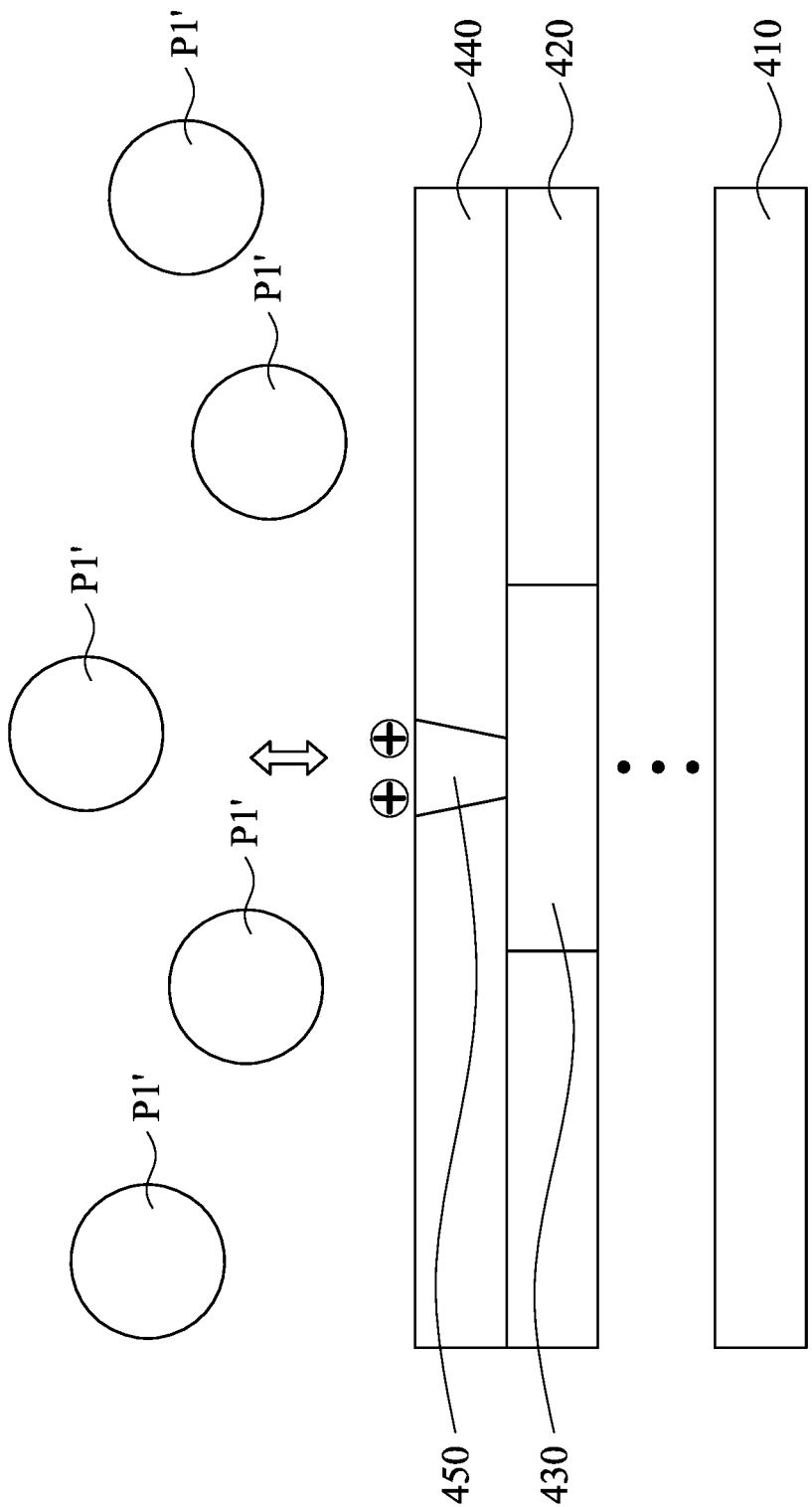
Figure 16C:
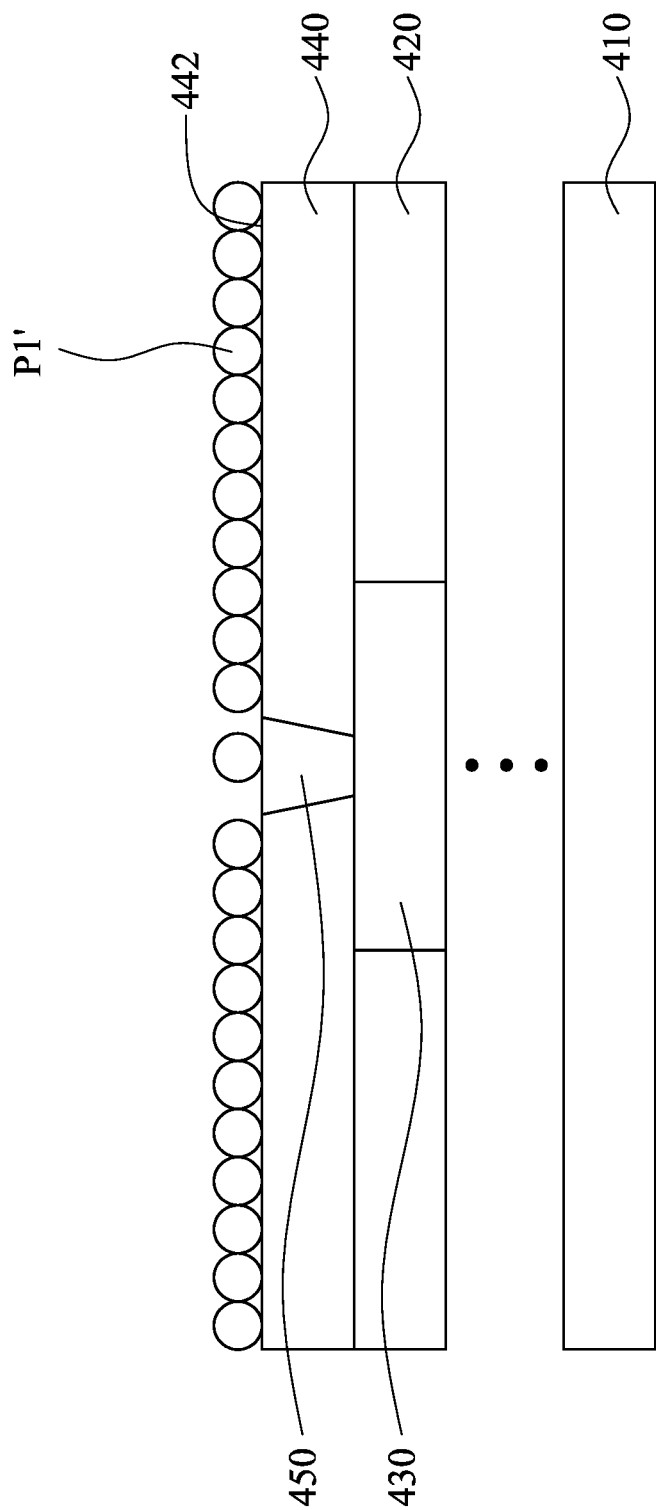
Figure 16D:
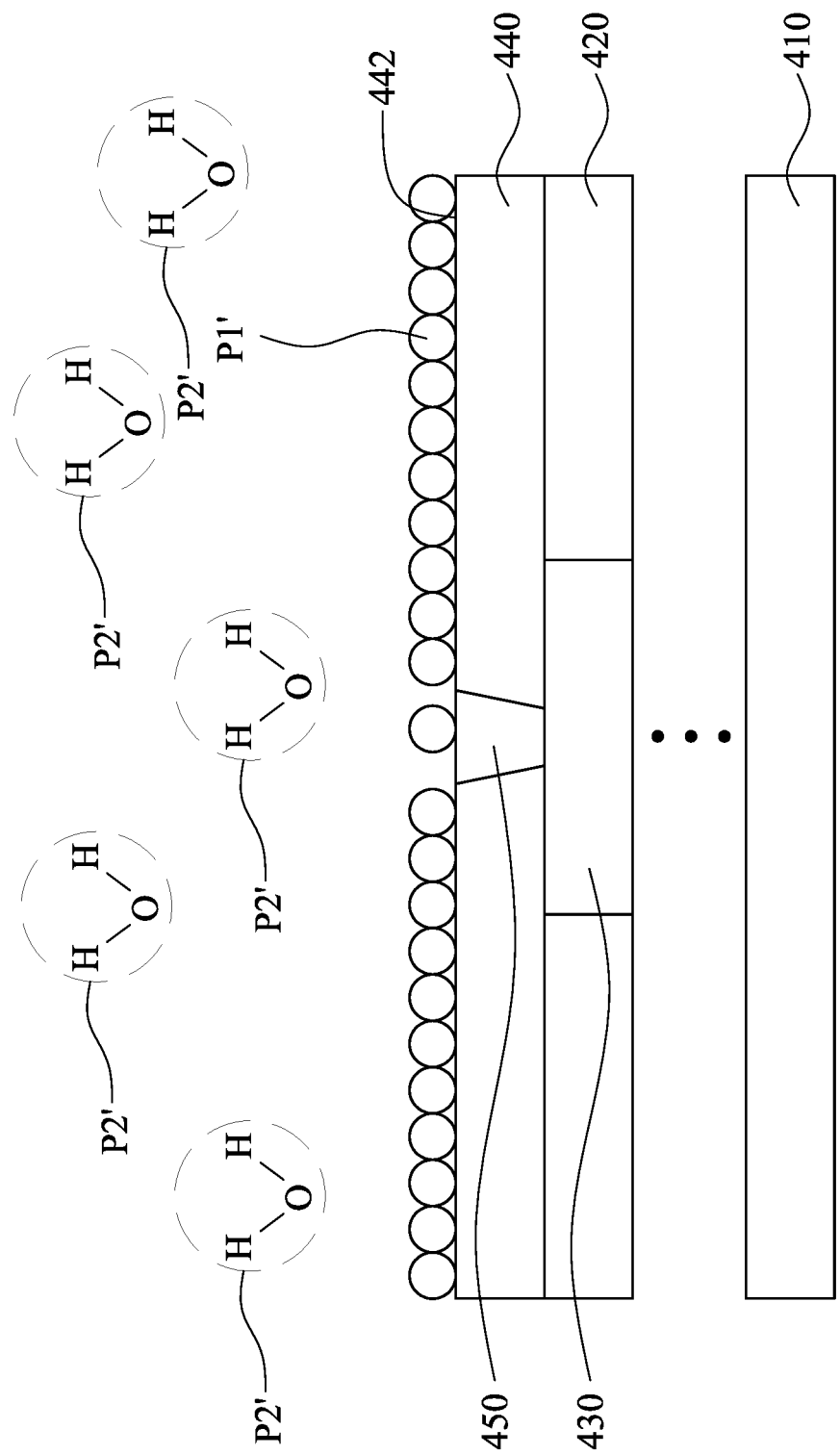

Reference is made to FIGS. 2, 3, and 16A. In operation S12 of the method M1, a wafer is positioned on a chuck of a fabrication apparatus. For example, a positive DC bias is applied to the chuck 220 in the case of FIG. 16A. With the DC bias, since the via 450 (e.g., a conductive material) has an electrical conductivity higher than that of the second dielectric layer 440 (e.g., a dielectric material), charges (i.e., holes in this case) are accumulated within the via 450, such that more charges remain in the vicinity of the surface of the via 450 as shown in FIG. 16A. In some embodiments, the bias may have a power greater than about 0 W and equal to or less than about 50 W, e.g., about 20 W. If the power is greater than about 50 W, the gases (e.g., the precursors/processing gases) in the chamber 210 may be ionized to form plasma, which may bombard the wafer to damage the structure formed thereon.

In some embodiments, the bias applied to the chuck 220 continues a first period T1 as shown in FIG. 5. The bias is applied before precursors are fed into the chamber 210. Once the positive DC bias is applied to the chuck 220, holes move to the surface of the via 450. Hence, the surface of the via 450 is positive charged in this case.

In operation S16 of the method M1, first precursors are fed into the chamber of the fabrication apparatus. Reference is made to FIGS. 3 and 16B. For example, first precursors P1' (e.g., high-k precursors in this case) are fed into the chamber 210 from the precursor delivery 240. In some embodiments, by controlling the temperature of the chamber 210 and/or feeding reaction gases into the chamber 210, a chemical reaction occurs such that a substituent is removed from the first precursor P1', and thus the first precursors P1' are partially positive. The first precursors P1' with partial positive charges are mostly repulsed by the via 450, and thus are mostly deposited on the second dielectric layer 440 rather than on the via 450. As shown in FIG. 16C, the first precursors P1' are mostly absorbed on the surface 442 of the second dielectric layer 440. In some embodiments, there are still some first precursors P1' are absorbed on the surfaces of the via 450.

The first precursors P1' are fed into the chamber 210 for a second period T2 (see FIG. 5). In some embodiments, a third period T3 in FIG. 5 is long enough to charge the via 450, and a fourth period T4 in FIG. 5 is long enough to provide the reaction time of the first precursor deposition. Further, during the operations S14 and S16, the plasma source 230 is turned off, such that there is no or negligible plasma in the chamber 210 when the bias is applied to the chuck 220. In some other embodiments, the first precursors P1' is plasma, and the first precursors P1' are fed into the chamber 210 from the plasma source 230.

Figure 16E:
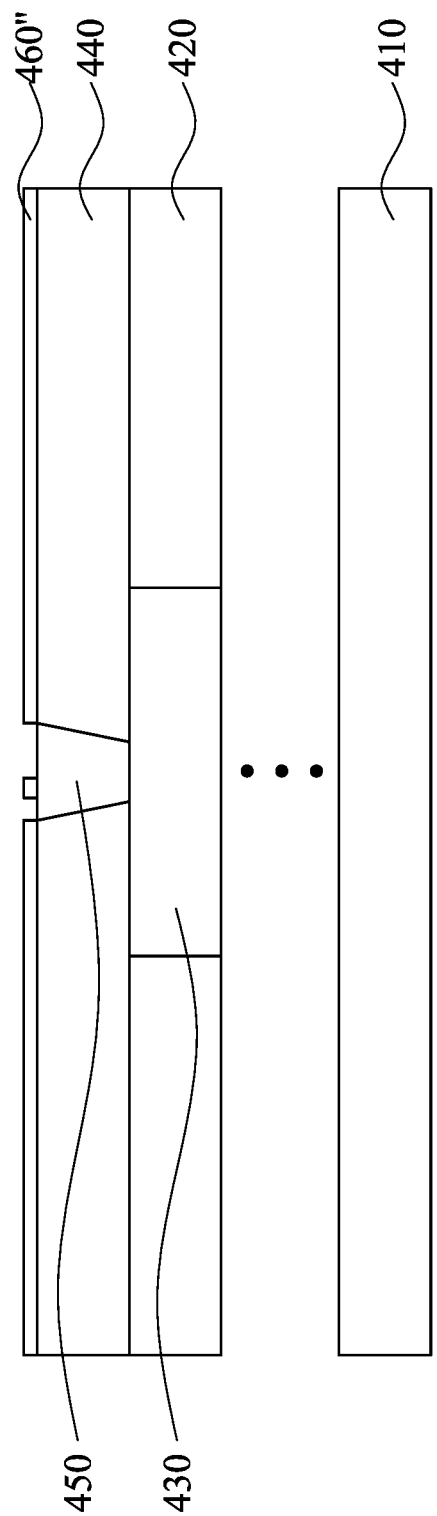

In operation S18 of the method M1, the bias is turned off, and in operation S20 of the method M1, the excess first precursors are purged out of the chamber. In operation S22 of the method M1, second precursors are fed into the chamber of the fabrication apparatus. Reference is made to FIGS. 3 and 16D. For example, second precursors P2' (e.g., oxidizers such as $H_2O$ vapor, $O_3$, or $O_2$ plasma in this case) are fed into the chamber 210 from the precursor delivery 240 or the plasma source 230 (for the $O_2$ plasma oxidizers). As shown in FIG. 16D, the second precursors P2' are attracted by the first precursors P1' absorbed on the second dielectric layer 440. The second precursors P2' are likely to be attracted by the first precursors, and thus more second precursors P2' are deposited on the surfaces 442 of the second dielectric layer 440 and less second precursors P2' are deposited on the surface of the via 450. As shown in FIG. 16E, a dielectric film 460'' is formed on the surfaces of the second dielectric layer 440 and the via 450.

In FIG. 5, the purging of the second precursors P2' maintains for a fifth period T5. In some embodiments, ae sixth period T6 of FIG. 5 is for neutralizing the surface of the via 450. In some embodiments, a seventh period T7 of FIG. 5 provides the reaction time of the second precursor deposition.

Figure 16F:
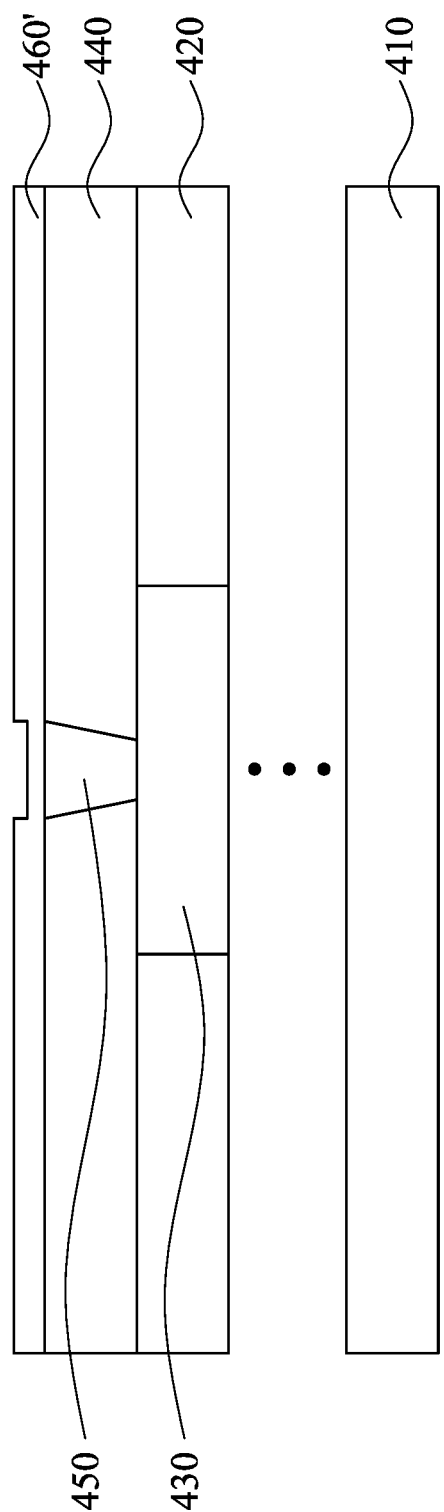

In operation S24 of the method M1, the excess second precursors are purged out of the chamber. After the operation S24, a dielectric film 460'' is mostly formed on the surface 442 of the second dielectric layer 440 as shown in FIG. 16E, and this dielectric film 460'' may expose portions of the surfaces of the via 450. That is, the selective ALD process results in no or negligible dielectric film 460'' deposited on the via 450. Then, the method M1 goes to the operation S14 to repeat the operations S14-S24 and form another dielectric film on the dielectric film 460''. The cycle of the operations S14-S24 may be repeated many times to form the dielectric layer 460' above the second dielectric layer 440, as shown in FIG. 16F. In operation S26 of the method M1, the wafer is taken out of the chamber to process the next manufacturing process.

Figure 16G:
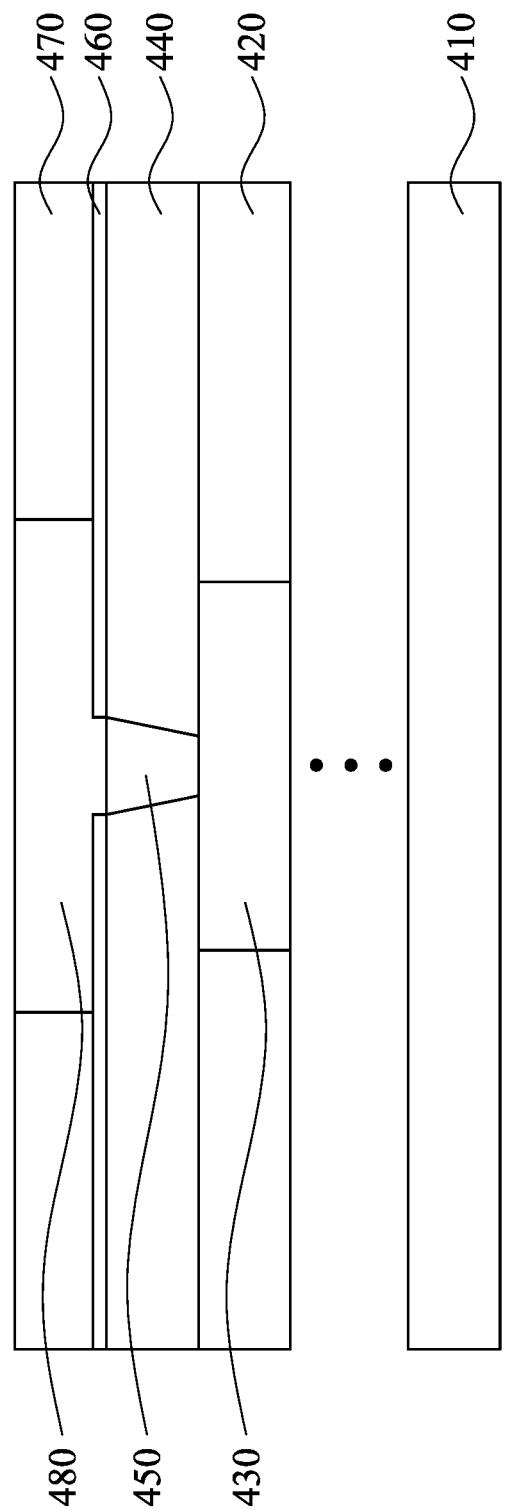

Then, the processes in FIGS. 15H-15K are performed to form the semiconductor structure as shown in FIG. 16G. Since the structure and formation of the semiconductor structure in FIG. 16G may be the same or similar to the formation of the semiconductor structure in FIGS. 15H-15K, the detailed description is not repeated in this respect.

Based on the above discussions, it can be seen that the present disclosure offers advantages. It is understood, however, that other embodiments may offer additional advantages, and not all advantages are necessarily disclosed herein, and that no particular advantage is required for all embodiments. One advantage is that a selective ALD process can be performed by applying a DC and/or RF bias. Another advantage is that the bias-induced selective ALD process is an indirect inducement process, and an SAMs or other additional layer for selectively deposition, which may damage the structure formed on the wafer or include additional process(es), can be omitted. Furthermore, the bias-induced selective ALD process does not complicate the manufacturing process for forming the semiconductor devices and/or semiconductor structures.

According to some embodiments, a method includes forming a dummy gate structure over a wafer. Gate spacers are formed on either side of the dummy gate structure. The dummy gate structure is removed to form a gate trench between the gate spacers. A gate dielectric layer is formed in the gate trench. A gate electrode is formed over the gate dielectric layer. Forming the gate dielectric layer includes applying a first bias to the wafer. With the first bias turned on, first precursors are fed to the wafer. The first bias is turned off. After turning off the first bias, second precursors are fed to the wafer.

According to some embodiments, a method includes forming a mask layer above a substrate. The substrate is patterned by using the mask layer as a mask to form a trench in the substrate. An isolation structure is formed in the trench, including feeding first precursors to the substrate. A bias is applied to the substrate after feeding the first precursors. With the bias turned on, second precursors are fed to the substrate. Feeding the first precursors, applying the bias, and feeding the second precursors are repeated.

According to some embodiments, a device includes a conductive feature, a first dielectric layer, a via, an etch stop layer (ESL), a second dielectric layer, and a conductive line. The first dielectric layer is above the conductive feature. The via is in the first dielectric layer and above the conductive feature. The ESL is above the first dielectric layer. A side surface of the ESL is coterminous with a sidewall of the via. The second dielectric layer is above the ESL. The conductive line in the second dielectric layer and over the via. The conductive line is in contact with the side surface of the ESL and a top surface of the ESL.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
    forming a mask layer above a substrate;
    patterning the substrate by using the mask layer as a mask to form a trench in the substrate; and
    forming an isolation structure in the trench, comprising:
        feeding first precursors to the substrate;
        applying a bias to the substrate for a first duration time after feeding the first precursors;
        with the bias turned on, feeding second precursors to the substrate for a second duration time shorter than the first duration time of applying the bias; and
        repeating feeding the first precursors, applying the bias, and feeding the second precursors.

2. The method of claim 1, wherein the bias is a positive bias.

3. The method of claim 1, wherein the bias is a negative bias.

4. The method of claim 1, wherein the first precursors are silicon precursors.

5. The method of claim 1, wherein the second precursors are $H_2O$.

6. The method of claim 1, wherein a power of the bias is greater than about 0 W and equal to or less than 50 W.

7. The method of claim 1, wherein the bias is turned off after stopping feeding the second precursors.

8. The method of claim 1, further comprising:
    performing a chemical-mechanical polishing process on the isolation structure.

9. The method of claim 8, further comprising:
    recessing the isolation structure such that fins of the substrate protrude above the recessed isolation structure.

10. The method of claim 1, wherein a deposition rate of the second precursors over the substrate is greater than a deposition rate of the second precursors over the mask layer.

11. A method comprising:
    forming a mask layer above a substrate;
    patterning the substrate by using the mask layer as a mask to form a trench in the substrate; and
    forming an isolation structure in the trench by using an atomic layer deposition (ALD) process, the ALD process comprises one or more repetitions of an ALD cycle, the ALD cycle comprising:
    applying a bias to the substrate;
    during applying the bias to the substrate, feeding first precursors to the substrate such that a deposition rate of the first precursors over the substrate is greater than a deposition rate of the first precursors over the mask layer;
    turning off the bias; and
    after turning off the bias, feeding second precursors to the substrate.

12. The method of claim 11, wherein the bias is less than 50 W.

13. The method of claim 11, wherein the first precursors are $H_2O$.

14. The method of claim 11, wherein the second precursors are silicon precursors.

15. The method of claim 11, further comprising:
    stopping feeding the first precursors before turning off the bias.

16. The method of claim 11, wherein the bias is an RF bias.

17. The method of claim 11, wherein applying the bias to the substrate is performed such that more electrons are accumulated on a surface of the mask layer than on a surface of the substrate.

18. The method of claim 11, further comprising:
    forming terminating species on the substrate and the mask layer before forming the isolation structure, the terminating species comprising-OH.

19. A method comprising:
    forming a mask layer over a substrate;
    etching the substrate by using the mask layer as an etch mask to form semiconductor fins; and
    performing a deposition process to deposit a dielectric material over the semiconductor fins, the deposition process comprising one or more repetitions of a deposition cycle, the deposition cycle comprising:
    feeding first precursors to the substrate;
    applying a bias to the substrate; and
    with the bias turned on, feeding second precursors to the substrate, wherein a deposition rate of the second precursors over the substrate is greater than a deposition rate of the second precursors over the mask layer.

20. The method of claim 19, wherein the first precursors are silicon precursors, and the second precursors are $H_2O$.

* * * * *